US006899787B2

(12) United States Patent
Nakano et al.

(10) Patent No.: US 6,899,787 B2
(45) Date of Patent: May 31, 2005

(54) PLASMA PROCESSING APPARATUS AND PLASMA PROCESSING SYSTEM WITH REDUCED FEEDING LOSS, AND METHOD FOR STABILIZING THE APPARATUS AND SYSTEM

(75) Inventors: Akira Nakano, Miyagi-ken (JP); Shintaro Asuke, Fujimi-machi (JP); Takeshi Miyashita, Suwa (JP); Tadahiro Ohmi, 2-1-17-301 Komegafukuro, Aoba-ku, Sendai-shi, Miyagi-ken (JP)

(73) Assignees: Alps Electric Co., Ltd. (JP); Seiko Epson Corporation (JP); Tadahiro Ohmi (JP)

( * ) Notice: Subject to any disclaimer, the term of this patent is extended or adjusted under 35 U.S.C. 154(b) by 172 days.

(21) Appl. No.: 10/173,340

(22) Filed: Jun. 14, 2002

(65) Prior Publication Data

US 2003/0056901 A1 Mar. 27, 2003

(30) Foreign Application Priority Data

Jun. 29, 2001 (JP) ........................................ 2001-199899
Jun. 29, 2001 (JP) ........................................ 2001-199900
Jun. 29, 2001 (JP) ........................................ 2001-199901

(51) Int. Cl.$^7$ .......................... H05H 1/00; C23C 16/00; C23F 1/00
(52) U.S. Cl. ............................ 156/345.44; 156/345.43; 156/345.47; 118/723 E; 118/723 AN
(58) Field of Search ..................... 156/345.44, 345.43, 156/345.47, 345.45; 118/723 E, 723 I, 723 AN

(56) References Cited

U.S. PATENT DOCUMENTS

| 5,605,576 A | | 2/1997 | Sasaki et al. |
| 6,028,395 A | * | 2/2000 | Holland et al. ......... 315/111.51 |
| 6,155,202 A | * | 12/2000 | Nakano et al. .......... 118/723 E |

FOREIGN PATENT DOCUMENTS

| JP | 2000-100789 | 4/2000 | ....... H01L/21/3065 |
| JP | 2000-269199 | 9/2000 | ....... H01L/21/3065 |
| JP | 2001-89863 | 4/2001 | ......... C23C/16/505 |
| JP | 2001-148378 | 5/2001 | ........... H01L/21/31 |
| WO | WO 01/01441 A1 | 1/2001 | ............ H01J/37/32 |

* cited by examiner

Primary Examiner—Parviz Hassanzadeh
(74) Attorney, Agent, or Firm—Beyer Weaver & Thomas LLP

(57) ABSTRACT

A plasma processing unit has two electrodes for exciting a plasma, a plasma processing chamber, an RF generator, a matching circuit for performing impedance matching between the plasma processing chamber and the RF generator, a feeder that connects an output terminal of the matching circuit to one of the electrode, and a supplier that connects the RF generator to an input terminal of the matching circuit. The feeder is arranged to decrease the average density per unit volume of the RF power supplied from the RF generator as the RF power flows from the output terminal of the matching circuit to the electrode. The section of the plasma processing unit that is DC-grounded has a surface provided with a low-resistance portion. The supplier or the feeder is fixed on a floor using RF impedance adjustors so as to prevent the RF impedance therein from changing.

19 Claims, 41 Drawing Sheets

PLASMA PROCESSING APPARATUS AND PLASMA PROCESSING SYSTEM WITH REDUCED FEEDING LOSS, AND METHOD FOR STABILIZING THE APPARATUS AND SYSTEM

BACKGROUND OF THE INVENTION

1. Field of the Invention

The present invention relates generally to methods for stabilizing plasma processing apparatuses and systems. In particular, the present invention relates to a technology suitable for reducing the feeding loss of the RF power.

2. Description of the Related Art

FIG. 42 illustrates an example of a conventional dual-frequency excitation plasma processing apparatus which performs a plasma process such as chemical vapor deposition (CVD), sputtering, dry etching, ashing, or the like.

The plasma processing apparatus shown in FIG. 42 comprises an RF generator 1, a plasma excitation electrode 4, and a matching circuit 2A disposed between the RF generator 1 and the plasma excitation electrode 4. The matching circuit 2A performs impedance matching between the RF generator 1 and the plasma excitation electrode 4.

RF power supplied from the RF generator 1 is fed to the plasma excitation electrode 4 through a supply line 1A and the matching circuit 2A. The matching circuit 2A is connected to the plasma excitation electrode 4 via a feed plate 3. Alternatively, the matching circuit 2A may be connected to the plasma excitation electrode 4 via the feed plate 3 and a feed line 3A. The supply line 1A and the feed line 3A are coaxial cables. The matching circuit 2A is housed in a matching box 2 made of a conductor. The feed plate 3 and the plasma excitation electrode 4 are covered with a chassis 21 made of a conductor.

The plasma excitation electrode 4 has an annular projection 4a on the bottom face. A shower plate 5 having a number of holes 7 is provided under the plasma excitation electrode 4 and is in contact with the projection 4a. The plasma excitation electrode 4 and the shower plate 5 define a space 6. A gas feeding tube 17 made of a conductor is connected to the space 6. The gas feeding tube 17 is provided with an insulator 17a which insulates the plasma excitation electrode 4 from the gas source.

In this power supply section, as shown in FIG. 38, the supply line 1A, which is a coaxial cable, generally has an extra length so as to increase the flexibility of installing the matching box 2 and a plasma processing chamber 60 described below. The supply line 1A is either wound and placed on a floor GF or routed along a ceiling GC, as shown in FIG. 38.

Referring to FIG. 42, gas is fed to the interior of the plasma processing chamber 60, surrounded by a chamber wall 10, through the holes 7 of the shower plate 5. An insulator 9 is disposed between the chamber wall 10 and the plasma excitation electrode 4 (cathode) to provide insulation therebetween. The exhaust system is omitted from the drawing.

A wafer susceptor (susceptor electrode) 8, which holds a substrate 16 and also serves as another plasma excitation electrode, is installed in the plasma processing chamber 60. A susceptor shield 12 is disposed under the wafer susceptor 8.

The susceptor shield 12 comprises a shield-supporting plate 12A for supporting the susceptor electrode 8 and a cylindrical supporting tube 12B extending downward from the center of the shield-supporting plate 12A. The supporting tube 12B penetrates a chamber bottom 10A, and the lower portion of the supporting tube 12B and the chamber bottom 10A are hermetically sealed with bellows 11.

The gap between the susceptor electrode 8 and the susceptor shield 12 is vacuum-sealed and electrically isolated by insulation means 12C composed of an insulating material provided at the periphery of a shaft 13. The susceptor electrode 8 and the susceptor shield 12 can be vertically moved by the bellows 11 which controls the distance between plasma excitation electrodes 4 and 8.

The susceptor electrode 8 is connected to a second RF generator 15 via the shaft 13 and a matching circuit accommodated in a matching box 14. The chamber wall 10 and the susceptor shield 12 have the same DC potential.

FIG. 41 illustrates another example of a conventional plasma processing apparatus. Unlike the plasma processing apparatus shown in FIG. 42, the plasma processing apparatus shown in FIG. 41 is of a single-frequency excitation type. In other words, RF power is supplied only to the cathode 4 and the susceptor electrode 8 is grounded. Moreover, the matching box 14 and the second RF generator 15 shown in FIG. 42 are omitted. The susceptor electrode 8 and the chamber wall 10 have the same DC potential.

In the above-described plasma processing apparatuses, power having a frequency of approximately 13.56 MHz is generally supplied to generate a plasma between the electrodes 4 and 8. A plasma process such as CVD, sputtering, dry etching, ashing, or the like is then performed using the plasma.

The path of the RF power supplied from the RF generator 1 during such a process is as follows: An RF current flows into the cathode 4 through the power supply section. The current then returns to the ground position of the RF generator 1 via the susceptor electrode 8 and a power return section. The power return section is a section which has the same DC potential as that of the chamber wall 10 and is connected to the grounded line of the RF generator 1. For example, the power return section includes the chassis 21 and the matching box 2.

Through quantitative analysis, the inventors have found that the impedance of the ground line connected to the chamber at a plasma exciting frequency is higher than the impedance of the power return path by two to three orders of magnitude. The process results were the same regardless of whether the ground line was provided or not, thereby confirming the validity of the finding.

However, in the conventional plasma processing apparatuses, the feeder section including the feed plate 3 and the path of RF power returning to the ground of the RF generator 1, i.e., the power return section, have a high inductance. As a result, the RF current flowing into the plasma generation space between the electrodes 4 and 8 is regulated, thereby possibly decreasing the amount of power fed to the plasma space and the density of the generated plasma, which is a problem.

Moreover, the feeding loss in the power return section is high due to RF resistance components such as the chassis 21 and matching box 2, which are made of aluminum plates. This may decrease the effective RF power consumed in the plasma generation space.

Furthermore, the feeding loss at the RF resistance components of the feed plate 3 is large, thereby decreasing the effective RF power consumed in the plasma generation space.

The feed plate 3 is not necessarily connected to the center of the plasma excitation electrode 4. When the feed plate 3 is not connected to the center of the plasma excitation electrode 4, drifting of the RF current may occur, thereby generating a density distribution of the generated plasma in the electrode surface direction. This may also result in variation in layer characteristics in the surface direction, such as the thickness of the layer deposited by a plasma process.

When the size of the plasma excitation electrode 4, i.e., the maximum length from the center of power feeding to the periphery of the electrode, is larger than the quarter wave of the plasma excitation frequency, standing waves occur, which is a problem. That is, a distribution in plasma density is generated, and the uniformity of the layer thickness and layer characteristics in the substrate surface direction is impaired.

The above-described problems of variation in plasma processing are particularly severe when a power of approximately 150 MHz is supplied, when the plasma excitation electrode 4 and the susceptor electrode 8 have a diameter of approximately 60 cm, and when a substrate to be processed has a diameter of approximately 50 cm.

Particularly in the process for making substrates for liquid crystal displays, the substrate size is large, and the conventional apparatuses suffer more acutely from the above problem than in semiconductor manufacturing processes.

Another possible cause of the variation in the plasma processing is changes over time of the plasma processing apparatuses. In order to prevent changes over time, changes arising from the feed plate 3 in the feeder section and changes arising from the power return section, including the chassis 21 and the matching box 2, must be suppressed to achieve stable and uniform plasma processing over time. When plasma processing is performed a plurality of times, the RF characteristics of the power feed section varies each time the plasma processing is performed, each time resulting in different plasma processing results.

This problem is particularly severe when the feed plate 3 is made of copper and is of a type whose shape can be changed without having to disconnect the feed plate 3 from the plasma excitation electrode 4, i.e., when the shape of the feed plate 3 can be changed before or after the plasma processing or maintenance. The problems are also severe when the feed plate 3 is oxidized.

Yet another cause of variation in the plasma processing is deterioration, such as oxidation, of the surfaces of the chassis 21 and the matching box 2. The deterioration is particularly severe when the plasma processing is performed many times.

Referring now to FIG. 38, in the conventional plasma processing apparatuses, the supply line 1A, which functions as both the power supply section through which an RF current is fed to the chamber and the power return section through which the current returns to the ground, has a portion 1S disposed on the floor GF or the ceiling GC. The floor GF and the ceiling GC serve as a ground position. Because the RF current leaks to the floor GF or the ceiling GC, i.e., the ground position, from the portion 1S of the supply line 1A, the power fed to the plasma space decreases, feeding loss, which causes reduction of the density of the generated plasma, increases, and the RF power effectively consumed in the plasma generation space decreases.

Referring to FIG. 38, the supply line 1A also has a portion 1T located in the vicinity of the matching box 2 or the chamber wall 10 of the plasma processing chamber 60. The matching box 2 and the chamber wall 10 of the plasma processing chamber 60 are DC-ground positions. Because an RF current leaks from the portion 1T of the supply line 1A to the matching box 2 or the chassis 21 having a ground potential, the power fed to the plasma space decreases, feeding loss, which causes reduction of the density of the generated plasma, increases, and the RF power effectively consumed in the plasma generation space decreases.

When the plasma excitation frequency supplied from the RF generator 1 is increased, the supply line 1A has a small impedance $Z_X$ corresponding to the capacitance component (loss capacitance) $C_X$ generated due to the fact that the floor GF or the ceiling GC has a ground potential. A small impedance $Z_X$ increases the loss current $I_X$ leaking to the floor GF or the ceiling GC having a ground potential. An increase in the plasma excitation frequency also increases the impedance $Z_0$ of the supply line 1A. As a result, the current flowing into the apparatus decreases, and the rate of change in the loss current $I_X$ increases. In other words, an increase in the variation of the effective power due to the variation in the feeding loss occurs. This problem and the above problem of increased feeding losses may significantly affect the stability of the power fed to the plasma space. The improvement thereof is desired.

Referring now to FIG. 39, when the matching box 2 is disposed separately from the plasma processing chamber 60, and the output terminal of the power supply section is connected to the plasma excitation electrode 4 through the feed line 3A, which is a coaxial cable, an RF current leaks from a portion 3S of the feed line 3A placed on the floor GF or the ceiling GC to the ground potential, i.e., the floor GF or the ceiling GC. As a result, the power fed to the plasma space decreases, feeding loss, which causes reduction of the density of the generated plasma, increases, and the RF power effectively consumed in the plasma generation space decreases.

As shown in FIG. 39, the feed line 3A also includes a portion 3T in contact with or disposed close to the matching box 2, the chamber wall 10 of the plasma processing chamber 60, and the like which have a DC ground potential. Because an RF current leaks from the portion 3T to the matching box 2, the chassis 21, and the like, the power fed to the plasma space decreases, feeding loss, which causes reduction of the density of the generated plasma, increases, and the RF power effectively consumed in the plasma generation space decreases.

As in the supply line 1A, the feed line 3A also suffer from an increased rate of change arising from the changes in impedance due to the feeding losses when the plasma excitation frequency supplied from the RF generator 1 is increased. This problem and the above problem of increased feeding losses may significantly affect the stability of the power fed to the plasma space. The improvement thereof is desired.

In most cases, coaxial cables, i.e., the supply line 1A and the feed line 3A, are not permanently fixed. Referring to FIGS. 38 and 39, the position of the portions 1S and 3S may change during plasma processing and before and after maintenance. Such a change in position may change the reactance and the RF resistance components, which may eventually lead to a change in power fed to the plasma space and nonuniformity in the density of the generated plasmas. Thus, such changes in the position of the portions 1S and 3S should be prevented to suppress changes in plasma processing over time and to achieve uniform and stable plasma processing over time.

In particular, when plasma processing is performed many times, the position of the coaxial cable changes each time, resulting in a change of the RF characteristics and nonuniform plasma processing results.

Moreover, a difference in plasma processing may also arise between plural plasma processing apparatuses constituting one plasma processing system. Such a difference should be minimized in a plasma processing system.

In the conventional plasma processing apparatuses, the flexibility of positioning the power feed section including components from the matching box 2 to the plasma excitation electrode 4 is small. The flexibility is desired to be improved without degrading the RF characteristics.

SUMMARY OF THE INVENTION

According to a first aspect of the present invention, a plasma processing apparatus includes at least one plasma processing unit. The plasma processing unit includes a plasma processing chamber having an electrode for plasma excitation; an RF generator for feeding RF power to the electrode; an RF supplier; an RF feeder; and a matching circuit for performing impedance matching between the plasma processing chamber and the RF generator, the matching circuit having an input terminal and an output terminal, the input terminal being connected to the RF generator through the RF supplier, the output terminal being connected to the electrode, through the RF feeder; wherein the average density per unit volume of the RF power that is supplied from the RF generator to the electrode lowers from the output terminal side to the electrode side in the RF feeder.

Preferably, the RF feeder includes a plurality of feeder elements.

The plurality of feeder elements may be parallel to each other.

The plurality of feeder elements may be connected to the electrode axisymmetrically with respect to the center of the electrode.

The plurality of feeder elements may be mutually connected with at least one connector element.

Preferably, the connector element has a face that is substantially parallel to the electrode.

The plurality of feeder elements may be connected to the connector element axisymmetrically with respect to the center of the connector element.

Preferably, the connector element is a plate having a shape analogous to that of the electrode.

In the plasma processing apparatus, a plurality of connector elements may be arranged between the output terminal and the electrode.

Preferably, the plurality of feeder elements is connected in an analogous state to an upstream face and a downstream face of at least one of the plurality of the connector elements.

Preferably, the plurality of feeder elements has equal RF characteristics.

Preferably, each of the RF feeder elements has a low-resistance surface having lower resistance than that of the inner portion.

The connector element may have a low-resistance surface having lower resistance than that of the inner portion.

The thickness of the low-resistance surface may be larger than the skin depth at a frequency of the RF power fed from the RF generator.

Each of the RF feeder elements may be covered with an insulating material.

The connector element may be covered with an insulating material.

Preferably, the RF feeders are rigid.

Preferably, the connector element is rigid.

The plasma processing chamber may have a shielding conductor connected to a chamber wall, the plurality of RF feeders being accommodated in the shielding conductor.

The plasma processing chamber may have a shielding conductor connected to a chamber wall, the connector element being accommodated in the shielding conductor.

The plasma processing apparatus of the present invention preferably includes a plurality of plasma processing units.

A plasma processing system includes a plurality of the above plasma processing apparatuses.

According to a second aspect of the present invention, a plasma processing apparatus includes at least one plasma processing unit. The plasma processing unit includes a plasma processing chamber having an electrode for plasma excitation; an RF generator for feeding RF power to the electrode; an RF supplier; an RF feeder; and a matching circuit for performing impedance matching between the plasma processing chamber and the RF generator, the matching circuit having an input terminal and an output terminal, the input terminal being connected to the RF generator through the RF supplier, the output terminal being connected to the electrode through the RF feeder; wherein a DC-ground section of a current path downstream of the electrode has at least one surface comprising a low-resistance portion with low electrical resistance.

Preferably, the low-resistance portion comprises at least one metal selected from the group consisting of gold, silver, and copper or alloys thereof.

The low-resistance portion may be provided on a surface of a chamber wall of the plasma processing chamber.

Preferably, the matching circuit is connected to a chamber wall of the plasma processing chamber and is accommodated in the interior of a shielding conductor that constitutes part of the DC-ground section of the current path, and the low-resistance portion is provided on a surface of a shielding conductor.

Preferably, the electrode is connected to a chamber wall of the plasma processing chamber and is covered with a shielding conductor that constitutes part of the DC-ground section of the current path, and the low-resistance portion is provided on the surface of a shielding conductor.

Preferably, the shielding conductor comprises at least one of elemental copper and a copper alloy.

Preferably, the thickness of the low-resistance portion is larger than the skin depth at a frequency of the RF power fed from the RF generator.

The low-resistance portion may be covered with an insulating material.

According to a third aspect of the present invention, a plasma processing apparatus comprises at least one plasma processing unit. The plasma processing unit comprises a plasma processing chamber having an electrode for plasma excitation; an RF generator for feeding RF power to the electrode; an RF supplier; an RF feeder; a matching circuit for performing impedance matching between the plasma processing chamber and the RF generator, the matching circuit having an input terminal and an output terminal, the input terminal being connected to the RF generator through the RF supplier, the output terminal being connected to the electrode through the RF feeder; and a shielding conductor that accommodates the matching circuit therein and is connected to a chamber wall of the plasma processing chamber to constitute part of a DC-ground section of a current path, wherein the shielding conductor comprises at least one of elemental copper and a copper alloy.

According to a fourth aspect of the present invention, a plasma processing apparatus includes at least one plasma processing unit. The plasma processing unit comprises a plasma processing chamber having an electrode for plasma excitation; an RF generator for feeding RF power to the electrode; an RF supplier; an RF feeder; a matching circuit for performing impedance matching between the plasma processing chamber and the RF generator, the matching circuit having an input terminal and an output terminal, the input terminal being connected to the RF generator through the RF supplier, the output terminal being connected to the electrode through the RF feeder; and a shielding conductor that accommodates the RF feeder and is connected to a chamber wall of the plasma processing chamber to constitute part of a DC-ground section of a current path, wherein the shielding conductor comprises at least one of elemental copper and a copper alloy.

According to a fifth aspect of the present invention, a plasma processing apparatus includes at least one plasma processing unit. The plasma processing unit includes a plasma processing chamber having an electrode for plasma excitation; an RF generator for feeding RF power to the electrode; an RF supplier; an RF feeder; a matching circuit for performing impedance matching between the plasma processing chamber and the RF generator, the matching circuit having an input terminal and an output terminal, the input terminal being connected to the RF generator through the RF supplier, the output terminal being connected to the electrode through the RF feeder; and a shielding conductor that covers the electrode and is connected to a chamber wall of the plasma processing chamber to constitute part of a DC-ground section of a current path, wherein the shielding conductor comprises at least one of elemental copper and a copper alloy.

In the second to fifth aspects, the shielding conductor may be covered with an insulating material.

In the second to fifth aspects, the plasma processing apparatus may include a plurality of plasma processing units.

A plasma processing system may include a plurality of the plasma processing apparatuses according to the second to fifth aspects.

According to a sixth embodiment of the present invention, a method for stabilizing a plasma processing apparatus is provided. The apparatus includes at least one plasma processing unit including a plasma processing chamber having an electrode for plasma excitation, an RF generator for feeding RF power to the electrode, an RF supplier, and a matching circuit for performing impedance matching between the plasma processing chamber and the RF generator, the matching circuit having an input terminal and an output terminal, the input terminal being connected to the RF generator through the RF supplier, the output terminal being connected to the electrode. The method comprises fixing the RF supplier to a ground potential position such that the RF impedance A of the RF supplier does not vary.

Preferably, the RF supplier is fixed to the ground potential position such that the RF impedance A of the RF supplier has a predetermined value.

The RF supplier may be fixed with an RF impedance adjuster. The RF impedance adjuster may include an insulating component.

According to a seventh aspect of the present invention, a method for stabilizing a plasma processing apparatus is provided. The apparatus includes at least one plasma processing unit including a plasma processing chamber having an electrode for plasma excitation, an RF generator for feeding RF power to the electrode, an RF feeder, and a matching circuit for performing impedance matching between the plasma processing chamber and the RF generator, the matching circuit having an input terminal and an output terminal, the input terminal being connected to the RF generator, the output terminal being connected to the electrode through the RF feeder. The method comprises fixing the RF feeder to a ground potential position such that the RF impedance B of the RF feeder does not vary.

Preferably, the RF feeder is fixed to the ground potential position such that the RF impedance B of the RF feeder has a predetermined value.

Preferably, the RF feeder is fixed with an RF impedance adjuster. Preferably, the RF impedance adjuster includes an insulating component.

In the sixth and seventh aspects, the plasma processing apparatus includes a plurality of plasma processing units.

According to an eighth aspect of the present invention, a method for stabilizing a plasma processing apparatus is provided. The apparatus includes a plurality of plasma processing units, each plasma processing unit comprising a plasma processing chamber having an electrode for plasma excitation, an RF generator for feeding RF power to the electrode, an RF supplier, and a matching circuit for performing impedance matching between the plasma processing chamber and the RF generator, the matching circuit having an input terminal and an output terminal, the input terminal being connected to the RF generator through the RF supplier, the output terminal being connected to the electrode. The method comprises fixing the RF supplier of each plasma processing chamber to a ground potential position such that the ratio $(A_{max}-A_{min})/(A_{max}+A_{min})$ is within a predetermined value, wherein Amax represents a maximum and Amin represents a minimum among the RF impedances A of the RF suppliers of the plurality of plasma processing chambers.

Preferably, the predetermined value is 0.10 or less.

Preferably, the RF supplier is fixed with an RF impedance adjuster. Preferably, the RF impedance adjuster includes an insulating component.

According to a ninth embodiment of the present invention, a method for stabilizing a plasma processing apparatus is provided. The apparatus includes a plurality of plasma processing units, each plasma processing unit including a plasma processing chamber having an electrode for plasma excitation, an RF generator for feeding RF power to the electrode, an RF feeder, and a matching circuit for performing impedance matching between the plasma processing chamber and the RF generator, the matching circuit having an input terminal and an output terminal, the input terminal being connected to the RF generator, the output terminal being connected to the electrode through the RF feeder. The method comprises fixing the RF feeder of each plasma processing chamber to a ground potential position such that the ratio $(B_{max}-B_{min})/(B_{max}+B_{min})$ is within a predetermined value, wherein Bmax represents a maximum and Bmin represents a minimum among the RF impedances B of the RF feeders of the plurality of plasma processing chambers.

Preferably, the predetermined value is 0.10 or less.

Preferably, the RF feeder is fixed with an RF impedance adjuster. Preferably, the RF impedance adjuster comprises an insulating component.

According to a tenth aspect of the present invention, a method for stabilizing a plasma processing system is provided. The system includes a plasma processing apparatus including a plasma processing chamber having an electrode for plasma excitation, an RF generator for feeding RF power to the electrode, an RF supplier, and a matching circuit for performing impedance matching between the plasma processing chamber and the RF generator, the matching circuit having an input terminal and an output terminal, the input terminal being connected to the RF generator through the RF supplier, the output terminal being connected to the electrode. The method comprises fixing the RF supplier to a ground potential position such that the RF impedance A of the RF supplier does not vary.

The RF supplier may be fixed to the ground potential position such that the RF impedance A of the RF supplier has a predetermined value.

Preferably, the RF supplier is fixed with an RF impedance adjuster. Preferably, the RF impedance adjuster comprises an insulating component.

According to an eleventh aspect of the present invention, a method for stabilizing a plasma processing system is provided. The system includes a plasma processing apparatus including a plasma processing chamber having an electrode for plasma excitation, an RF generator for feeding RF power to the electrode, an RF feeder, and a matching circuit for performing impedance matching between the plasma processing chamber and the RF generator, the matching circuit having an input terminal and an output terminal, the input terminal being connected to the RF generator, the output terminal being connected to the electrode through the RF feeder. The method comprises fixing the RF feeder to a ground potential position such that the RF impedance B of the RF feeder does not vary.

The RF feeder may be fixed to the ground potential position such that the RF impedance B of the RF feeder has a predetermined value.

Preferably, the RF feeder is fixed with an RF impedance adjuster. Preferably, the RF impedance adjuster comprises an insulating component.

According to a twelfth embodiment, a method for stabilizing a plasma processing system is provided. The system includes a plurality of plasma processing apparatuses, each plasma processing apparatus comprising a plasma processing chamber having an electrode for plasma excitation, an RF generator for feeding RF power to the electrode, an RF supplier, and a matching circuit for performing impedance matching between the plasma processing chamber and the RF generator, the matching circuit having an input terminal and an output terminal, the input terminal being connected to the RF generator through the RF supplier, the output terminal being connected to the electrode. The method comprises fixing the RF supplier of each plasma processing chamber to a ground potential position such that the ratio (Amax−Amin)/(Amax+Amin) is within a predetermined value, wherein Amax represents a maximum and Amin represents a minimum among the RF impedances A of the RF suppliers of the plurality of plasma processing chambers.

Preferably, the predetermined value is 0.10 or less.

Preferably, the RF supplier is fixed with an RF impedance adjuster. Preferably, wherein the RF impedance adjuster comprises an insulating component.

According to a thirteenth embodiment of the present invention, a method for stabilizing a plasma processing system is provided. The system includes a plurality of plasma processing apparatuses, each plasma processing apparatus comprising a plasma processing chamber having an electrode for plasma excitation, an RF generator for feeding RF power to the electrode, an RF feeder, and a matching circuit for performing impedance matching between the plasma processing chamber and the RF generator, the matching circuit having an input terminal and an output terminal, the input terminal being connected to the RF generator, the output terminal being connected to the electrode through the RF feeder. The method comprises fixing the RF feeder of each plasma processing chamber to a ground potential position such that the ratio (Bmax−Bmin)/(Bmax+Bmin) is within a predetermined value, wherein Bmax represents a maximum and Bmin represents a minimum among the RF impedances B of the RF feeders of the plurality of plasma processing chambers.

Preferably, the predetermined value is 0.10 or less.

Preferably, the RF feeder is fixed with an RF impedance adjuster. Preferably, the RF impedance adjuster comprises an insulating component.

According to a thirteen aspect of the present invention, a plasma processing apparatus includes a plurality of plasma processing units, each plasma processing unit including a plasma processing chamber having an electrode for plasma excitation; an RF generator for feeding RF power to the electrode; an RF supplier; and a matching circuit for performing impedance matching between the plasma processing chamber and the RF generator, the matching circuit having an input terminal and an output terminal, the input terminal being connected to the RF generator through the RF supplier, the output terminal being connected to the electrode, wherein the RF supplier of each plasma processing chamber is fixed to a ground potential position such that the ratio (Amax−Amin)/(Amax+Amin) is within a predetermined value, wherein Amax represents a maximum and Amin represents a minimum among the RF impedances A of the RF suppliers of the plurality of plasma processing chambers.

According to a fourteenth aspect of the present invention, a plasma processing apparatus includes a plurality of plasma processing units, each plasma processing unit including a plasma processing chamber having an electrode for plasma excitation; an RF generator for feeding RF power to the electrode; an RF feeder; and a matching circuit for performing impedance matching between the plasma processing chamber and the RF generator, the matching circuit having an input terminal and an output terminal, the input terminal being connected to the RF generator, the output terminal being connected to the electrode through the RF feeder, wherein the RF feeder of each plasma processing chamber is fixed to a ground potential position such that the ratio (Bmax−Bmin)/(Bmax+Bmin) is within a predetermined value, wherein Bmax represents a maximum and Bmin represents a minimum among the RF impedances B of the RF feeders of the plurality of plasma processing chambers.

According to a fifteenth aspect of the present invention, a plasma processing system includes a plurality of plasma processing apparatuses, each plasma processing apparatus including a plasma processing chamber having an electrode for plasma excitation; an RF generator for feeding RF power to the electrode; an RF supplier; and a matching circuit for performing impedance matching between the plasma processing chamber and the RF generator, the matching circuit having an input terminal and an output terminal, the input terminal being connected to the RF generator through the RF supplier, the output terminal being connected to the electrode, wherein the RF supplier of each plasma processing chamber is fixed to a ground potential position such that the ratio (Amax−Amin)/(Amax+Amin) is within a predetermined value, wherein Amax represents a maximum and Amin represents a minimum among the RF impedances A of the RF suppliers of the plurality of plasma processing chambers.

According to a sixteenth aspect of the present invention, a plasma processing system includes a plurality of plasma processing apparatuses, each plasma processing apparatus including a plasma processing unit having an electrode for plasma excitation; an RF generator for feeding RF power to the electrode; an RF feeder; and a matching circuit for performing impedance matching between the plasma processing unit and the RF generator, the matching circuit having an input terminal and an output terminal, the input terminal being connected to the RF generator, the output terminal being connected to the electrode through the RF feeder, wherein the RF feeder of each plasma processing unit is fixed to a ground potential position such that the ratio (Bmax−Bmin)/(Bmax+Bmin) is within a predetermined value, wherein Bmax represents a maximum and Bmin represents a minimum among the RF impedances B of the RF feeders of the plurality of plasma processing units.

In the plasma processing apparatus according to the present invention, the average density per unit volume of the RF power that is supplied from the RF generator to the electrode lowers from the output terminal side to the electrode side in the RF feeder. This configuration enlarges the space in which the RF current propagates in the RF feeder and thus decreases the resistance and inductance of the RF feeder. For example, both the output terminal of the matching circuit having a diameter corresponding a bolt and the electrode having a diameter of about 100 cm show decreased RF resistance. Thus, the feeder can accept a higher RF current, and a higher RF power can be fed into the plasma generating space. The plasma processing apparatus according to the present invention can more effectively consume the RF power than any conventional plasma processing apparatus when the same frequency is applied. This causes an improvement in plasma processing treatment, for example, an increased deposition rate in a layer deposition process and an increase in processing rate by a higher-frequency plasma excitation operation.

FIGS. 24 and 25 are schematic isometric views for illustrating the propagation of the RF power and graphs of the power density. Herein, "average power density" differs from strict "current density", and represents "the average of energies per infinitely small volume in disk-shaped spaces, each corresponding to a infinitely small length δi in the propagation direction of the energy in a space" including the RF feeder and the vicinity thereof.

In the present invention, the terms "the average density per unit volume of the RF power that is supplied from the RF generator to the electrode lowers from the output terminal side to the electrode side in the RF feeder" does not represent a simple increase in the surface area of the RF feeder for propagation of the RF current from the RF generator to the electrode, but represents the following phenomenon. As shown FIGS. 24 and 25, when a disk-shaped space ΔV with a infinitely small length δi is supposed perpendicularly to an i axis along the propagation direction of the current from an output terminal PR of the matching circuit to the plasma excitation electrode 4, the average energy density at an infinitely small volume δV in the space ΔV decreases along the i axis from the output terminal PR to the plasma excitation electrode 4.

More specifically, the terms represent "an increase in the number of the RF feeder elements", "an increase in cross-sectional area of the RF feeder at a plane perpendicular to the i axis", and "an increase in surface area of the RF feeder as an RF current path", from the output terminal PR side to the plasma excitation electrode 4.

A plurality of RF feeder elements decreases the average density per unit volume of the RF power that is supplied from the RF generator to the electrode, from the output terminal side to the electrode side in the RF feeder.

For example, when three RF feeder elements 3a are provided as shown in FIG. 25, the energy density of the RF power propagating in an infinitely small volume δV in the vicinity of the RF feeder elements 3a of a disk-shaped space ΔV perpendicular to the i axis is compared with the energy density of the RF power propagating in an infinitely small volume δV1 in the vicinity of a single RF feeder element 3' of a disk-shaped space ΔV1 perpendicular to the i axis as shown in FIG. 24.

In the disk-shaped space ΔV (ΔV1), the volume of the partial space for propagation of the RF power in the three RF feeder elements shown in FIG. 25 is about three times the volume of the partial space for propagation of the RF power in the single RF element shown in FIG. 24, in proportion to the number of the RF feeder elements. Hence, the space for propagation of the RF power in the disk-shaped space ΔV increases in proportion to the number of the RF feeder elements.

The plurality of the RF feeder elements reduces the energy density in an infinitely small volume δV of the partial space for propagation of the RF power, resulting in decreased inductance and resistance in the feeder. Hence, the feeder can accept a higher RF current, and a higher RF power can be fed into the plasma generating space.

Furthermore, the RF power can be fed into the electrode from the plurality of RF feeder elements; hence, no standing wave is generated even when the plasma excitation electrode (the maximum length from the feeder to the electrode) is larger than a quarter of the plasma excitation wavelength (RF frequency). Since the plasma density is uniform, a layer formed in this plasma chamber has uniform thickness and quality.

In the present invention, the RF feeder may have a portion including a plurality of RF feeder elements and thus may have a single current path portion between the output terminal of the matching circuit and the electrode. For example, the plurality of RF feeder elements may be connected to the output terminal PR of the matching circuit (corresponding to the output terminal of a tuning capacitor) through a single current path. For example, the apex of a conical RF feeder is connected to the output terminal while the bottom is connected to the plurality of RF feeder elements.

Since the feeder elements are arranged parallel to each other, RF currents propagating on the surfaces of the feeder elements form magnetic fields generated in a space between the feeder elements. These magnetic fields are mutually negated over the entire range in the propagation direction of the RF current to reduce the inductance of the feeder. Thus, the RF power can be further effectively consumed in the plasma generating space.

The feeder elements are connected to the electrode axisymmetrically with respect to the center of the electrode. More specifically, the distances from two feeder elements to the axis are the same. Alternatively, the mutual distance between three or more feeder elements are the same. In such configurations, magnetic fields generated by the feeder elements are mutually negated, and the inductance in the feeder is further reduced. This configuration also reduces drift of the current in the electrode, maintaining uniformity in thickness and quality of a layer due to uniform plasma density.

The center of the electrode corresponds to the center of the plasma generating space in the current path direction. For example, the center of a circular electrode corresponds to the center of the circle, and the center of a rectangular electrode corresponds to the intersection of two diagonal lines.

Herein, the "axisymmetry" represents spatial symmetry with respect to the axis line perpendicular to the electrode plane. In other words, these RF feeder elements have, for example, the same connection distance and the same connection angle (angle defined by the axis line perpendicular to the electrode plane and the axis line of the RF feeder elements) with respect to the center of the electrode. That is, the positions of the feeder elements attached to the electrode are axisymmetrical, and positions of the feeder elements distant from the electrode are also axisymmetrical (have the same distance to the center of the electrode). When the shape of the feeder elements is, for example, a circle in a direction perpendicular to the i axis, the feeder elements are fixed to the electrode with an equiangular distance.

The feeder elements are connected to each other with a connector element. Thus, the feeder elements can be connected to the electrode with a large distance between the feeder elements. This configuration further decreases the energy density in the partial space in which the RF power propagates. Thus, the inductance and resistance are further decreased. Accordingly, the RF power is more effectively consumed in the plasma generating space.

Furthermore, the feeder elements arranged at a larger distance prevent generation of a standing wave even if the size of the plasma excitation electrode is larger than a quarter of the plasma excitation frequency. As a result, a layer with a more uniform thickness and more uniform quality is obtainable.

The connector element has a plane substantially parallel to the electrode. Thus, the feeder elements can be connected to the connector element axisymmetrically with respect to the axis line in the electrode center. In this configuration, the feeder elements have the same length; hence the feeder elements have the same impedance and the same current flows in these feeder elements. Thus, the drift of the RF current in the electrode can be more effectively prevented.

Also the feeder elements are connected to the connector element axisymmetrically with respect to the center of the connector element. This configuration prevents the drift of the RF current between the connector element and the electrode, causes a uniform plasma density in the plasma generating space, forms a layer with a uniform thickness and uniform quality, and increases effective RF power consumption in the plasma generating space.

Since the connector element is a plate having a shape analogous to that of the electrode, the feeder elements can be connected to both faces of the connector element so as to decrease the average density per unit volume of the RF power at the output terminal side of the matching circuit and the electrode side. This configuration prevents the drift of the RF current and unevenness in plasma density, thickness and quality of a layer, reduces inductance and resistance. Thus, the RF power is more effectively consumed in the plasma generating space.

Herein, "analogous" represents that the connector element and the electrode have analogous outlines in the direction of the current path (i axis direction). If the connector element is not perpendicular to the i axis, the outline projected to a plane perpendicular to the i axis of the connector element is analogous to the outline of the electrode.

Since the feeder elements are connected in an analogous state to an upstream face and a downstream face of the connector element, the spaces for propagation of the RF current in the propagation direction are also analogous at both faces of the connector elements. This configuration prevents the drift of the RF current and unevenness in plasma density, thickness and quality of a layer, reduces inductance and resistance. Thus, the RF power is more effectively consumed in the plasma generating space.

Herein, the "analogous state" represents that the connection states in the current propagation path are analogous to each other at both faces. More specifically, connecting positions of the feeder elements have the same distance and the same angle (angle defined by the plane of the connector element and the axis of the feeder elements).

When the RF feeder includes a plurality of connector elements, the space in which the RF power propagates stepwisely increases from the output terminal of the matching circuit toward the electrode. Thus, the average density per unit volume of the RF power stepwisely decreases toward the electrode. For example, even in a plasma treatment of a substrate with a diameter of about 50 cm using an electrode with a diameter of about 60 cm connecting to the feeder elements that are arranged in parallel and axisymmetrically, the drift of the RF current is prevented. Thus, this large-substrate large-electrode treatment prevents unevenness in plasma density, thickness and quality of a layer, reduces inductance and resistance. Thus, the RF power is more effectively consumed in the plasma generating space.

The feeder elements preferably have equal RF characteristics. In other words, these feeder elements have substantially the same diameter, the same cross-sectional shape, and the same length so as to have the same RF resistance and inductance. This configuration prevents the drift of the RF current and unevenness in plasma density, thickness and quality of a layer, reduces inductance and resistance. Thus, the RF power is more effectively consumed in the plasma generating space. When the feeder elements are stepwisely arranged using a plurality of connector elements, these feeder elements preferably have the same diameter, the same cross-sectional shape, and the same length so that the RF characteristics at each step can be readily controlled.

Each of the RF feeder elements and the connector element preferably has a low-resistance surface having lower resistance than that of the inner portion. Since the RF current predominantly flows in the surface by the skin effect, the low resistance surface facilitates the RF current flow in the surface, regardless of the size and length of the feeder elements and/or the connector element. As a result, the RF power can be more effectively fed into the plasma generating space.

FIGS. 26 and 27 show configurations provided with the low-resistance surface.

FIG. 26 shows an embodiment of the configuration of the low-resistance surface RL. The low-resistance surface (not shown in the drawing) is formed on the entire surface of each of the feeder element 31 and the feeder elements 32a. On the other hand, the low-resistance surface RL of the disk connector element C31 is formed over the entire upstream face at the RF power source (at the PR side), the entire side face, and a peripheral portion of the downstream face connecting to the feeder elements 32a. In this configuration, the low-resistance surfaces are provided on only the faces in which an RF current flows by the skin effect.

FIG. 27 shows an embodiment of the configuration of the low-resistance surface RL. The low-resistance surface (not shown in the drawing) is formed on the entire surface of each of the feeder elements 32b and 34b. On the other hand, the low-resistance surface RL of the disk connector element C32 is formed over a peripheral portion of the upstream face connecting to the feeder elements 32b, a peripheral portion of the downstream face connecting to the feeder elements 34b, and the entire side face, but is not formed in the central portions of the upstream and downstream faces connecting to the feeder elements 32b and 34b, respectively. In this configuration, the low-resistance surfaces are provided on only the surfaces in which an RF current i flows by the skin effect.

When the low-resistance surface RL is composed of gold, silver, or an alloy thereof, such a metal prevents a change in RF characteristics such as resistance caused by heating, corrosion, and oxidation due to RF current during the plasma processing, and thus protects the RF feeder elements and connector elements. Accordingly, the plasma processing is stable and reproducible under a stable RF resistance.

Since the thickness of the low-resistance surface is larger than the skin depth at a frequency of the RF power fed from the RF generator. Thus, the RF feeder exhibits both reduced RF resistance and satisfactory mechanical strength.

An alternate current flowing in a conductor generates a magnetic field in the circumferential direction. The magnetic field changes with time in response to the alternate current and generates a counter electromotive force to hinder the change in the alternate current, as a result of the electromagnetic induction. The current in the inner portion (core) of the conductor causes a larger extent of flux linkage and thus a larger counter electromotive force; hence, the current density is smaller in the core. As a result, the alternate current flows predominantly at the surface of the conductor. The skin depth δ denotes the depth from the surface of the conductor in which the alternate current flows. The skin depth δ is represented by Equation (1):

$$\delta = \sqrt{\frac{2}{\omega\mu\sigma}} \ (m) \quad (1)$$

wherein W is the radiofrequency fed from the RF power, $\mu$ is the permeability (=$\mu_0$: permeability in vacuum), and σ is the conductivity.

The insulating material covering the surfaces of the RF feeder element and the connector element prevents oxidation of these surfaces, and thus prevents a change in RF resistance of the RF feeder. Thus, the plasma processing apparatus can be operated with higher stability and reproducibility during repeated processing cycles.

When the feeder element and/or connector element is rigid, the geometrical configuration of the RF feeder is maintained at a desirable state without change with time during plasma processing. Thus, the plasma processing apparatus can be operated with higher stability and reproducibility during repeated processing cycles for long time periods.

The term "rigid" represents that the feeder element and connector element are not deformed during the plasma processing operation, and maintenance such as disassembly and assembly. These rigid elements have high positioning and alignment reproducibility in assembly and reassembly. The plasma processing apparatus including these rigid elements shows a slight change in RF characteristics during repeated plasma processing cycles for long time periods; hence, the plasma processing is stable and highly reproducible.

When the feeder elements and/or the connector element is accommodated in the shield conductor connected to the chamber wall of the plasma processing chamber, the energy density in a partial space in which the RF power propagates in the feeder is further reduced with high arrangement flexibility of the matching circuit. Thus, the feeder can accept a higher-frequency current due to a decreased inductance. Moreover, the RF power can be more effectively consumed in the plasma generating space due to a decreased electrical loss in the feeder. The shield conductor also prevents undesirable outward radiation.

When the matching circuit includes a matching box and a chassis connecting to the matching box and is disposed at a position distant from the chamber including the plasma excitation electrode, the shield conductor consists of the matching box, the chassis, and a housing connecting to the chassis and the chamber and accommodating the feeder. This configuration facilitates shielding of the feeder regardless of the relative configuration among the matching circuit, the electrode, and the chamber.

The matching box is, for example, a coaxial cable from the RF generator and is grounded by connection to the external conductor of a power supply line. The chassis or housing is connected to the chamber wall and the matching box. The chamber wall, the housing, the chassis, the matching box, and the external conductor constitute a return path toward the RF generator of the RF current fed from the RF generator.

When the plasma processing apparatus includes a plurality of plasma processing units, these plasma processing units have substantially the same RF characteristics in the feeders. Thus, these plasma processing chambers consume substantially the same RF power in the plasma space.

As a result, the same process recipe can be applied to these deposition units in order to achieve substantially the same plasma processing results. For example, when these units are used in film deposition, the deposited films have substantially the same properties, i.e., thickness, breakdown voltage, and etching rate.

In the plasma processing apparatus according to the present invention, a low-resistance portion with low electrical resistance is provided in the DC-ground section downstream of the electrode, in other words, in the return path of the RF current toward the ground portion of the RF generator. This low-resistance portion reduces inductance at the conductor surface in the return path of the RF current and increases the RF power fed into the plasma generating space. The plasma processing apparatus according to the present invention can more effectively consume the RF power than any conventional plasma processing apparatus when the same frequency is applied. This causes an improvement in plasma processing treatment, for example, an increased deposition rate in a layer deposition process such as a plasma enhanced CVD process and an increase in processing rate by a higher-frequency plasma excitation operation.

The DC-ground section is connected to the outer conductor (sheath line) of a supply line or coaxial cable from the RF generator and is grounded. The DC-ground section is defined by the chamber wall of the plasma processing chamber, a shielding conductor connected to the chamber wall, and the outer conductor. These constitute the return path of the RF current toward the RF generator.

The shielding conductor is defined by the matching box, which is connected to the outer conductor of the feed line and accommodates the matching circuit, and the chassis, which is connected to the matching box and the chamber wall and covers the plasma excitation electrode.

When the matching circuit and the chamber including the plasma excitation electrode are distant from each other, the outer conductor further includes a housing that connects the matching box and the chassis and accommodates the RF feeder, in addition to the matching box and the chassis. Thus, the feeder is shielded regardless of the relative configuration among the matching circuit, the electrode, and the chamber.

In the present invention, the surface includes both an outer surface and an inner surface. For example, the chamber wall has an inner surface in the vacuum plasma processing chamber and an outer surface in the atmosphere. Also, the shielding conductor has an inner surface opposing an electromagnetic wave source (the matching circuit, the RF feeder, or the susceptor electrode) and an outer surface at the opposite side. Furthermore, the surface includes the side walls in fine holes provided in the shielding conductor for communicating the outer surface with the inner surface of the shielding conductor.

When the low-resistance section is composed of gold, silver, copper, or an alloy thereof, the DC-ground section composed of aluminum or stainless steel has reduced resistance at the surface. Thus, the plasma processing apparatus more effectively consumes the RF power in the plasma generating space due to reduced inductance of the return path by the skin effect.

When the low-resistance section is provided at the outer surface of the chamber wall of the plasma processing chamber, the RF resistance and inductance of the outer surface of the chamber can be reduced in the return path from the susceptor electrode to the RF generator. As a result, the RF power is more effectively fed into the plasma generating space.

This low-resistance section and the low-resistance surface of the feeder reduce the RF resistance of portions in which the RF current preferentially flows.

The shielding conductor accommodating the matching circuit includes the chassis, the matching box, and/or the housing. The shielding conductor shields the RF feeder and reduces the loss of the RF power in the feeder.

When the low-resistance section is provided at a surface of the shielding conductor accommodating the RF feeder, the RF resistance and inductance of the surface of the shielding conductor can be reduced in the return path from the susceptor electrode to the RF generator. As a result, the RF power is more effectively fed into the plasma generating space.

The shielding conductor accommodating the RF feeder includes the chassis, the matching box, and/or the housing. The shielding conductor shields the RF feeder and reduces the loss of the RF power in the feeder.

When the low-resistance section is provided at a surface of the shielding conductor accommodating the plasma excitation electrode, the RF resistance and inductance of the surface of the shielding conductor can be reduced in the return path from the susceptor electrode to the RF generator. As a result, the RF power is more effectively fed into the plasma generating space.

The shielding conductor accommodating the RF feeder includes the chassis, the matching box, and/or the housing. The shielding conductor shields the RF feeder and reduces the loss of the RF power in the feeder.

Preferably, the shielding conductor is composed of copper or a copper alloy. If the RF current flows in portions other than the low-resistance section of the shielding conductor, the RF resistance and inductance do not increase. Moreover, the shielding conductor has low RF resistance even if no low-resistance section is provided thereon. As a result, the RF power is more effectively fed into the plasma generating space.

Preferably, the low-resistance section has a thickness that is larger than the skin depth at a frequency of the RF power fed from the RF generator. Since the low-resistance section reduces the RF resistance at the conductor surface in which the RF current preferentially flows. As a result, the RF power is more effectively fed into the plasma generating space without reduced mechanical strength of the DC-ground section in the return path.

The insulating material covering the surface of the low-resistance section prevents oxidation of the surface, and thus prevents a change in RF resistance of the DC-ground section in the return path. Thus, the plasma processing apparatus can be operated with higher stability and reproducibility during repeated processing cycles.

Preferably, the shielding conductor accommodating the matching circuit and constituting a part of the DC-ground section in the current path is composed of copper or a copper alloy. Thus, the shielding conductor has low RF resistance and inductance. As a result, the RF power is more effectively fed into the plasma generating space. The shielding conductor accommodating the matching circuit includes the matching box, the chassis, and the housing. This configuration facilitates shielding of the matching circuit regardless of the relative configuration among the matching circuit, the electrode, and the chamber.

Preferably, the shielding conductor accommodating the RF feeder and constituting a part of the DC-ground section in the current path is composed of copper or a copper alloy. Thus, the shielding conductor has low RF resistance and inductance. As a result, the RF power is more effectively fed into the plasma generating space. The shielding conductor accommodating the RF feeder includes the matching box, the chassis, and the housing. This configuration facilitates shielding of the RF feeder regardless of the relative configuration among the matching circuit, the electrode, and the chamber.

Preferably, the shielding conductor accommodating the electrode and constituting a part of the DC-ground section in the current path is composed of copper or a copper alloy. Thus, the shielding conductor has low RF resistance and inductance. As a result, the RF power is more effectively fed into the plasma generating space. The shielding conductor accommodating the electrode includes the matching box, the chassis, and the housing. This configuration facilitates shielding of the electrode regardless of the relative configuration among the matching circuit, the electrode, and the chamber.

The insulating material covering the surfaces of the shielding conductor prevents oxidation of the shielding conductor, and thus prevents a change in RF resistance of the shielding conductor. Thus, the plasma processing apparatus can be operated with higher stability and reproducibility during repeated processing cycles.

When the plasma processing apparatus includes a plurality of plasma processing units, these plasma processing units have substantially the same RF characteristics in the feeders. Thus, these plasma processing chambers consume substantially the same RF power in the plasma space.

When the surface of the DC-ground section or low-resistance section is covered with the insulating material, the insulating material prevents oxidation of the DC-ground section in the current return path. Thus, the RF characteristics of these plasma processing chambers barely change during operation for long time periods. Thus, the plasma processing chambers are stable during plasma processing over a long time period, and the plasma processing can be repeated with highly reproducible results.

As a result, the same process recipe can be applied to these deposition units in order to achieve substantially the same plasma processing results. For example, when these units are used in film deposition, the deposited films have substantially the same properties, i.e., thickness, breakdown voltage, and etching rate.

The plasma processing system including a plurality of the plasma processing apparatuses also have the above-mentioned advantages.

In the method for stabilizing the plasma processing apparatus according to the present invention, the RF supplier is fixed to a ground potential position such that the RF impedance A of the RF supplier does not vary. The ground potential position includes a floor, a ceil, the chamber wall of the plasma processing chamber, the matching box accommodating the matching circuit, and the chassis covering the electrode. The RF characteristics of the supply line (RF supplier) in the return path do not vary for long time periods. Thus, the plasma processing apparatus can be operated with higher stability and reproducibility during repeated processing cycles.

Preferably, the RF supplier is fixed to the ground potential position such that the RF impedance A of the RF supplier has a predetermined value. The RF characteristics of the supply line (RF supplier) in the return path do not vary for long time periods. Thus, the plasma processing apparatus can be operated with higher stability and reproducibility during repeated processing cycles.

Preferably, the RF supplier is fixed with an RF impedance adjuster. The impedance adjuster allows the RF supplier to have a predetermined distance from the ground potential portions such as the floor and the ceil, and maintains the RF characteristics of the RF supplier at predetermined levels during plasma operations.

Preferably, the RF impedance adjuster includes an insulating component, which reduces a loss current shunting from the radiofrequency feed line to the ground potential position. Thus, the RF power is effectively fed into the plasma generating space. Moreover, the RF impedance adjuster including the insulating component is inexpensive.

A loss capacitance $C_x$ is generated between the outer conductor of the radiofrequency feed line and the floor and ceiling and increases in reverse proportion to the distance $d_x$ between the outer conductor and the floor and ceiling.

The impedance Z (Ω) is represented by Formula (11):

$$Z \propto -j/\omega C \quad (11)$$

wherein j is imaginary unit ($j^2=-1$), ω is angular frequency ($\omega=2\pi f_e$, wherein $f_e$ is the power frequency), and C is capacitance. Thus, the impedance Z is determined by defining the capacitance C.

The current $I_0$ flowing in the outer conductor is divided into a current component $I_2$ flowing to the ground of the RF generator and a loss current $I_x$ shunting to the ground potential portion:

$$I_0 = I_2 + I_x \quad (14)$$

A constant distance $d_x$ between the outer conductor and the ground potential portions maintains the loss capacitance $C_x$ at a predetermined level and suppresses a variation in impedance $Z_x$. Thus, the constant distance $d_x$ suppresses a change in loss capacitance $C_x$, which is in reverse proportion to the impedance $Z_x$. Thus, the plasma processing apparatus has stable and high process reproducibility and can consume the RF power in the plasma generating space.

A larger distance $d_x$ further reduces the loss capacitance $C_x$ and thus increases the inductance $Z_x$, decreasing in the loss current $I_x$ relative to the plasma current fed into the plasma generating space. Accordingly, the RF power is more effectively consumed in the plasma generating space.

The stabilized RF power consumption in the plasma space causes uniform planar plasma processing on the substrate 16 and specifically the formation of a layer with a uniform thickness in a deposition treatment.

Also the stabilized RF power consumption in the plasma space contributes to an improvement in quality of the layers deposited by deposition processes such as plasma enhanced CVD and sputtering, for example, insulating breakdown voltage of the deposited layer, etching resistance to etching solutions, and compactness and hardness of the layer (formation of a dense layer). The compactness and hardness can be evaluated by etching resistance to a BHF solution.

When the same frequency is applied, the plasma processing apparatus according to the present invention can more effectively consume the RF power in the plasma space than any conventional plasma processing apparatus. Thus, a layer can be deposited at a reduced deposition time with reduced input electric power and thus reduced operation costs, resulting in reduced amounts of emission of carbon dioxide gas as an environmentally loading substance.

When the plasma processing apparatus includes a plurality of plasma processing chamber units, these plasma processing chamber units have substantially the same stability during operation.

When the RF supplier of each plasma processing chamber is fixed to a ground potential position such that the ratio <A>=(Amax−Amin)/(Amax+Amin) is within a predetermined value, wherein Amax represents a maximum and Amin represents a minimum among the RF impedances A of the RF suppliers of the plurality of plasma processing chambers, the RF characteristics of the plasma processing chambers can be controlled within a predetermined range. Thus, these plasma processing chambers consume substantially the same electric power in the respective plasma space.

As a result, the same process recipe can be applied to these plasma processing chambers in order to achieve substantially the same plasma processing results. For example, when these units are used in film deposition, the deposited films have substantially the same properties, i.e., thickness, breakdown voltage, and etching rate.

The impedance depends on many factors such as a distance between the RF supplier and the grounded floor and ceiling and may be different among the apparatuses. The control of the impedance A within the above range ensures the control of RF characteristics of the RF suppliers of the plasma processing chambers. Thus, the plasma processing chambers of the plasma processing apparatus can be operated uniformly and stably.

When the ratio <A> indicating variation in RF impedance A is set to 0.10 or less, a variation in plasma processing is further reduced.

When the plasma processing chamber and the matching circuit are separately arranged and when the output terminal of the matching circuit and the plasma excitation electrode are connected with a RF feeder of a coaxial cable (feed line), the feed line is fixed to ground potential portions such as a floor and ceiling so that the RF impedance B of the feed line does not change. Since the RF characteristics of the RF feeder do not change for long time periods, the plasma processing apparatus can be operated with higher stability and reproducibility during repeated processing cycles.

Specifically, the RF feeder (feed line) is fixed to the ground potential portions (floor or ceiling) such that the distance therebetween does not change. Thus, the RF feeder has stable RF characteristics in both the feeding path and the return path. Since the RF characteristics of the RF feeder do not change for long time periods, the plasma processing apparatus can be operated with higher stability and reproducibility during repeated processing cycles.

When the RF feeder (feed line) is fixed with a RF impedance adjuster composed of an insulating material, the RF characteristics of the RF feeder do not change for long time periods. The RF impedance adjuster ensures isolation of the RF feeder from the ground potential portions and prevents leakage of RF current from the RF feeder to the ground potential portions such as the floor and ceiling. Such a decrease in loss current leads to effective RF power consumption in the plasma generating space. Thus, the plasma processing apparatus according to the present invention can form a layer with reduced electric power compared with conventional apparatuses when the same radiofrequency is applied or at a higher deposition rate when the same RF power is fed. Moreover, the RF impedance adjuster including the insulating component is inexpensive.

When the plasma processing apparatus includes a plurality of plasma processing chamber units, these plasma processing chamber units have substantially the same stability during operation.

When the RF feeder of each plasma processing chamber is fixed to a ground potential position such that the ratio <B>=(Bmax−Bmin)/(Bmax+Bmin) is within a predetermined value, wherein Bmax represents a maximum and Bmin represents a minimum among the RF impedances B of the RF feeders of the plurality of plasma processing chambers, the RF characteristics of the plasma processing chambers can be controlled within a predetermined range. Thus, these plasma processing chambers consume substantially the same electric power in the respective plasma space.

As a result, the same process recipe can be applied to these plasma processing chambers in order to achieve substantially the same plasma processing results. For example, when these units are used in film deposition, the deposited films have substantially the same properties, i.e., thickness, breakdown voltage, and etching rate.

The impedance depends on many factors such as a distance between the RF feeder and the grounded floor and ceiling and may be different among the apparatuses. The control of the impedance A within the above range ensures the control of RF characteristics of the RF feeders of the plasma processing chambers. Thus, the plasma processing chambers of the plasma processing apparatus can be operated uniformly and stably.

When the ratio <A> indicating variation in RF impedance A is set to 0.10 or less, a variation in plasma processing is further reduced.

DESCRIPTION OF THE PREFERRED EMBODIMENTS

First Embodiment

The plasma processing apparatus, the plasma processing system, and the method for stabilizing them will now be described according to a first embodiment of the present invention.

Figure 1:
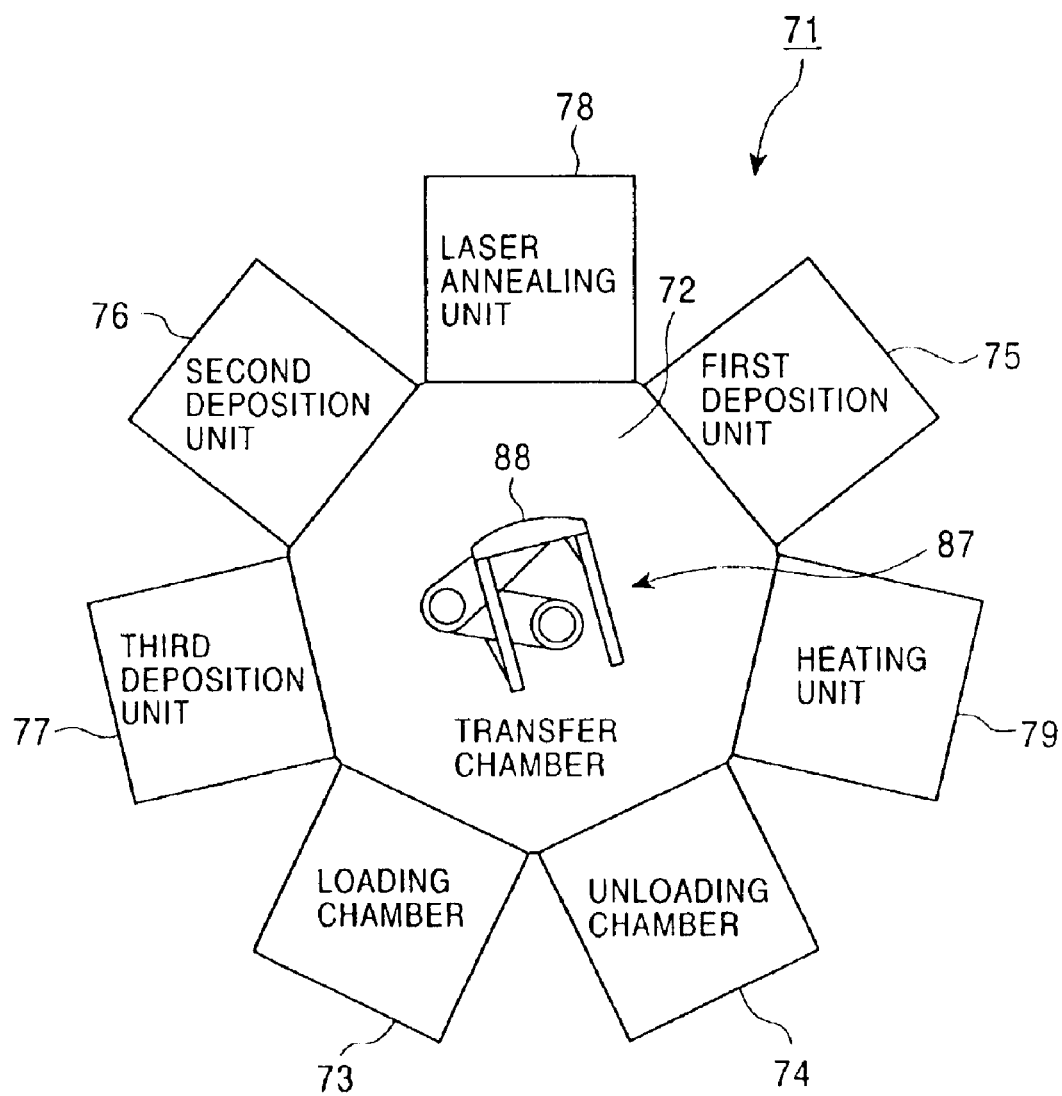
FIG. 1 is a schematic view showing the overall structure of a plasma processing apparatus according to first, fifth, and eighth embodiments.

FIG. 1 shows an outline configuration of a plasma processing apparatus 71 according to the first embodiment. The plasma processing apparatus 71 has a plurality of units and performs a series of production steps, for example, from depositing a polycrystalline silicon active layer to depositing a gate insulating layer of a top-gate thin-film transistor (TFT) by one continuous operation.

The plasma processing apparatus 71 has a heptagonal transfer chamber 72, which is surrounded by five units, a loading chamber 73, and an unloading chamber 74. The five units consist of a first deposition unit 75 for depositing an amorphous silicon layer, a second deposition unit 76 for depositing a silicon oxide layer, a third deposition unit 77 for depositing a silicon nitride layer, a laser annealing unit 78 for annealing a substrate after deposition treatment by laser, and a heating unit 79 for heating the substrate after the deposition treatment. The first deposition unit 75, the second deposition unit 76, and the third deposition unit 77 constitute a plasma processing unit. The first deposition unit 75, the second deposition unit 76, and the third deposition unit 77 have substantially the same configuration and may be used for different processes depositing different layers or the same process according to the same process recipe.

Each of these plasma processing units 75, 76, and 77 has a feeder that includes a plurality of feeder elements. These feeder elements are connected to each other with a disk connector element, so that the average density per unit volume of an RF power that is supplied from an RF generator to an electrode lowers from the output terminal PR side to the electrode side in the RF feeder, as described in detail below.

Figure 2:
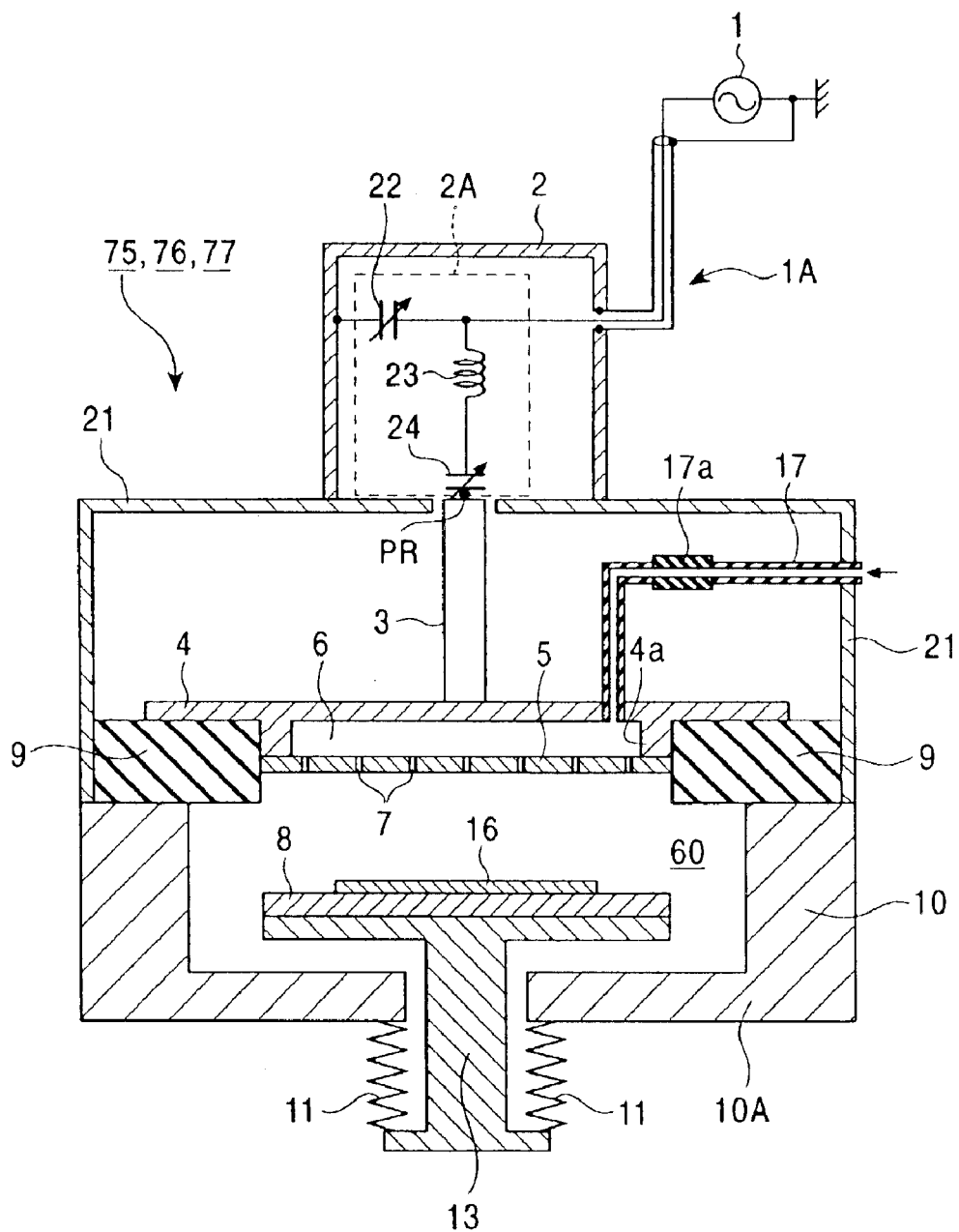
FIG. 2 is a cross-sectional view showing the overall structure of a plasma processing unit according to the first, fifth and eighth embodiments of the present invention.
Figure 3:
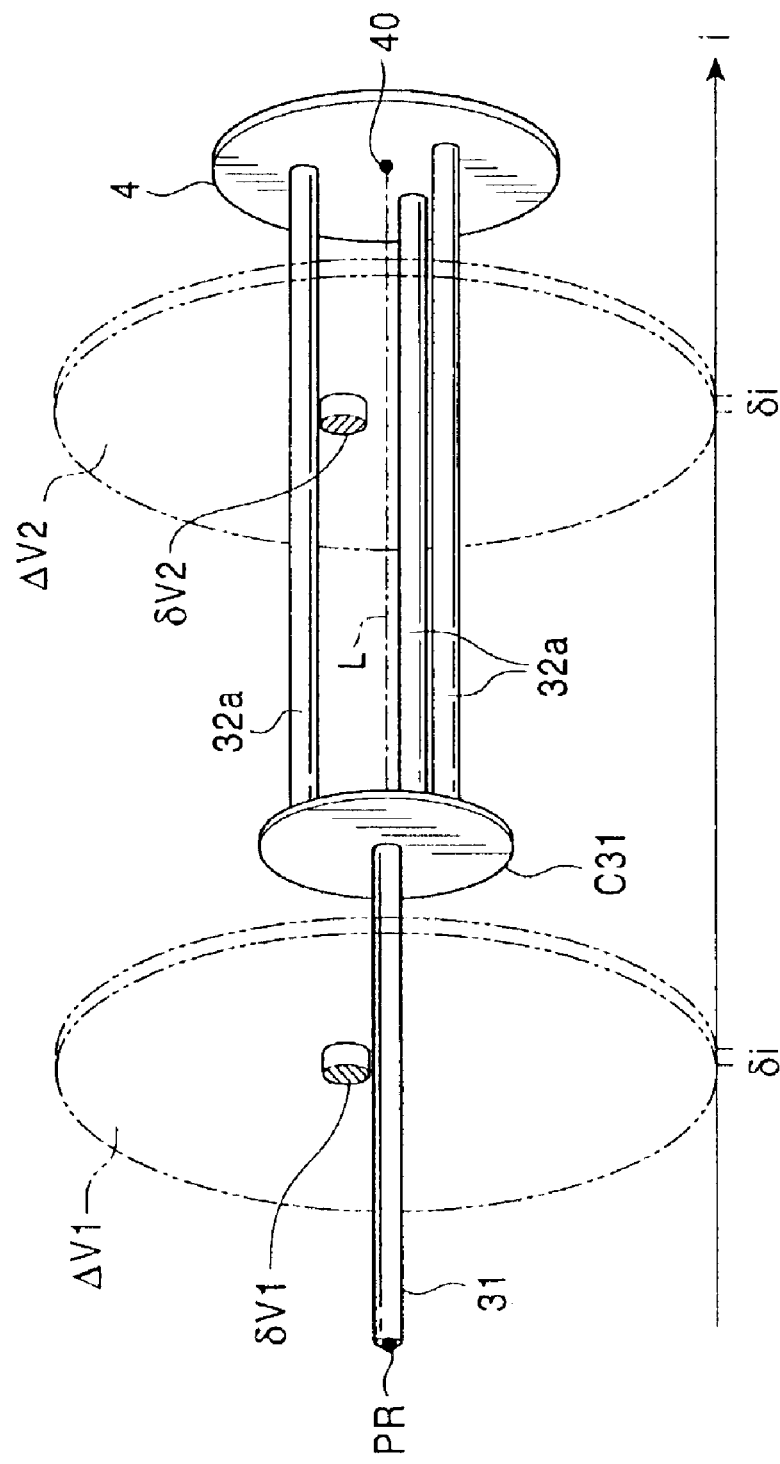
FIG. 3 is a perspective view showing a feeder 3 of the plasma processing unit shown in FIG. 2.
Figure 4:
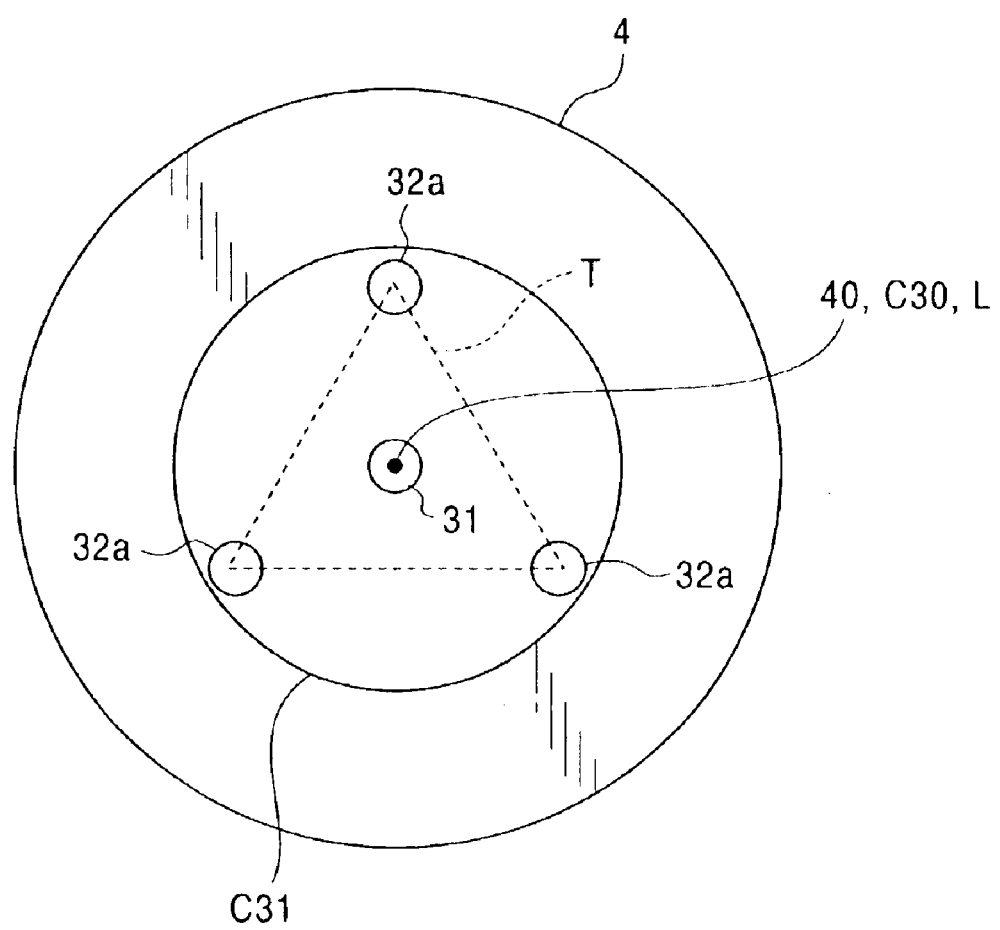
FIG. 4 is a plan view showing the feeder 3 and a plasma excitation electrode 4 shown in FIG. 2.

A configuration of the first deposition unit 75 will now be described with reference to FIGS. 2 to 4. FIG. 2 is an outline cross-sectional view of the plasma processing unit 75 according to the first embodiment; FIG. 3 is an isometric view of a feeder 3 of the plasma processing unit in FIG. 2; and FIG. 4 is a plan view of the feeder 3 and a plasma excitation electrode 4 shown in FIG. 3.

The first deposition unit 75 (in FIG. 1) is of a single-frequency excitation type and is used for plasma treatments, such as chemical vapor deposition (CVD), sputtering, dry etching, and ashing. Referring to FIG. 2, the chamber has parallel plates electrodes 4 and 8 (the plasma excitation electrode 4 and a susceptor electrode 8), an RF generator 1 connected to the plasma excitation electrode 4 through the feeder 3, and a matching circuit 2A that performs the impedance matching between the first deposition unit 75 and the RF generator 1.

Referring to FIGS. 2 and 3, the first deposition unit 75 has a plasma processing chamber 60. The plasma processing chamber 60 includes the plasma excitation electrode 4, connected to the RF generator 1, and a shower plate 5 at upper positions, and includes the susceptor electrode (counter electrode) 8 that holds a substrate 16 to be treated at a lower position. The shower plate 5 faces the susceptor electrode 8. The plasma excitation electrode 4 is connected to the RF generator 1 via the feeder 3 and the matching circuit 2A. Both the plasma excitation electrode 4 and the feeder 3 are covered with a chassis 21, while the matching circuit 2A is accommodated in a matching box 2 composed of a conductive material. The chassis 21 and the matching box 2 are mutually connected and function as shielding conductors. Furthermore, the matching box 2 is connected to a shield line (outer conductor) of a supplier (supply line) 1A being a coaxial cable.

The plasma excitation electrode (cathode) 4 is a disk having a diameter of about 30 cm, corresponding to the plasma processing chamber 60 that has a circular cross-section in the horizontal direction. The shower plate 5 has many holes 7 and is in contact with a projection 4a provided at the bottom face of the plasma excitation electrode 4; hence, the plasma excitation electrode 4 and the shower plate 5 form a space 6 therebetween. The space 6 communicates with a gas inlet pipe 17 that extends through the sidewall of the chassis 21 and the plasma excitation electrode 4.

The gas inlet pipe 17 is composed of a conductive material and provided with an insulator 17a in the midway inside the chassis 21, for insulating the plasma excitation electrode 4 from the gas supply side. Gas from the gas inlet pipe 17 is supplied into the plasma processing chamber 60 in a chamber wall 10 through the many holes 7 of the shower plate 5. The chamber wall 10 is insulated from the plasma excitation electrode 4 with an insulator 9. In FIG. 2, an exhaust system to be connected to the plasma processing chamber 60 is not depicted. The susceptor electrode 8 in the plasma processing chamber 60 has a disk shape and holds the substrate 16.

The susceptor electrode 8 is supported by a shaft 13 that extends through a chamber bottom 10A. The lower portion of the shaft 13 is hermetically connected to the chamber bottom 10A with a bellows 11 so that the susceptor electrode 8 and the shaft 13 can be vertically moved to adjust the distance between the parallel plates electrodes 4 and 8. As a result of the connection between the susceptor electrode 8 and the shaft 13, the susceptor electrode 8, the shaft 13, the bellows 11, the chamber bottom 10A, and the chamber wall 10 have the same DC potential. Also as a result of the connection between the chamber wall 10 and the chassis 21, the chamber wall 10, the chassis 21, and the matching box 2 have the same DC potential.

The matching circuit 2A includes a plurality of passive components for adjusting the impedance of the plasma processing chamber 60 in response to, for example, a change in plasma state in the plasma processing chamber 60. Specifically, as shown in FIG. 2, the matching circuit 2A is provided between the RF generator 1 and the feeder 3 and includes an inductance coil 23, a tuning capacitor 24 (an air variable capacitor), and a load capacitor 22 (a vacuum variable capacitor). The inductance coil 23 and the tuning capacitor 24 are directly connected between the input terminal and the output terminal PR of the matching circuit 2A, while the load capacitor 22 is connected in parallel to the junction between the inductance coil 23 and the input terminal. The inductance coil 23 and the tuning capacitor 24 are directly connected to each other, whereas one end of the load capacitor 22 is connected to the matching box 2 at the ground potential through a conductor. The tuning capacitor 24 lies at the tailing end of the passive components. The output terminal of the tuning capacitor 24, i.e., the output terminal PR of the matching circuit 2A is connected to the plasma excitation electrode 4 through the feeder (RF feeder) 3.

The matching box 2 is connected to the shield line of the supply line (RF supplier) 1A while the shield line is DC-grounded; the susceptor electrode 8, the shaft 13, the bellows 11, the chamber bottom 10A, the chamber wall 10, the chassis 21, and the matching box 2 have the ground potential. Also the outer end of the load capacitor 22 is DC-grounded.

Referring to FIG. 3, the feeder 3 between the output terminal PR and the plasma excitation electrode 4 includes rigid rod feeder elements 31 and 32a with a diameter of 2 to 10 mm and a length of 100 to 300 mm. These feeder elements are composed of copper and are connected with a disk connector element C31. The outer end of the feeder element 31 is fixed to the output terminal PR of the matching circuit 2A, i.e., the output terminal of the tuning capacitor 24 with connecting means such as a screw, while the inner end of the feeder element 31 is perpendicularly fixed to the upstream face of the disk connector element C31.

The shape of the disk connector element C31 is analogous to that of the plasma excitation electrode 4; the diameter of the disk connector element C31 is smaller than that of the plasma excitation electrode 4, i.e., about 20 cm. The disk connector element C31 is composed of, for example, copper and has a thickness of about 2 mm to maintain rigidity. The disk connector element C31 is arranged between the plasma excitation electrode 4 and the output terminal PR of the matching circuit 2A, so that the downstream face of the plasma excitation electrode 4 opposes the plasma excitation electrode 4. The shape of the disk connector element C31 is analogous to that of the plasma excitation electrode 4 when these components are viewed along the current propagating direction (the i axis direction).

A plurality of feeder elements 32a perpendicularly extends from the downstream face (at the plasma excitation electrode 4 side) of the disk connector element C31, and the other end of each of the feeder elements 32a is perpendicularly connected to the surface of the plasma excitation electrode 4. Thus, the feeder elements 32a extend parallel to the i axis, which is the propagation direction of a current from the output terminal PR to the plasma excitation electrode 4 that are arranged perpendicularly to the plasma excitation electrode 4.

In the feeder elements 31 and 32a, the average density per unit volume of the RF power that is supplied from the RF generator 1 to the plasma excitation electrode 4 lowers from the output terminal PR side to the plasma excitation electrode 4 side. In other words, the space in which an RF current propagates spreads from the end of the feeder element 31 fixed to the output terminal PR toward the ends of the feeder elements 32a fixed to the surface of the plasma excitation electrode 4. This substantially reduces RF resistance and inductance. More specifically, the feeder 3 has one rod feeder element 31 at the output terminal PR side and three rod feeder elements 32a at the plasma excitation electrode 4 side; the space in which the RF current propagates is about three times larger at the plasma excitation electrode 4 sides than the output terminal PR side.

These three feeder elements 32a are parallel to each other and are connected to the plasma excitation electrode 4 axisymmetrically with respect to the center 40 of the plasma excitation electrode 4, i.e., with respect to the axis line L that passes through the electrode center 40 and is perpendicular to the plasma excitation electrode 4. Referring to FIG. 4, each rod RF feeder element 32a lies at an apex of an equilateral triangle T, the center of the equilateral triangle T and the center 40 of the plasma excitation electrode 4 being in the same line. The rod RF feeder element 32a also lies at the same apex of the equilateral triangle T at the downstream face of the disk connector element C31, the center of the equilateral triangle T and the center C30 of the disk connector element C31 being in the same line.

The feeder element 31 is fixed to the center C30 at the upstream face of the disk connector element C31 (at the output terminal PR side of the matching circuit 2A) and passes through the center 40. In other words, the feeder element 31 extends on the axis line L, which is perpendicular to the plasma excitation electrode 4. The lengths of the feeder elements 32a are the same so that the plasma excitation electrode 4 and the disk connector element C31 are parallel to each other.

Since the feeder elements 31 and 32a and the disk connector element C31 are rigid, these are not deformed during the operation of the deposition unit. Furthermore, these rigid components are not deformed during maintenance working such as disassembly and assembly, and the relative positions of these components show high reproducibility after fixing and assembling operations. More specifically, the feeder elements 31 and 32a and the disk connector element C31 are mutually connected with any connecting means such as screws and are connected to the output terminal PR and the plasma excitation electrode 4. These connections exhibit high reproducibility in the present invention. Alternatively, these connections may be performed by welding.

Figure 5:
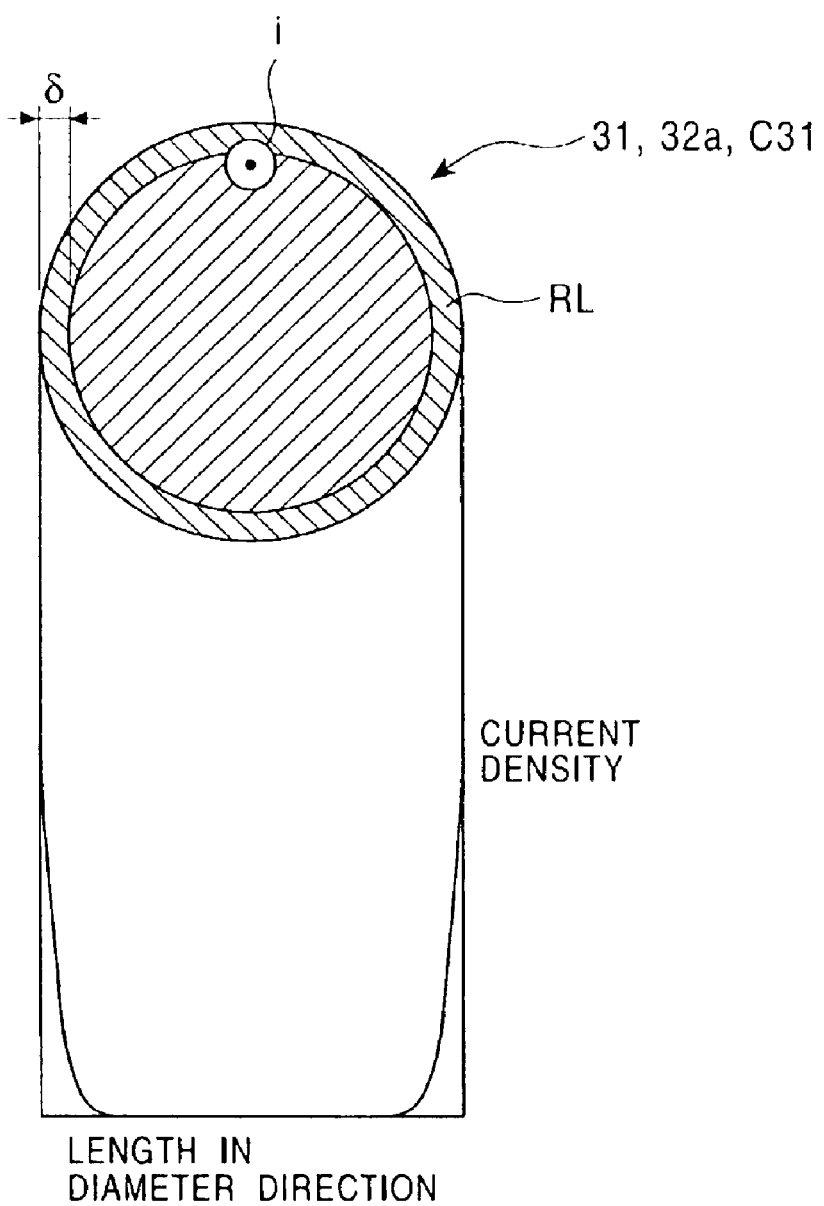
FIG. 5 is a cross sectional view for explaining a low-resistance surface RL and a skin depth δ of each of feeder elements 31 and 32a and a connector element C31.

FIG. 5 is a cross-sectional view of each of the feeder elements 31 and 32a and the feeder element 31. Each of the feeder elements 31 and 32a and the feeder element 31 has a low-resistance surface RL that is composed of a lower-resistance material, for example, gold or silver compared with the copper core (inner portion). The thickness of the low-resistance surface RL is larger than the skin depth δ at the frequency of the RF power fed from the RF generator 1.

In FIG. 5, an alternate current i flowing in each of the feeder elements 31 and 32a generates a magnetic field in the circumferential direction. The magnetic field changes with time in response to the alternate current i and generates a counter electromotive force to hinder the change in the alternate current i, as a result of the electromagnetic induction. The current in the core of the conductor causes a larger extent of flux linkage and thus a larger counter electromotive force; hence, the current density is smaller in the core. As a result, the alternate current i flows predominantly at the surface of the conductor. The skin depth δ denotes the depth from the surface of each of the feeder elements 31 and 32a in which the alternate current i flows. The skin depth δ is represented by Equation (2):

$$\delta = \frac{1}{\sqrt{\pi f \mu \sigma}} \text{ (m)} \quad (2)$$

wherein f is the frequency of the radiofrequency fed from the RF power, $\mu$ is the permeability (=$\mu_0$: permeability in vacuum), and σ is the conductivity.

When RF power of a frequency f of about 13.56 MHz is fed from the RF power, the skin depth δ at the silver low-resistance surface RL of each of the feeder elements 31 and 32a is about $1.30 \times 10 \, \mu m$ wherein σ=$1.10 \times 10^8$ S/m and $\mu = \mu_0$. Thus, the thickness of the low-resistance surface RL is set to be larger than $1.30 \times 10 \, \mu m$. The low-resistance surface RL is formed on the surface of each of the feeder elements 31 and 32a, for example, by plating.

Also, the side face of the disk connector element C31 composed of aluminum, copper, or stainless steel may be provided with a low-resistance surface RL by silver plating to reduce the RF resistance in the feeder 3.

All the entire surfaces of the feeder elements 31 and 32a and the feeder element 31 are covered with insulating films PC formed of an insulating material. All the entire surfaces represent the original surfaces and the low-resistance surfaces RL of these feeder elements.

Examples of the insulating materials include polyimide, tetrafluoroethylene-perfluoroalkyl vinyl ether (PFA) copolymers, polytetrafluoroethylene (PTFE), and tetrafluoroethylene-ethylene (ETFE) copolymers. The polyimide, tetrafluoroethylene-perfluoroalkyl vinyl ether (PFA) copolymers, and polytetrafluoroethylene (PTFE) exhibit high heat resistance, whereas the tetrafluoroethylene-ethylene (ETFE) copolymers exhibit high abrasion resistance.

In the first deposition unit 75 according to the first embodiment, RF power with a frequency of at least 13.56 MHz, for example, 13.56 MHz, 27.12 MHz, or 40.68 MHz is fed to generate a plasma between the parallel plates electrodes 4 and 8 for performing plasma treatment, for example, chemical vapor deposition (CVD), dry etching, or ashing to the substrate 16 on the susceptor electrode 8.

The RF power is fed from the RF generator 1 to the feeding path including the supply line 1A (coaxial cable), the matching circuit 2A, the feeder element 31, the disk connector element C31, the feeder elements 32a, and the plasma excitation electrode 4. The RF current from these components flows through the plasma processing chamber 60, the susceptor electrode 8, the shaft 13, the bellows 11, the chamber bottom 10A, the chamber wall 10, the chassis 21, the matching box 2, and the shield line of the supply line 1A toward the ground of the RF generator 1.

The shaft 13, the bellows 11, the chamber bottom 10A, the chassis 21, the matching box 2, and the shield line of the supply line 1A constitute the return path of the RF current to the ground of the RF generator 1.

When an amorphous silicon layer, a silicon oxide layer, or a silicon nitride layer is deposited on the substrate 16 in any one of the first deposition unit 75, the second deposition unit 76, and the third deposition unit 77, as shown in FIG. 2, the substrate 16 is placed on the susceptor electrode 8. RF power is fed from the RF generator 1 to the plasma excitation electrode 4 while a reactive gas is supplied to the plasma processing chamber 60 from the gas inlet pipe 17 through the shower plate 5 to generate a plasma for depositing the intended layer on the substrate 16.

Figure 6:
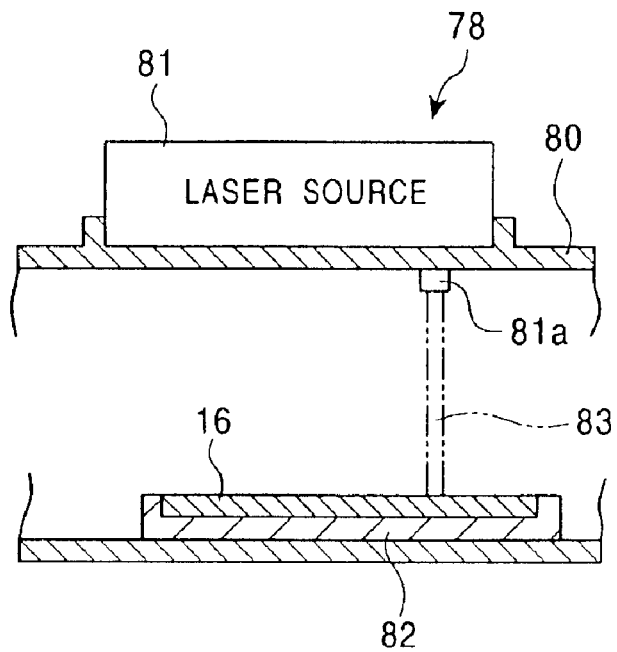
FIG. 6 is a vertical cross-sectional view showing a laser annealing unit shown in FIG. 1.

Referring to FIG. 6, the laser annealing unit 78 in FIG. 1 has a laser light source 81 on an upper chamber wall 80 and a stage 82 on the lower chamber wall in the chamber. The stage 82 holds the substrate 16 and can move horizontally in the X and Y directions. A spot laser light beam 83 is emitted from a window 81a of the laser light source 81 while the stage 82 holding the substrate 16 moves in the X and Y directions so that the laser light beam 83 scans across the entire surface of the substrate 16. The, laser light source 81 may use halogen gases, such as XeCl, ArF, ArCl, and XeF.

The laser annealing unit 78 may have any configuration as long as the laser light beam scans across the entire surface of the substrate to be treated. The laser light source 81 may be of any different type, for example, a YAG laser. The laser beam may be a pulsed laser beam or a continuously oscillated laser beam.

Figure 7:
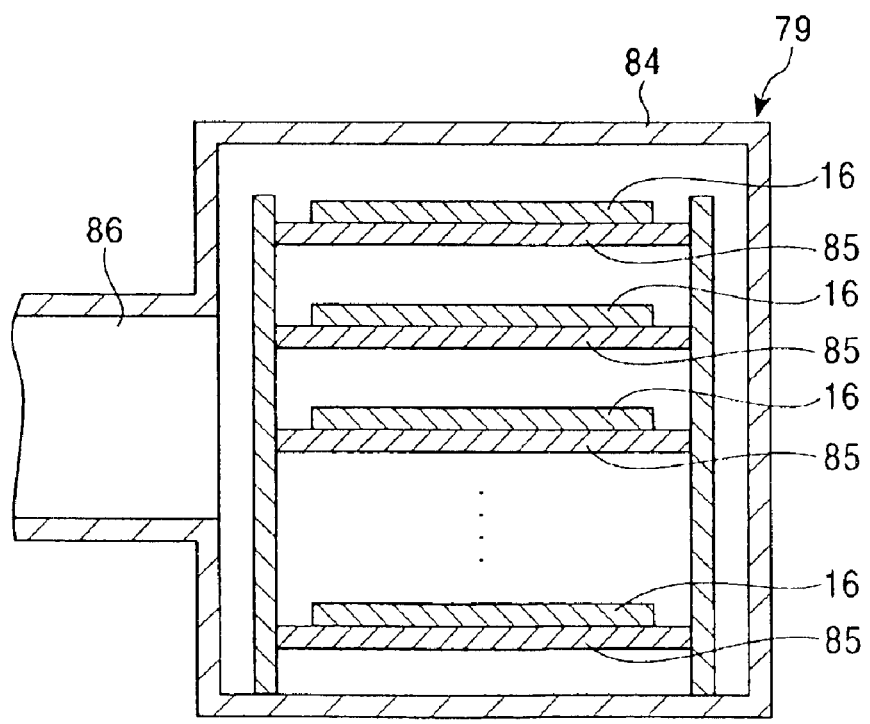
FIG. 7 is a vertical cross-sectional view showing a heating chamber shown in FIG. 1.

Referring to FIG. 7, the heating unit 79 is a multideck heating furnace having many multideck heaters 85 that hold substrates 16. These substrates 16 are heated by the heaters 85. The heating unit 79 is connected to the transfer chamber 72 shown in FIG. 1 via a gate valve 86.

Referring again to FIG. 1, a loading cassette and an unloading cassette are provided in the loading chamber 73 and the unloading chamber 74, respectively. These cassettes are detachable and can contain a plurality of substrate 16: The loading cassette holds untreated substrates 16 whereas the unloading cassette holds treated substrates 16. The transfer chamber 72 surrounded by the processing units, the loading chamber 73, and the unloading chamber 74 has a transfer robot 87 for transferring these substrates 16. The transfer robot 87 has an extendable and rotatable arm 88 that holds and transfers the substrates 16 at its end.

The plasma processing apparatus 71 is preliminarily set by an operator with respect to the film deposition conditions, the annealing conditions, the heat treatment conditions, the processing sequence, and the like of each plasma processing unit; however, the plasma processing apparatus 71 is automatically operated by a controller. In use of the plasma processing apparatus 71, an untreated substrate 16 is placed on a loading cassette. Upon the operation of a start switch by the operator, the substrate 16 is transferred from the loading cassette to each processing chamber by the transfer robot 87. After processing in each chamber, the substrate 16 is placed onto the unloading cassette.

The RF characteristics of the feeder 3 in the first deposition unit 75 of the plasma processing apparatus 71 will now be described (the RF characteristics of the second deposition unit 76 and the third deposition unit 77 are the same as that of the first deposition unit 75).

In the first deposition unit 75, the RF power is supplied from the RF generator 1 to the plasma excitation electrode 4. In the feeder 3, the average density per unit volume of the RF power lowers from the output terminal PR side to the plasma excitation electrode 4 side.

The "average density" represents the average of energies per unit volume in disk-shaped spaces (spaces having disk shapes), each corresponding to a infinitely small length $\delta i$ in the propagation direction of the RF power. Referring now to FIG. 3, an i axis is defined in the propagation direction of the current from the output terminal PR of the matching circuit (the output terminal of the tuning capacitor 24) to the plasma excitation electrode 4. In a disk-shaped space $\Delta V$ that corresponds to a infinitely small length $\delta i$ in the i axis and is perpendicular to the i axis, the energy density in an infinitely small volume $\delta V$ in the vicinity of the feeder element 31 and the feeder elements 32$a$ decreases from the output terminal PR side of the matching circuit to the plasma excitation electrode 4 side. In more detail, the current flows in one feeder element 31 at the output terminal PR side and in three feeder elements 32$a$ at the plasma excitation electrode 4 side. In other words, the total cross-sectional area of the feeder perpendicular to the i axis and the surface area of the feeder three times increase from the feeder element 31 to the feeder elements 32$a$.

Such a configuration allows the space for the propagating RF current to spread in the feeder 3; the inductance and the RF resistance of the feeder 3 decrease. In the feeder 3 comprising a plurality of feeder elements, the energy density in the infinitely small volume $\delta V$ in the space in which the RF power propagates decreases. As a result, the inductance decreases, and the feeder 3 does not have restriction for the RF current. Furthermore, the space in which the RF power propagates spreads from the output terminal PR, which has a size corresponding to, for example, a bolt, of the matching circuit 2A to the plasma excitation electrode 4; hence, in the infinitely small volume $\delta V$ in the space in which the RF power propagates, the energy density decreases and the RF resistance decreases to reduce power loss in the feeder.

Accordingly, the RF power is effectively consumed in a plasma generating space. The first deposition unit 75 according to the present invention can more effectively consume the RF power than any conventional plasma processing apparatus when the same frequency is applied. This causes an improvement in plasma processing treatment, for example, an increased deposition rate in a layer deposition process.

As described above, the feeder 3 comprises a plurality of feeder elements 32$a$ at the plasma excitation electrode 4 side, so that the average density of the RF power per unit volume at the feeder elements 32$a$ is lower than that at the single feeder element 31.

The "energy density of the RF power" propagating in a unit volume $\delta V2$ of a disk-shaped space $\Delta V2$ of the three feeder elements 32$a$ shown in FIG. 3 is compared with the "energy density of the RF power" propagating in a unit volume $\delta V1$ of a disk-shaped space $\Delta V1$ of the single feeder element 31. The partial space for propagation of the RF power in the space $\Delta V2$ is three times the partial space in the space $\Delta V1$, in connection with the number of the feeder elements 32$a$ and the number of the feeder element 31. In summary, the space for the propagation of the RF power fed from the RF generator 1 increases in the disk-shaped space $\Delta V$ perpendicular to the i axis in response to the number of the feeder elements 32$a$.

The plurality of feeder elements 32$a$ decreases the energy density and thus the inductance in the partial space for propagation of the RF power. As a result, the energy density at the partial space for propagation of the RF power is reduced at the feeder from the RF generator 1 toward the plasma excitation electrode 4, resulting in reduced inductance. Thus, the feeder can accept a higher RF current. The reduced energy density in an infinitely small volume $\delta V$ at the partial space decreases electric power loss in the feeder, and thus increases effective RF power consumption in the plasma generating space.

The plasma processing apparatus according to the present invention can more effectively consume the RF power than any conventional plasma processing apparatus when the same frequency is applied. This causes an improvement in plasma processing treatment, for example, an increased deposition rate in a layer deposition process and an increase in processing rate by a higher-frequency plasma excitation operation.

The feeder elements 32$a$ is connected to the plasma excitation electrode 4. As shown in FIG. 4, the RF power is fed to the plasma excitation electrode 4 through three points, which corresponds to the apexes of the equilateral triangle T. When the RF power is fed from a single point, the following problem arises. If the size (maximum distance from a feeding position to the electrode) of the plasma excitation electrode 4 is larger than a quarter of the plasma excitation frequency (RF power frequency), the plasma density in the plasma generating space becomes uneven because of standing waves. Thus, a film formed on a substrate may have an uneven thickness or uneven quality. The above feeder configuration in this embodiment effectively prevents such a problem.

Figure 8:
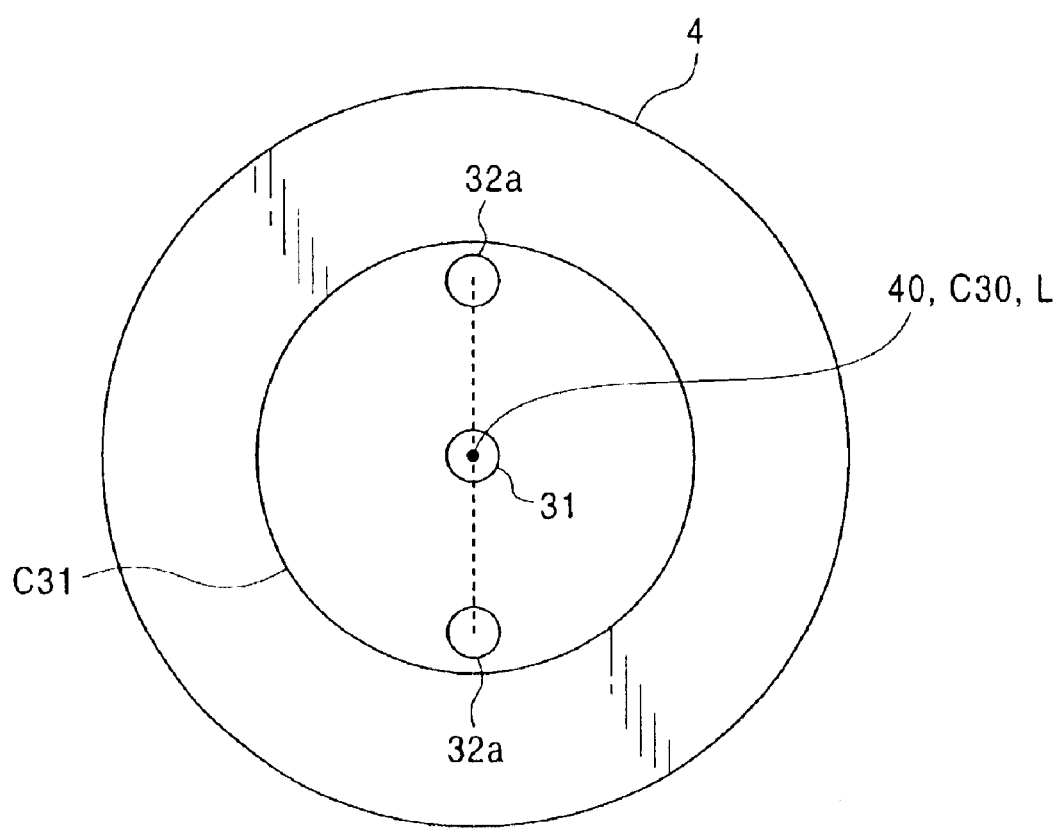
FIG. 8 is a plan view showing an arrangement of feeder elements and a connector element according to the present invention.
Figure 9:
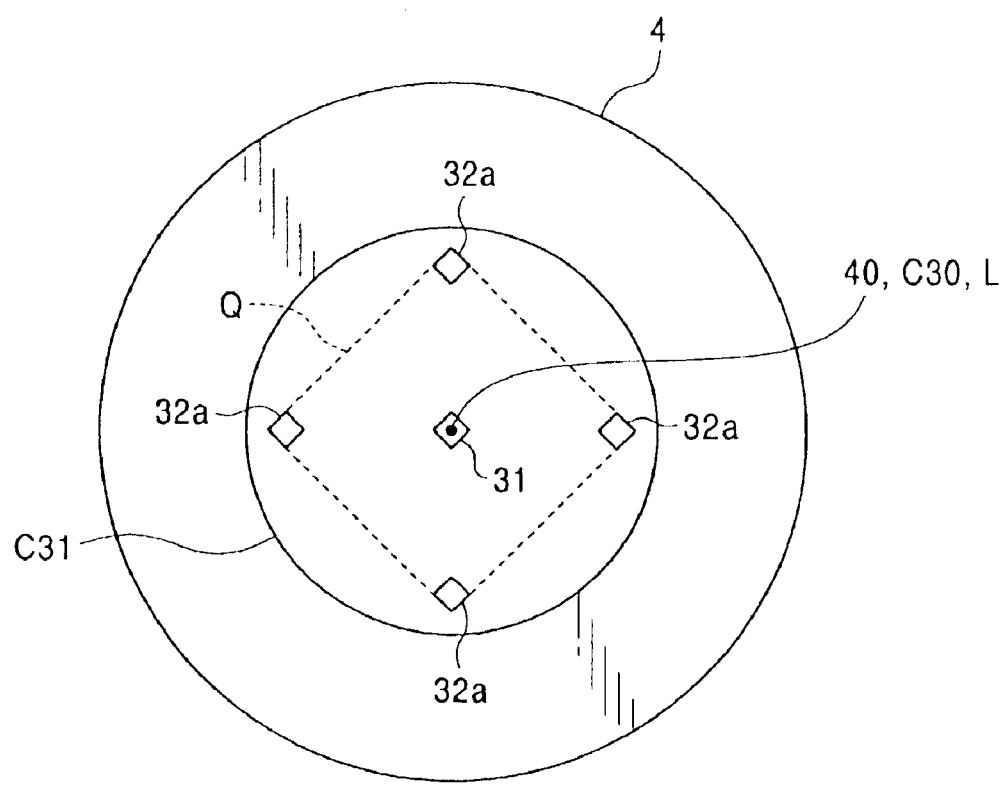
FIG. 9 is a plan view showing an arrangement of the feeder elements and the connector element according to the present invention.
Figure 10:
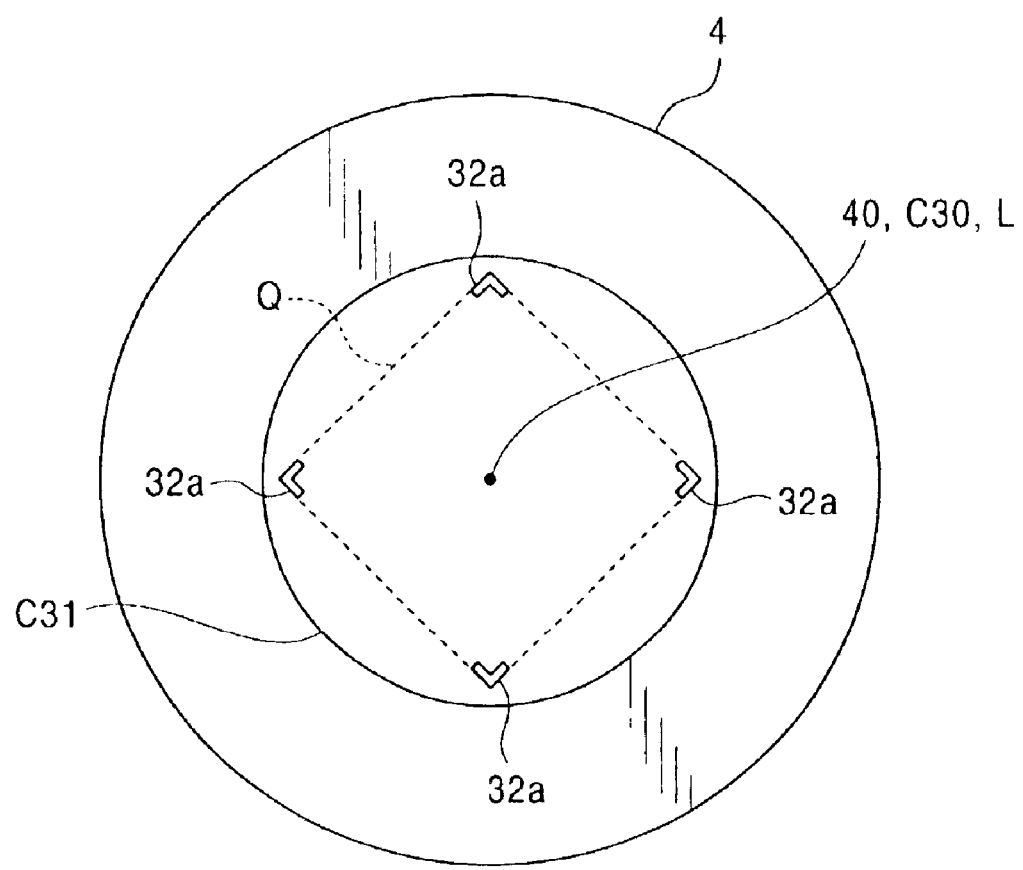
FIG. 10 is a plan view showing an arrangement of the feeder elements and the connector element according to the present invention.
Figure 12:
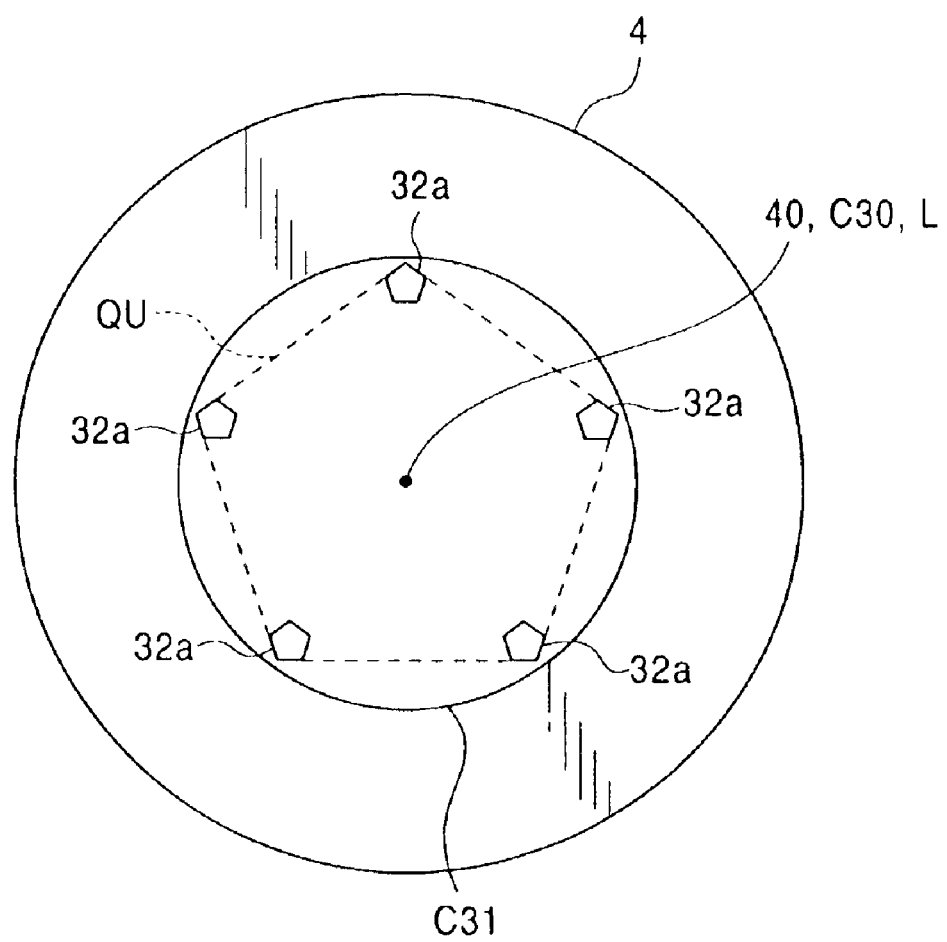
FIG. 12 is a plan view showing an arrangement of the feeder elements and the connector element according to the present invention.

The feeder elements 32$a$ connected to the plasma excitation electrode 4 can have any other arrangement. For example, the feeder elements 32$a$ may be arranged at two points as shown in FIG. 8 symmetrical with respect to the electrode center 40, or at more points, for example, four points at apexes of a square Q as shown in FIGS. 9 and 10, five points at apexes an equilateral pentagon QU as shown in FIG. 12, and six points at apexes of an equilateral hexagon.

Since these feeder elements 32$a$ are arranged parallel to each other, RF currents propagating on the surfaces of the feeder elements 32$a$ form magnetic fields generated in a space between the feeder elements 32$a$. These magnetic fields are mutually negated over the range from the feeder element 31 to the plasma excitation electrode 4 to reduce the inductance of the feeder 3. Thus, the RF power can be further effectively consumed in the plasma generating space.

Thus, the plasma processing apparatus according to the present invention can more effectively consume the RF power than any conventional plasma processing apparatus when the same frequency is applied. This causes an improvement in plasma processing treatment, for example, an increased deposition rate in a layer deposition process such as a plasma enhanced CVD process and an increase in processing rate by a higher-frequency plasma excitation operation.

Since the feeder elements 32$a$ are arranged symmetrically with respect to the center of the plasma excitation electrode 4 so that the mutual distances between the feeder elements 32$a$ are the same, magnetic fields generated in the disk-shaped space $\Delta V2$ perpendicular to the i axis by the feeder elements 32$a$ are mutually negated. Thus, the inductance of the feeder 3 is further reduced. Furthermore, these feeder elements 32$a$, connected to the plasma excitation electrode 4 axisymmetrically with respect to the center of the plasma excitation electrode 4, prevent the drift in the plasma excitation electrode 4; the plasma generating space has a uniform plasma density and a film formed on a substrate has a uniform thickness and uniform quality.

In this embodiment, the feeder elements 32a are connected to the disk connector element C31 that is connected to the feeder element 31. In this configuration, these feeder elements 32a can be arranged at a larger distance than that when no feeder element 31 is provided. This configuration causes further reduced energy density at a partial space for propagation of the RF power and further reduced inductance and RF resistance. The reduced energy density in an infinitely small volume δV at the partial space for propagation of the RF power decreases electric power loss in the feeder from the RF generator 1 to the plasma excitation electrode 4. Thus, the feeder can accept a higher RF current. Also the reduced energy density in the infinitely small volume δV at the partial space decreases the RF resistance and the electric power loss in the feeder. The effective RF power consumption is, therefore, increased in the plasma generating space.

If the plasma excitation electrode 4 is large such that the distance from the feeding point to the plasma excitation electrode 4 is larger than a quarter of the plasma excitation frequency (RF power frequency), a large distance between the feeder elements 32a prevents an uneven distribution of plasma density due to standing waves. Thus, a film formed on a substrate has a more uniform thickness and more uniform quality.

The face of the disk connector element C31 is substantially parallel to the plasma excitation electrode 4, and the feeder elements 32a are connected to the disk connector element C31 axisymmetrically with respect to the center axis line L passing through the center 40 of the plasma excitation electrode 4. Thus, the feeder elements 32a have the same length and the same RF impedance. Since the same current flows in these feeder elements 32a, drift is prevented. In addition, this feeder having such a configuration decreases the energy density and the inductance in a partial space for propagation of the RF power between the disk connector element C31 and the plasma excitation electrode 4 and moderates restriction for the RF current in the feeding portion. In the partial space for propagation of the RF power, the RF resistance decreases due to a decreased energy density in the infinitely small volume δV. As a result, power loss is reduced at the feeder while the RF power is more efficiently consumed in the plasma generating space.

The feeder elements 32a are connected to the disk connector element C31 axisymmetrically with respect to the center C30 of the disk connector element C31, i.e., to the central axis line L extending through the center C30. This axisymmetric configuration prevents drift of the RF current in the feeder elements 32a. As a result, the plasma density, and the thickness and the quality of a film formed on a substrate are uniform. Furthermore, the loss of the RF power to be fed into the plasma generating space is further reduced due to reduced inductance.

The disk connector element C31 is analogous to the plasma excitation electrode 4 in shape. The feeder element 31 and the feeder elements 32a are connected to the respective faces of the disk connector element C31 such that the average density per unit volume of the fed RF power lowers from the output terminal PR side to the plasma excitation electrode 4 side. Thus, the space in which the RF power propagates becomes larger and has a shape analogous to the shape of the plasma excitation electrode 4, preventing the drift of the RF current, an uneven plasma density, unevenness in thickness and the quality of a film deposited on a substrate. Furthermore, the energy density in an infinitely small volume δV decreases in the partial volume in which the RF power propagates of the feeder, resulting in decreased inductance. Thus, the feeder can accept a higher RF current. The reduced energy density in an infinitely small volume δV at the partial space decreases electric power loss in the feeder, and the RF power is more effectively consumed in the plasma generating space.

The feeder elements 32a with the same diameter, the same cross-section, and the same length have the same RF characteristics and the same inductance in an RF current path and thus prevent generation of drift, unevenness in the thickness and quality of a film formed on a substrate caused by an uneven plasma density.

Figure 11:
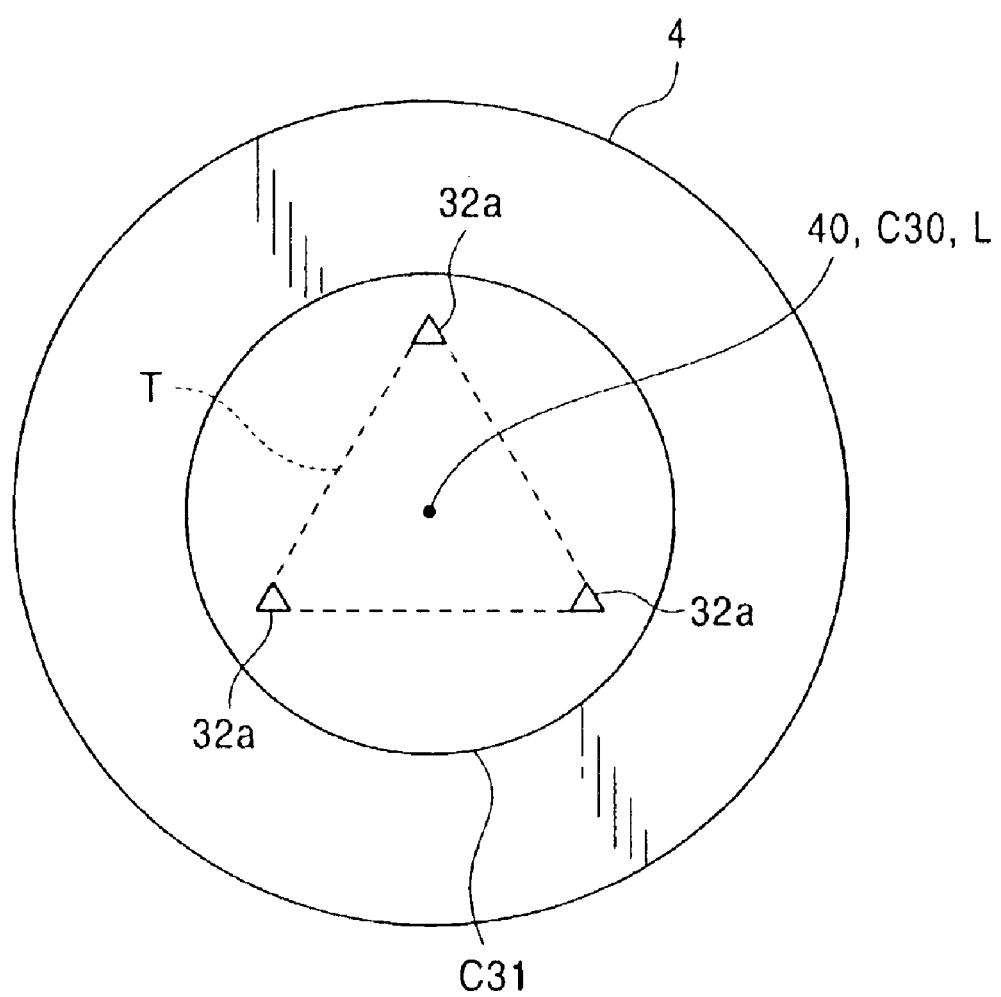
FIG. 11 is a plan view showing an arrangement of the feeder elements and the connector element according to the present invention.
Figure 13:
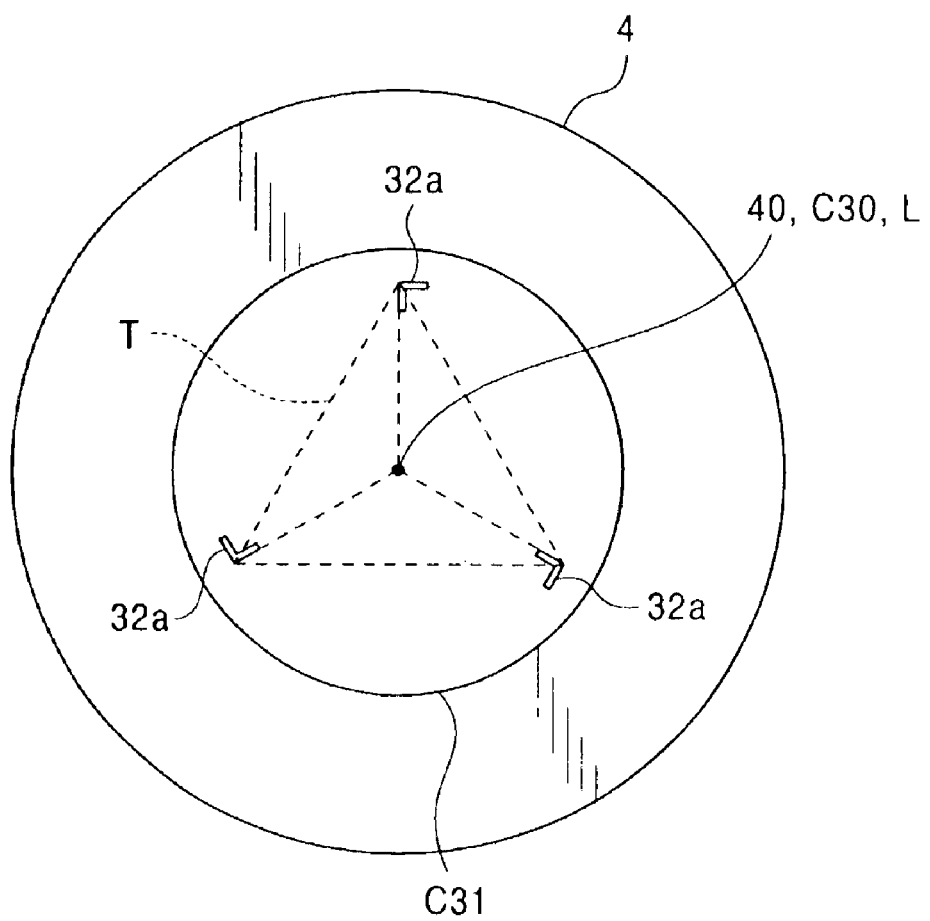
FIG. 13 is a plan view showing an arrangement of the feeder elements and the connector element according to the present invention.
Figure 14:
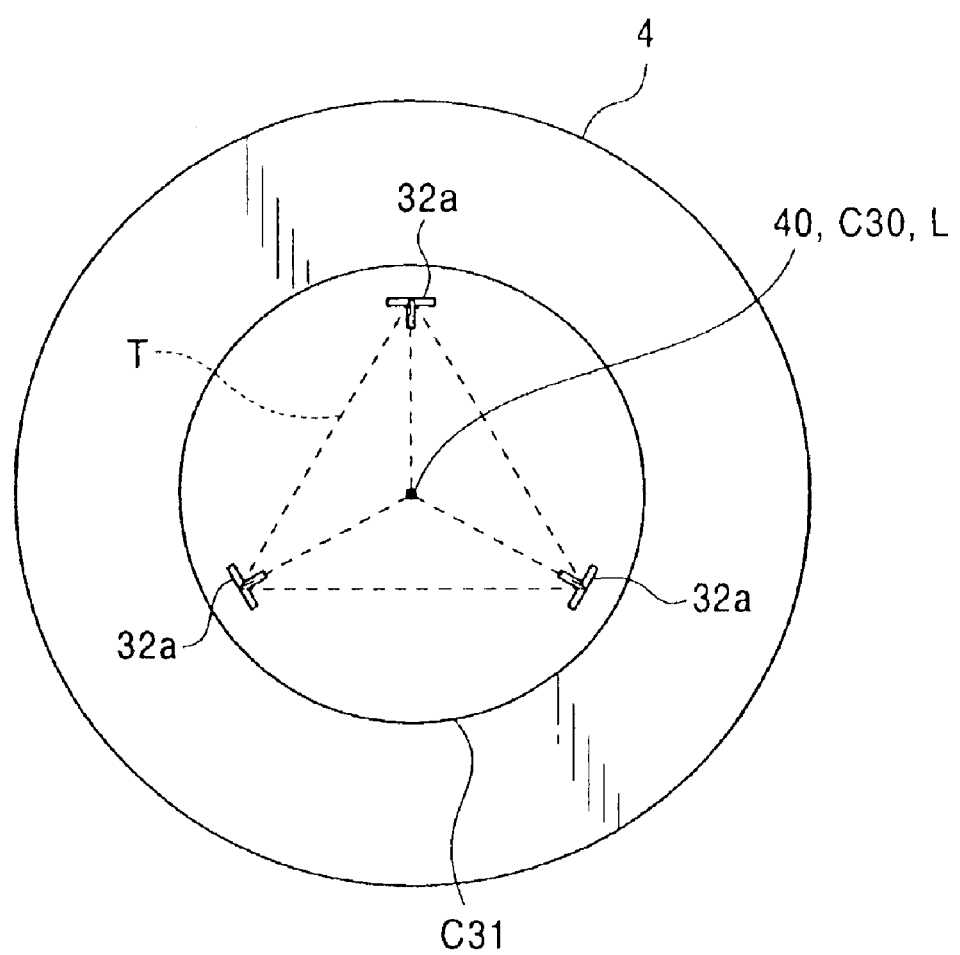
FIG. 14 is a plan view showing an arrangement of the feeder elements and the connector element according to the present invention.
Figure 15A:
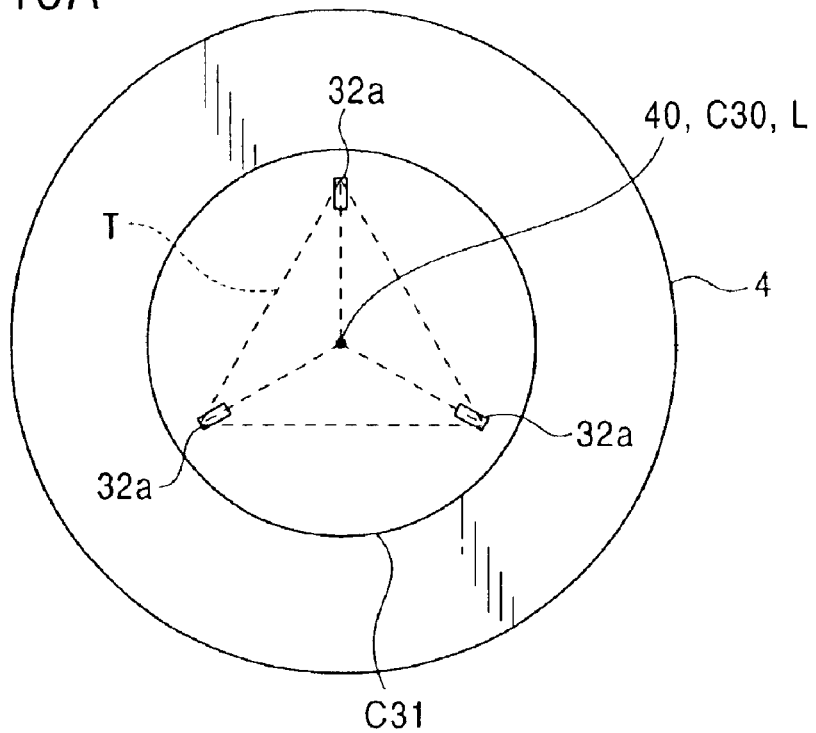
FIGS. 15A and 15B are plan views each showing an arrangement of the feeder elements and the connector element according to the present invention.
Figure 15B:
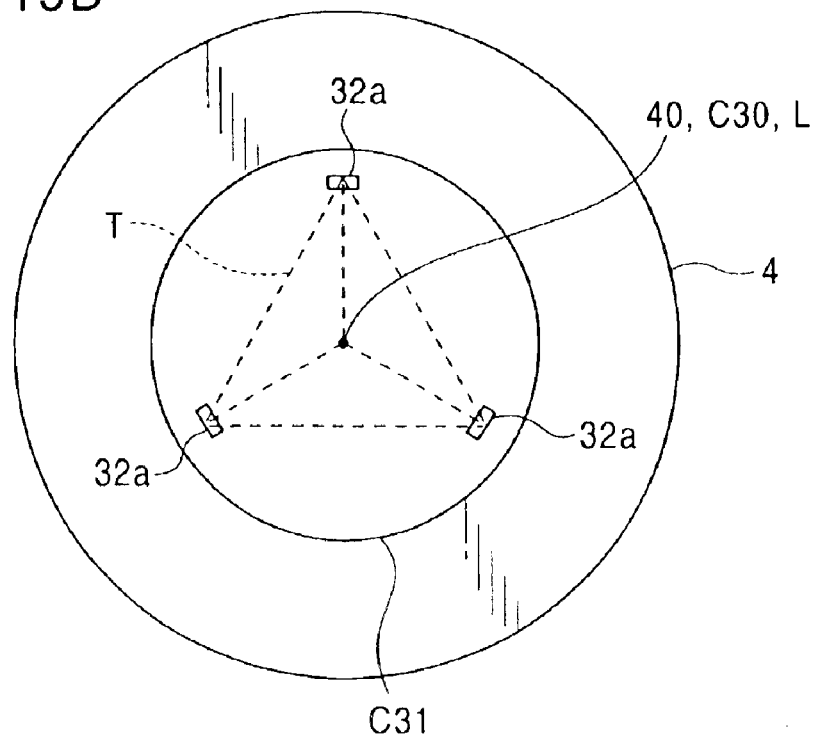

The feeder elements 32a have a circular cross-section in this embodiment; however, the feeder elements 32a may have various cross-sectional shapes, for example, a polygon, i.e., a square as shown in FIG. 9, rectangles as shown in FIGS. 15A and 15B, a triangle as shown in FIG. 11, and a pentangle shown in FIG. 12; L shapes as shown in FIGS. 10 and 13; and a T shape as shown in FIG. 14. In these cases, the feeder elements 32a are arranged so as to have the same relative position and the same connection angle (angle defined by the connection face of the disk connector element C31 or the plasma excitation electrode 4 and the axis line L of the feeder elements 32a), as shown in FIGS. 15A and 15B.

More specifically, as shown in FIG. 13, one end of each feeder element 32a is directed toward the center 40 of the plasma excitation electrode 4 while the other end of the feeder element 32a is directed toward the same circumferential direction. In FIG. 14, the lateral end of each T-shaped feeder element 32a is directed toward the center 40 of the plasma excitation electrode 4.

Preferably, the feeder element 31 and the feeder elements 32a have the same diameter, the same cross-section, and the same length so as to have the same RF characteristics. This causes the same inductance and resistance in these feeder elements. Since the same current flows in these feeder elements 32a, the induction magnetic field can be effectively negated in the feeder elements 32a. Thus, the feeder 3 has reduced inductance. Furthermore, the same current in the feeder elements 32a prevents drift of the RF current to the plasma excitation electrode 4, preventing unevenness in the thickness and quality of a film formed on a substrate caused by an uneven plasma density.

In this embodiment, the feeder element 31 and the feeder elements 32a are rigid to stabilize the RF characteristics such as inductance and RF resistance. Thus, the plasma processing apparatus is stable during plasma processing over a long time period, and the plasma processing can be repeated with highly reproducible results.

Furthermore, the feeder element 31 and the feeder elements 32a are arranged axisymmetrically with respect to the center 40 of the plasma excitation electrode 4 to prevent generation of drift in RF current, as described above; the plasma. generated in the plasma generating space has a uniform distribution and achieves uniform planar treatment of a substrate.

Each of the feeder element 31, the feeder elements 32a, and the disk connector element C31 has the low-resistance surface RL having lower resistance than that of the inner portion (core). Since the RF current flows in the surface of each element due to the skin effect, the low-resistance surface RL more effectively decreases in RF resistance of each element, regardless of the shape factors such as diameter and length of each element. Accordingly, the loss of the RF power to be fed into the plasma generating space is further decreased.

For the feeder element 31, the feeder elements 32a, and the disk connector element C31 composed of aluminum or stainless steel, the low-resistance surface RL may comprises Au, Ag, Cu, or an alloy containing one or more of these metals. The low-resistance surface RL may be provided on the entire surfaces or a partial surface of each of the feeder element 31, the feeder elements 32a, and the disk connector element C31. The partial surface is, for example, an RF current path.

Figure 26:
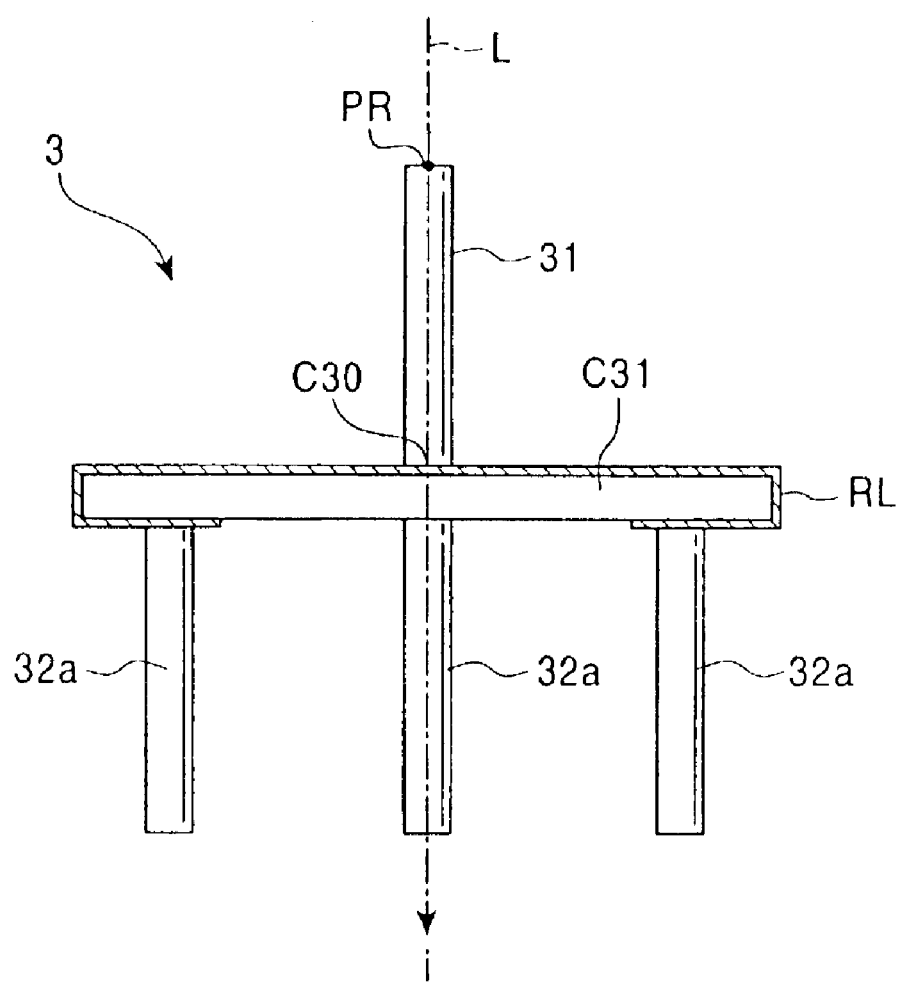
FIG. 26 is a front view showing a structure in which a low-resistance surface is partially provided to a feeder of an embodiment of the present invention.
Figure 27:
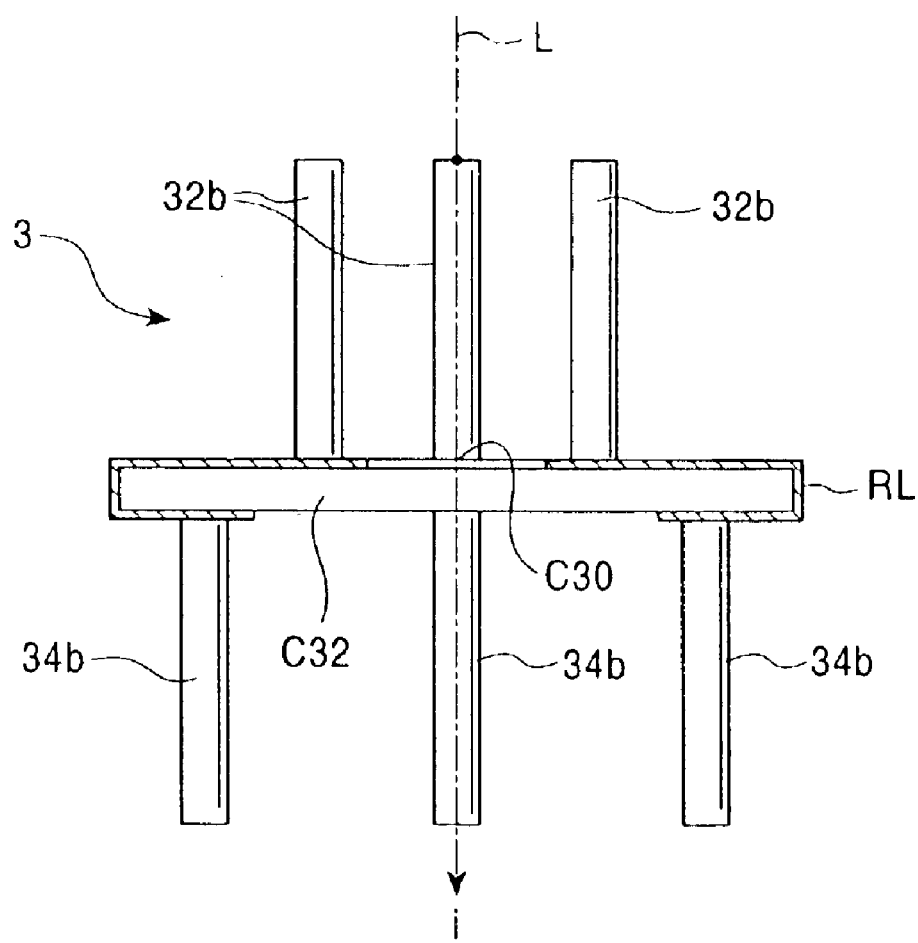
FIG. 27 is a front view showing a structure in which a low-resistance surface is partially provided to a feeder of an embodiment of the present invention.

FIG. 26 shows an embodiment of the configuration of the low-resistance surface RL. The low-resistance surface (not shown in the drawing) is formed on the entire surface of each of the feeder element 31 and the feeder elements 32a. On the other hand, the low-resistance surface RL of the disk connector element C31 is formed over the entire upstream face at the RF power source (at the PR side), the entire side face, and a peripheral portion of the downstream face connecting to the feeder elements 32a. In this configuration, the low-resistance surfaces are provided on only the faces in which an RF current flows by the skin effect.

Figure 19:
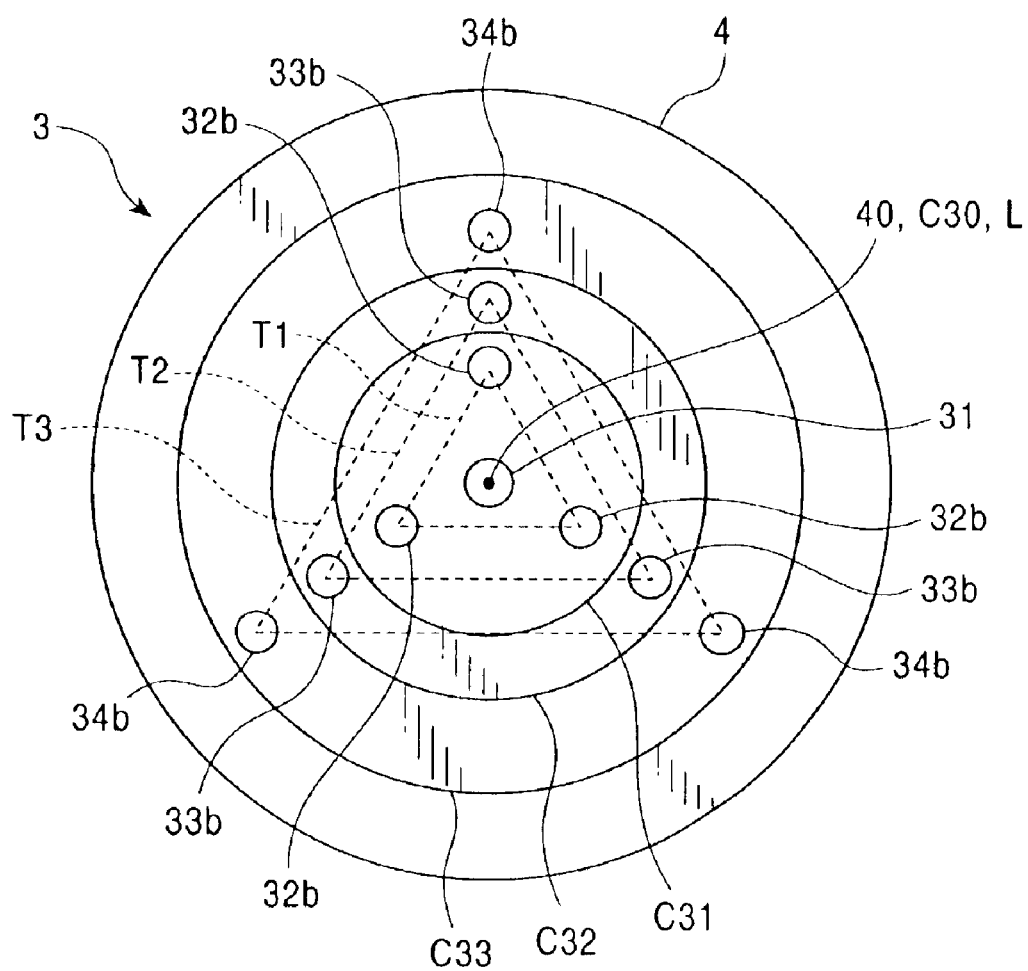
FIG. 19 is a plan view showing the feeder 3 and a plasma excitation electrode 4 shown in FIG. 17.

This configuration is also applicable to the triangle T shown in FIG. 4, triangles T1 to T3 shown in FIG. 19, squares shown in FIGS. 9 and 10, the pentangles QU shown in FIG. 12, and a sexangle. In other words, the interior of each polygon formed by connecting the positions of the feeder elements 32a may be not covered with a low-resistance surface.

When the entire surfaces of the feeder element 31, the feeder elements 32a, and the disk connector element C31 are covered with low-resistance surfaces composed of a corrosion-resistant material, i.e., gold, silver, or an alloy thereof, these resistance surfaces suppress heating, corrosion, and oxidization by the RF current during plasma processing, thus preventing an increase in RF resistance over time. As a result, the plasma processing chamber can be operated with high reproducibility and high stability.

The thickness of the low-resistance surface RL is preferably larger than the skin depth $\delta$, which is determined by the RF frequency f fed from the RF generator 1, as shown in Equation (2); the above feeder elements have low RF resistance at portions in which RF currents flow, and maintain high mechanical strength. Accordingly, the loss of the RF power to be fed into the plasma generating space is further reduced.

In this embodiment, the entire surface of each element is preferably covered with the insulating film to prevent oxidation of the element. Since the feeder element 31, the feeder element 32a, and the disk connector element C31 are stable during repeated plasma processing cycles for long time periods, the plasma processing is successfully performed.

When the entire surfaces of the feeder element 31, the feeder elements 32a, and the disk connector element C31 are provided with low-resistance surfaces composed of a corrosion-resistant material, i.e., gold, silver, or an alloy thereof, the insulating layer is not always necessary.

As described above, the feeder element 31, the feeder elements 32a, and the disk connector element C31 are rigid so that these are barely deformed during operation and maintenance such as disassembly and assembly; these rigid elements have high positioning and alignment reproducibility in assembly. The plasma processing apparatus including these rigid elements shows a slight change in RF characteristics during repeated plasma processing cycles for long time periods; hence, the plasma processing is stable and highly reproducible.

As shown in FIG. 2, the feeder element 31, the feeder element 32a, and the disk connector element C31 are accommodated in the chassis 21 connected to the chamber wall 10 of the first deposition unit 75. The chassis (shielding conductor) 21, which is a component of the return path for the RF current from the RF generator 1, blocks undesired RF radiation toward the exterior of the first deposition unit 75. The feeder 3 has a decreased energy density at an infinitely small volume $\delta V$ in a partial space in which the RF power propagates and thus decreased inductance. As a result, the feeder 3 does not have restriction for the RF current. Furthermore, the decreased energy density causes reduced RF resistance, which contributes to decreased electric power loss. Accordingly, the effective RF power consumption is increased in the plasma generating space.

In the plasma processing apparatus 71 shown in FIG. 1, the RF characteristics such as the impedance and the RF resistance of the feeder 3 can be individually adjusted for the first deposition unit 75, the second deposition unit 76, and the third deposition unit 77 to minimize differences in the RF characteristics and effective power loss in the plasma space between these deposition units 75 to 77.

As a result, the same process recipe can be applied to these deposition units 75 to 77 in order to achieve substantially the same plasma processing results. For example, when these units 75 to 77 are used in film deposition, the deposited films have substantially the same properties, i.e., thickness, breakdown voltage, and etching rate. More specifically, the feeder 3 according to this embodiment increases by about 50% the effective electric power consumption in the plasma space, compared with a cupper feeder with a width of 50 to 100 mm, a thickness of 0.5 mm, and a length of 100 to 300 mm.

The feeder element 31, the feeder elements 32a, and the disk connector element C31 are rigid so that these are not deformed during operation and maintenance such as disassembly and assembly; these rigid elements have high positioning and alignment reproducibility in assembly. The plasma processing apparatus including these rigid elements does not require a conventional two-stage maintenance process that includes a first stage for checking the operation of the plasma processing apparatus 71 by evaluating processed substrate and a second stage for adjusting the feeder 3. Hence, the first to third deposition units 75 to 77 can be readily adjusted for the same process recipe so as to minimize the differences in RF characteristics therebetween. Furthermore, in the conventional maintenance process including actual deposition and evaluation of films on substrates, the plurality of plasma processing units must be individually adjusted and evaluated. In contrast, the first to third plasma processing units 75 to 77 according to this embodiment can be readily adjusted without actual film deposition. Accordingly, the plasma processing apparatus according to the first embodiment offers significantly decreased inspection, process, labor, and material costs.

In this embodiment, the substrate 16 is held on the susceptor electrode 8 while the RF characteristics of the feeder 3 are adjusted for the plasma excitation electrode 4; however, the substrate 16 may be provided at the cathode 4 so that the first deposition unit 75 is used for reactive ion etching (RIE).

Second Embodiment

A plasma processing apparatus and system, and a method for stabilizing the plasma processing apparatus and system according to a second embodiment of the present invention is now described with reference to the drawings.

Figure 16:
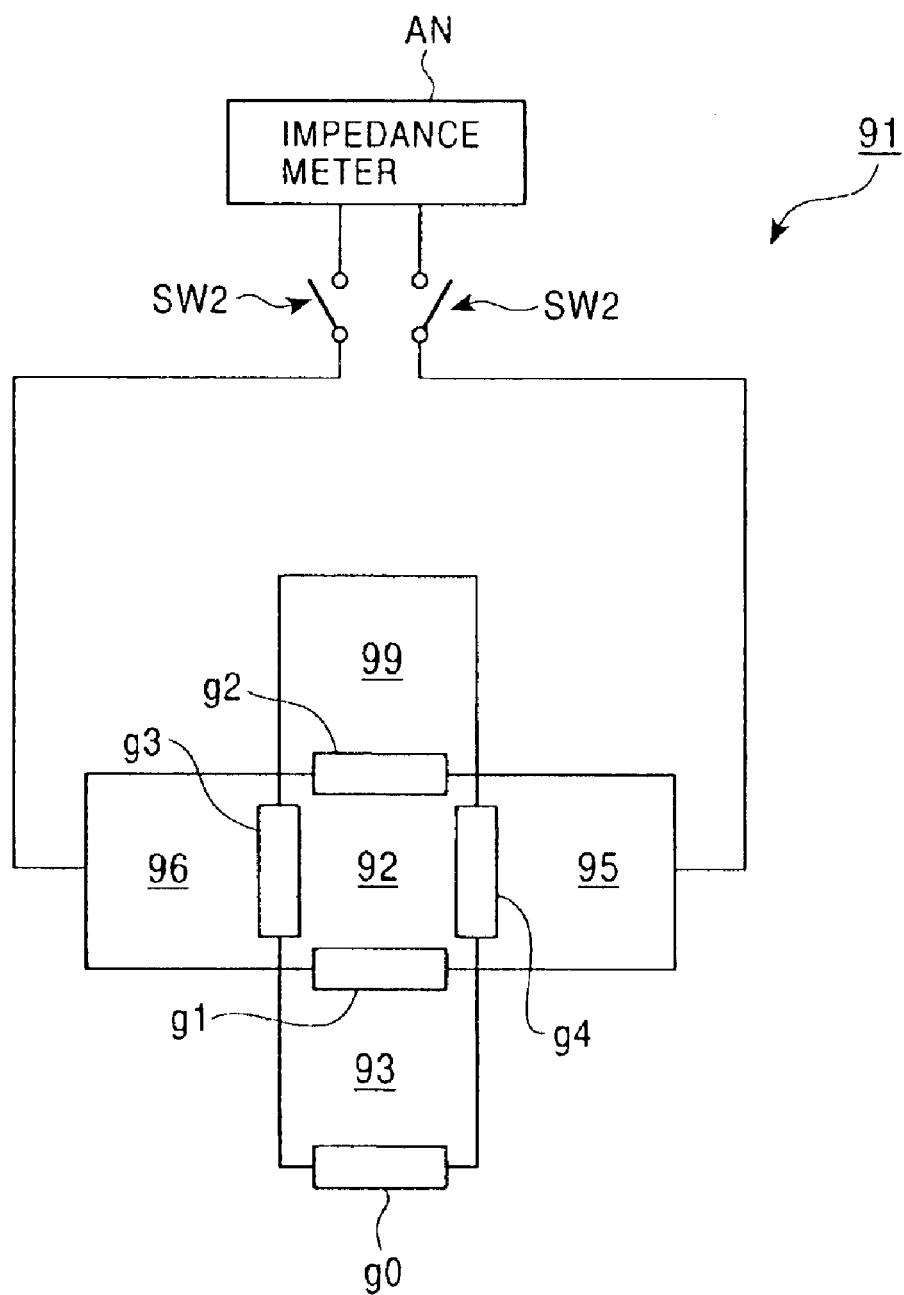
FIG. 16 is a schematic view showing the overall structure of a plasma processing apparatus according to second, sixth, and ninth embodiments.

FIG. 16 is a cross-sectional view showing the overall structure of a plasma processing apparatus 91 according to a second embodiment of the present invention.

As shown in FIG. 16, the plasma processing apparatus 91 of this embodiment comprises a substantially square transfer chamber 92, a load lock chamber 93, a heating unit 99, and plasma processing units 95 and 96. The load lock chamber 93, the heating unit 99, and the plasma processing units 95 and 96 surround the transfer chamber 92, which is disposed at the center of the apparatus. A transfer robot is installed in the transfer chamber 92. Gates g1, g2, g3, and g4 are installed between the transfer chamber 92 and the load lock chamber 93, the heating unit 99, the plasma processing unit 95, and the plasma processing unit 96, respectively. The transfer chamber 92, the heating unit 99, and the plasma processing units 95 and 96 are evacuated to a high vacuum by respective high-vacuum pumps. The load lock chamber 93 is evacuated to a low vacuum by a low-vacuum pump.

The components of the plasma processing apparatus 91 of this embodiment correspond to those of the plasma processing apparatus 71 of the first embodiment shown in FIGS. 1 to 15. The transfer chamber 92 corresponds to the transfer chamber 72 in the first embodiment, the heating unit 99 corresponds to the heating chamber 79 in the first embodiment, and the load lock chamber 93 corresponds to the loading chamber 73 and the unloading chamber 74 in the first embodiment. The description of the components having substantially the same structure as those in the first embodiment is omitted to avoid repetition.

The plasma processing units 95 and 96 correspond to the plasma processing units (plasma chambers) 75 and 76 shown in FIGS. 1 to 15. The plasma processing units 95 and 96 have substantially the same structure and may perform either different types of processes to deposit different types of layers or the same process using the same process recipe.

Figure 18:
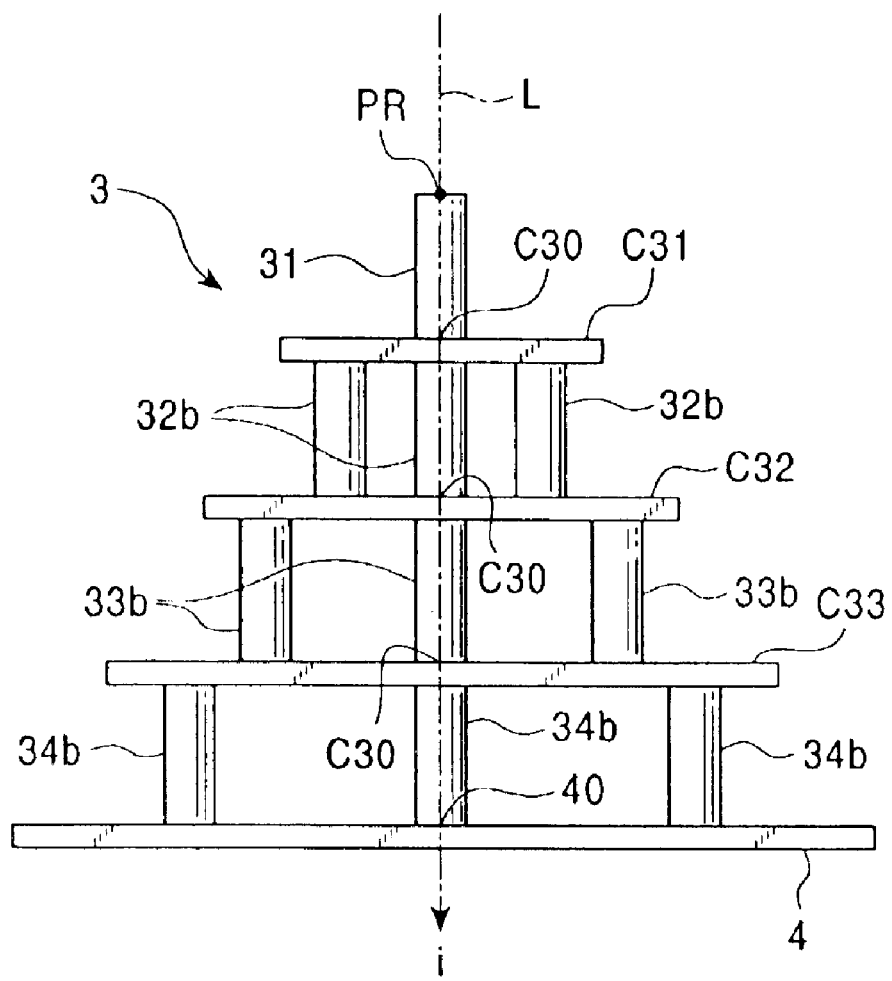
FIG. 18 is a front view showing a feeder 3 of the plasma processing unit shown in FIG. 17.

Each of the plasma processing units 95 and 96 has a feeder 3 comprising RF power feeder elements 31 and 32b to 34b, as shown in FIG. 18. The RF power feeder elements 31 and 32b to 34b are connected to one another via a plurality of connector elements C31 to C33. This structure allows the average density per unit volume of the RF power to decrease as the RF power flows from an output terminal PR to a plasma excitation electrode 4.

The details of the structure are described below using the plasma processing unit 95 as an example.

Figure 17:
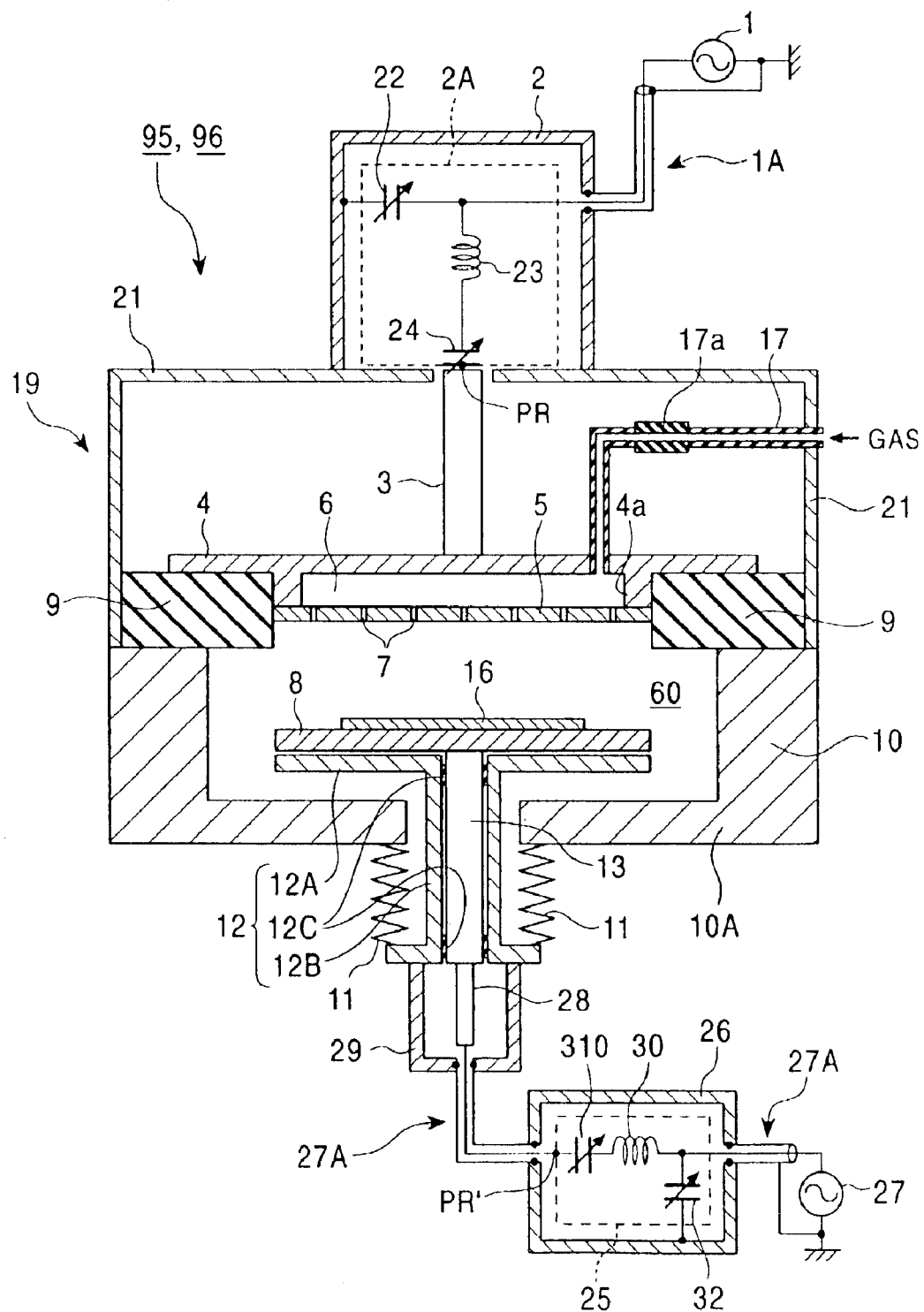
FIG. 17 is a cross-sectional view showing the overall structure of a plasma processing unit according to the second, sixth, and ninth embodiments of the present invention.

FIG. 17 is a cross-sectional view showing the overall structure of the plasma processing unit 95 of this embodiment. FIG. 18 is a front view of the feeder 3 of the plasma processing unit 95 shown in FIG. 17. FIG. 19 is a plan view of the feeder 3 and the plasma excitation electrode 4.

The plasma processing unit 95 of this embodiment is of a dual-frequency excitation type. The plasma processing unit 95 differs from the plasma processing unit 75 of the first embodiment shown in FIGS. 1 to 15 in that power is also supplied to the susceptor-electrode 8. The structure of the feeder 3 is also different from that of the first embodiment. Other corresponding components are represented by the same reference characters and description thereof is omitted to avoid repetition.

Referring to FIG. 18, the plasma processing unit 95 has the feeder 3 comprising the RF power feeder elements 31 and 32b to 34b. The RF power feeder elements 31 and 32b to 34b are connected to one another via a plurality of connector elements C31 to C33. This structure allows the average density per unit volume of the RF power to decrease as the RF power flows from the output terminal PR to the plasma excitation electrode 4.

Referring to FIG. 17, the plasma processing unit 95 of this embodiment comprises a susceptor shield 12 disposed under a susceptor electrode 8. The gap between the susceptor electrode 8 and the susceptor shield 12 is vacuum-sealed and electrically isolated by insulation means 12C, composed of an insulating material, provided at the periphery of a shaft 13. The susceptor electrode 8 and the susceptor shield 12 can be moved vertically by the bellows 11 which controls the distance between plasma excitation electrodes 4 and 8. The susceptor electrode 8 is connected to a second RF generator 27 via a feed plate 28 connected to the bottom end of the shaft 13 and a matching circuit 25 housed in a susceptor-electrode-side matching box 26 composed of a conductor.

The feed plate 28 is, for example, a silver-plated copper plate having a width of 50 to 100 mm, a thickness of 0.5 mm, and a length of 100 to 300 mm. The feed plate 28 is detachably attached to the output terminal of a tuning capacitor 310 of the matching circuit 25 described below and to the bottom end of the shaft 13 with connecting means such as screws.

The feed plate 28 is covered with a chassis 29 connected to the bottom end of a supporting tube 12B of the susceptor shield 12. The chassis 29 is connected to a shielding line of a supply line 27A, which is a coaxial cable. The chassis 29 and the matching box 26 are grounded through the shielding line of the supply line 27A. As a result, the susceptor shield 12, the chassis 29, and the matching box 26 have the same DC potential.

The matching circuit 25 performs impedance matching between the second RF generator 27 and the susceptor electrode 8. As shown in FIG. 17, a plurality of passive elements, i.e., a tuning coil 30 and the tuning capacitor 310 are connected in series between the second RF generator 27 and the feed plate 28, and a load capacitor 32 is connected to the second RF generator 27 and the feed plate 28 in parallel. One end of the load capacitor 32 is connected to the matching box 26. The matching circuit 25 has substantially the same structure as that of the matching circuit 2A. Since the matching box 26 is grounded through the shielding line of the supply line 27A, the above one end of the load capacitor 32 is also grounded. Various other arrangements such as connecting another tuning coil in series to the tuning coil 30 and connecting another load capacitor in parallel to the load capacitor 32 are possible.

In operating the plasma processing unit 95, a workpiece, i.e., a substrate 16, is placed on the susceptor electrode 8, RF power is supplied to both the plasma excitation electrode 4 and the susceptor electrode 8 from the RF generator 1 and the second RF generator 27, respectively, while producing a plasma by feeding a reaction gas into a plasma processing chamber 60 from a gas feeding tube 17 through a shower plate 5 so as to perform a plasma process such as layer deposition or the like on the substrate 16, During the operation, RF power having a frequency of 13.56 MHz or more, for example, 13.56 MHz, 27.12 MHz, or 40.68 MHz, is supplied from the RF generator 1. The frequency of the power supplied from the second RF generator 27 may be the same as or different from that supplied by the RF generator 1. For example, power having a frequency of 1.6 MHz may be supplied from the second RF generator 27.

Referring to FIG. 18, the feeder 3 comprises the RF power feeder elements 31 and 32b to 34b, which are identical copper rods having a diameter of 2 to 10 mm in a cross-section and a length of 100 to 300 mm. The RF power feeder elements 31 and 32b to 34b are connected to one another by the connector elements C31 to C33. The RF power feeder elements 31 and 32b to 34b and the connector elements C31 to C33 are rigid.

The connector elements C31 to C33 are circular copper plates and are similar to but smaller than the plasma excitation electrode 4. The connector elements C31 to C33 have the same thickness. Each of the connector elements C31 to C33 opposes the plasma excitation electrode 4 and is disposed parallel to the plasma excitation electrode 4. The connector elements C31 to C33 are arranged in plural stages between the output terminal PR of the matching circuit 2A and the plasma excitation electrode 4 in that order from the output terminal PR. The connector element C31 closest to the output terminal PR has the smallest diameter, and the connector element C33 closest to the plasma excitation electrode 4 has the largest diameter.

The phrase "the connector elements C31 to C33 are similar to the plasma excitation electrode 4" means that the shape of each of the connector elements C31 to C33 when viewed in the direction of the path of an electrical current, i.e., the i axis in FIG. 18, is similar to that of the plasma excitation electrode 4.

One end of the feeder element 31 is detachably connected to the output terminal of a tuning capacitor 24 which functions as the output terminal PR of the matching circuit 2A, using connecting means such as screws. The other end of the feeder element 31 is connected to the upstream face of the connector element C31, i.e., the face of the connector element C31 closer to the output terminal PR of the matching circuit 2A, to be substantially orthogonal thereto.

Hereinafter, the term "upstream face" means the face of each feeder element at the upstream-side of the current path flowing from the output terminal PR of the matching circuit 2A to the plasma excitation electrode 4. The term "downstream face" means the face of each feeder element at the downstream-side of the current path flowing from the output terminal PR of the matching circuit 2A to the plasma excitation electrode 4. The upstream face of the feeder element is closer to the output terminal PR than is the downstream face, and the downstream face of the element is closer to the plasma excitation electrode 4 than the upstream face.

One end of each of the plurality of feeder elements 32b is attached to the downstream face of the connector element C31. The other end of each feeder element 32b is connected to the upstream face of the connector element C32 to be substantially orthogonal thereto. One end of each of the RF power feeder elements 33b is connected to the downstream face of the connector element C32 to be substantially orthogonal thereto. The other end of each RF power feeder element 33b is connected to the upstream face of the connector element C33 to be substantially orthogonal thereto. One end of each of the plural RF power feeder elements 34b is connected to the downstream face of the connector element C33 to be substantially orthogonal thereto. The other end of each RF power feeder element 34b is connected to the surface of the plasma excitation electrode 4 to be substantially orthogonal thereto. The RF power feeder elements 31 and 32b to 34b are parallel to the i axis extending in the direction of the path of an electrical current from the output terminal PR to the plasma excitation electrode 4, which is the direction orthogonal to the plasma excitation electrode 4.

In the plasma processing unit 95 of this embodiment, the RF power feeder elements 31 and 32b to 34b are arranged in a structure that allows the average density per unit volume of the RF power to decrease as the RF power flows from the output terminal PR to the plasma excitation electrode 4. In other words, the space of the RF power transmission increases as the RF power flows from one end of the feeder element 31 to the ends of the RF power feeder elements 34b connected to the plasma excitation electrode 4. This substantially decreases the inductance and the RF resistance.

In particular, at the first stage of the feeder 3, the transmission space of the RF power is tripled since only one feeder element 31 is provided on the upstream face of the connector element C31 whereas three RF power feeder elements 32b are provided on the downstream face of the connector element C31.

At the second stage of the feeder 3, the gap between the RF power feeder elements 33b at the downstream face of the connector element C32 is set larger than the gap between the RF power feeder elements 32b at the upstream face of the connector element C32. This further increases the transmission space of the RF power.

At the third stage of the feeder 3, the gap between the RF power feeder elements 34b on the downstream face of the connector element 33 is set larger than the gap between the RF power feeder elements 32b on the upstream face of the connector element C32. This further increases the transmission space of the RF power.

Here, the feeder element 31 is connected to a center C30 of the upstream face of the connector element C31. The feeder element 31 is parallel to an axial line L perpendicular to the surface of the plasma excitation electrode 4, the axial line L passing through a center 40 of the plasma excitation electrode 4. In other words, the feeder element 31 is coincident with the axial line L.

The three RF power feeder elements 32b are parallel to each other and are connected to the downstream face of the connector element C31 and to the upstream face of the connector element C32 in an axisymmetrical manner with respect to the center 40 of the circular plasma excitation electrode 4. The term "in an axisymmetrical manner" means being spatially symmetrical with respect to the axial line L perpendicular to the surface of the plasma excitation electrode 4, the axial line L passing through the center 40. In other words, as shown in FIG. 19, each of the RF power feeder elements 32b is located at an apex of an equilateral triangle T1, and the electrode center 40, a center C30 of the connector element C31, and a center C30 of the connector element C32 are arranged to coincide with the center of the equilateral triangle T1.

The three RF power feeder elements 33b are parallel to each other and to the axial line L, and are connected to the downstream face of the connector element C32 and to the upstream face of the connector element C33 in an axisymmetrical manner with respect to the center 40 of the circular plasma excitation electrode 4. The term "in an axisymmetrical manner" means being spatially symmetrical with respect to the axial line L perpendicular to the surface of the plasma excitation electrode 4, the axial line L passing through the center 40. In other words, as shown in FIG. 19, each of the RF power feeder elements 33b is located at an apex of an equilateral triangle T2, and the electrode center 40, a center C30 of the connector element C32, and a center C30 of the connector element C33 are arranged to coincide with the center of the equilateral triangle T2.

The three RF power feeder elements 34b are parallel to each other and to the axial line L, and are connected to the downstream face of the connector element C33 and to the plasma excitation electrode 4 in an axisymmetrical manner with respect to the center 40 of the circular plasma excitation electrode 4. In other words, as shown in FIG. 19, each of the RF power feeder elements 34b is located at an apex of an equilateral triangle T3, and the electrode center 40 and a center C30 of the connector element C33 are arranged to coincide with the center of the equilateral triangle T3.

As described above, in the feeder 3, the arrangement of the feeder elements 32b to 34b on the upstream face of each of the connector elements C31 to C33 is similar to that on the downstream face. In other words, the equilateral triangles T1 to T3, indicating the connection points of the feeder elements 32b to 34b, on the connector elements C31 to C33, respectively, are similar and face in the same direction, as shown in FIG. 19.

The feeder elements 32b connected to the downstream face of the connector element C31 are set to have the same length. The feeder elements 33b connected to the downstream face of the connector element C32 are set to have the same length. The feeder elements 34b connected to the downstream face of the connector element C33 are set to have the same length. In this manner, the downstream faces of the connector elements C31 to C33 can be arranged parallel to the surface of the plasma excitation electrode 4.

As described above, the feeder elements 31 and 32b to 34b and the connector elements C31 to C33 are rigid. Thus, deformation leading to changes in RF characteristics during operation can be prevented, and their shapes can remain the same before and after maintenance involving disassembly and reassembly, thereby improving the reproducibility of the installation positions during assembly. In particular, the feeder elements 31 and 32b to 34b comprising copper rods having the above-described dimensions are connected to the connector elements C31 to C33, which are copper disks having the above-described dimensions, so as to constitute the feeder 3 connected to the output terminal PR and the plasma excitation electrode 4. The feeder elements 31 and 32b to 34b and the connector elements C31 to C33 may be connected with screws to improve the reproducibility of the accurate connection state or may be welded to prevent deformation.

As in the RF power feeder elements 31 and 32a and the connector element C31 in the first embodiment shown in FIG. 5, each of the RF power feeder elements 31 and 32b to 34b and the connector elements C31 to C33 has a low-resistance surface RL composed of a low-resistance material such as Au and Ag and a core composed of Cu. The thickness of the low-resistance surface is adjusted to be larger than the skin depth at the RF power frequency supplied from the RF generator 1.

As in the RF power feeder elements 31 and 32a and the connector element C31 in the first embodiment, the RF power feeder elements 31 and 32b to 34b and the connector elements C31 to C33 are coated with insulating films.

Referring now to FIG. 16, in operating the plasma processing apparatus 91 comprising the plasma processing units 95 and 96 having the above-described structure, a gate g0 is opened to transfer the substrate 16 into the load lock chamber 93. The load lock chamber 93 is then closed and evacuated using a low-vacuum pump. The gates g1 and g2 are opened, and the substrate 16 in the load lock chamber 93 is transferred into the heating unit 99 by a transfer arm of the transfer robot in the transfer chamber 92. The gates g1 and g2 are closed and the transfer chamber 92 and the heating unit 99 are evacuated using a high-vacuum pump. The substrate 16 is heated, the gates g2 and g4 are opened, and the heated substrate 16 is transferred into the plasma processing unit 95 by the transfer arm of the transfer robot in the transfer chamber 92. The heated substrate is subjected to a reaction process in the plasma processing unit 95. Upon completion of the plasma process, the gates g4 and g3 are opened and the processed substrate 16 is transferred into the plasma processing unit 96. Upon completion of the plasma process in the plasma processing unit 96, the gated g3 and g1 are opened and the processed substrate 16 is transferred to the load lock chamber 93 by the transfer arm of the transfer robot in the transfer chamber 92.

The operation of each sections is automatically controlled by a control unit except for the process conditions such as deposition conditions of the respective processing units and the processing sequence, which are set by an operator. In using the plasma processing apparatus 91 of this embodiment, the operator need only place an unprocessed substrate 16 in a loading cassette of the load lock chamber 93 and operating a start switch. After operating the start switch, the unprocessed substrate 16 is transferred from the loading cassette to each of the processing units by the substrate transfer robot, and upon completion of a series of processes performed automatically in each of the processing units, the processed substrate 16 is placed in an unloading cassette (loading cassette) by the substrate transfer robot.

As in the first embodiment, in the plasma processing units 95 and 96, the substrate 16 is placed on the susceptor electrode 8, RF power is supplied to both the plasma excitation electrode 4 and the susceptor electrode 8 from the RF generator 1 and the second RF generator 27, respectively, while feeding a reactive gas into the plasma processing chamber 60 through the shower plate 5 from the gas feeding tube 17 to generate a plasma. An amorphous silicon layer, a silicon oxide layer, a silicon nitride layer, or the like is deposited on the substrate 16 using the plasma.

The plasma processing apparatus 91 of this embodiment has the same advantages as those of the first embodiment. However, unlike the first embodiment, each of the plasma processing units 95 and 96 has the feeder 3 comprising the connector elements C31 to C33 arranged in plural stages, and the diameter of the connector element C33 is larger than the diameter of the connector element C31 of the first embodiment. This structure allows the average density per unit volume of RF power supplied from the RF generator 1 to further decrease as the power flows from the output terminal PR to the plasma excitation electrode 4. In other words, at disk-shaped spaces disposed perpendicular to the i axis, the energy density of RF power in an infinitesimal volume element close to the RF feeder elements 32b is lower than that in an infinitesimal volume element close to the feeder element 31. Moreover, at disk-shaped spaces disposed perpendicular to the i axis, the energy density of RF power in an infinitesimal volume element close to the RF feeder elements 33b is lower than that in an infinitesimal volume element close to the RF feeder elements 32b. Furthermore, at disk-shaped spaces disposed perpendicular to the i axis, the energy density of RF power in an infinitesimal volume element close to the RF feeder elements 34b is lower than that in an infinitesimal volume element close to the RF feeder elements 33b.

With this structure, the transmission space of the RF current in the feeder 3 can be further increased, and the inductance and the RF resistance can be substantially decreased. Moreover, the restriction on the RF current flowing to the plasma excitation electrode 4 can be reduced, and the power loss in the power supply section can be decreased.

As a result, the effective RF power consumed in the plasma generation space can be further increased.

When power of the same frequency is supplied, the effective power consumed in the plasma space is larger in the plasma processing apparatus of this embodiment than in the first embodiment where only single stage of the connector element C31 is provided. If layer deposition is performed by plasma-assisted CVD or the like, the deposition rate is higher in the plasma processing apparatus of this embodiment than in the first embodiment, i.e., thereby improving the plasma processing results.

In this embodiment, the RF power feeder elements 34b positioned at the apexes of the equilateral triangle T3 are connected to the plasma excitation electrode 4. Since the equilateral triangle T3 is larger than the equilateral triangle T of the connector element C31 of the first embodiment, the gap between the RF power feeder elements 34b is larger than the gap between the RF power feeder elements 32a of the single-stage connector element C31, and RF power can be supplied from the supplying point to the plasma excitation electrode 4 having a larger diameter, with larger gaps between the RF power feeder elements 34b. As a result, the distribution of the plasma density resulting from the standing wave can be prevented, thereby improving uniformity in the plasma processing. Thus, plasma processing can be performed onto a substrate 16 having a large diameter without impairing uniformity in the layer thickness and in layer characteristics in the substrate surface direction.

In this embodiment, the plural RF power feeder elements 32b to 34b connected to upstream and downstream faces of the connector elements C31 to C33 have the same diameter, the same cross section, and the same length to simplify the adjustment of the RF characteristics of each stage when the RF power feeder elements 31 and 32b to 34b are connected to the connector elements C31 to C33.

Figure 20:
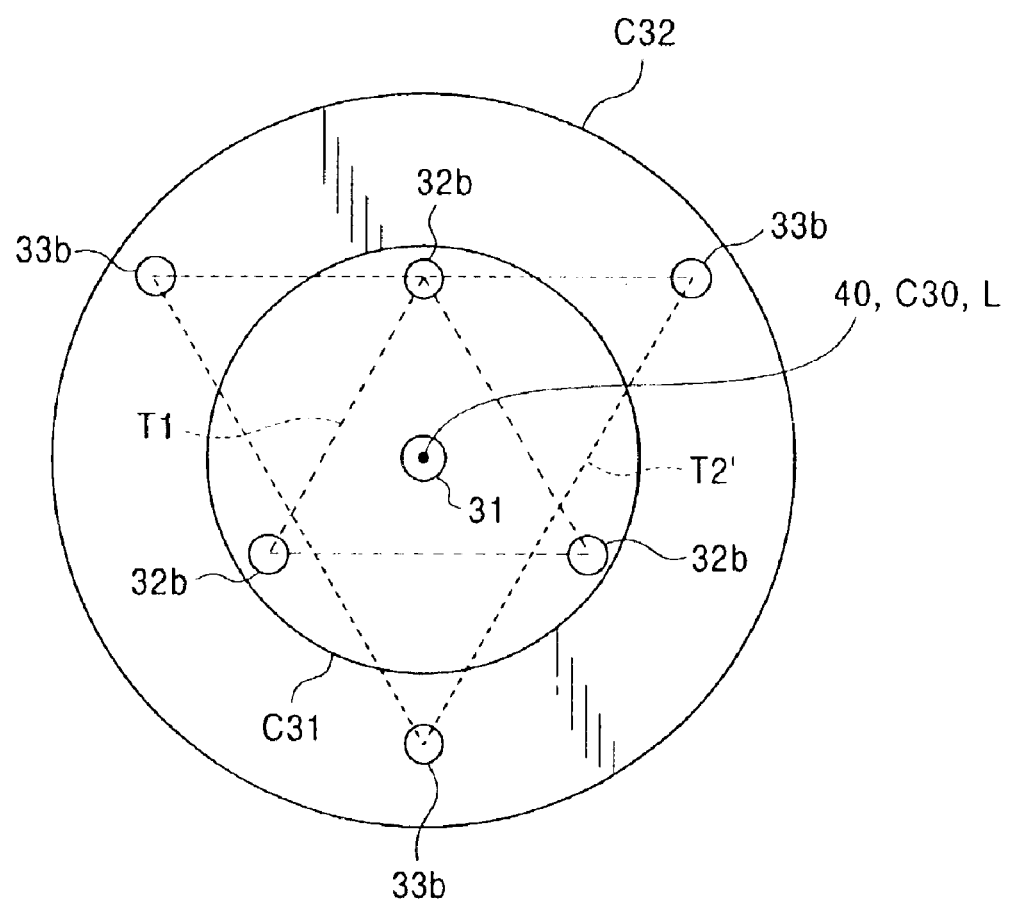
FIG. 20 is a plan view showing an arrangement of the feeder elements and the connector elements according to the present invention.

Although the equilateral triangles T1 to T3 are aligned in the same direction, as shown in FIG. 19, when the RF power feeder elements 32b to 32b are connected to the connector elements C31 to C33 in this embodiment, the equilateral triangles T1 to T3 may be arranged to have their centers at the electrode center 40 but at different angles, as shown in FIG. 20.

Figure 21:
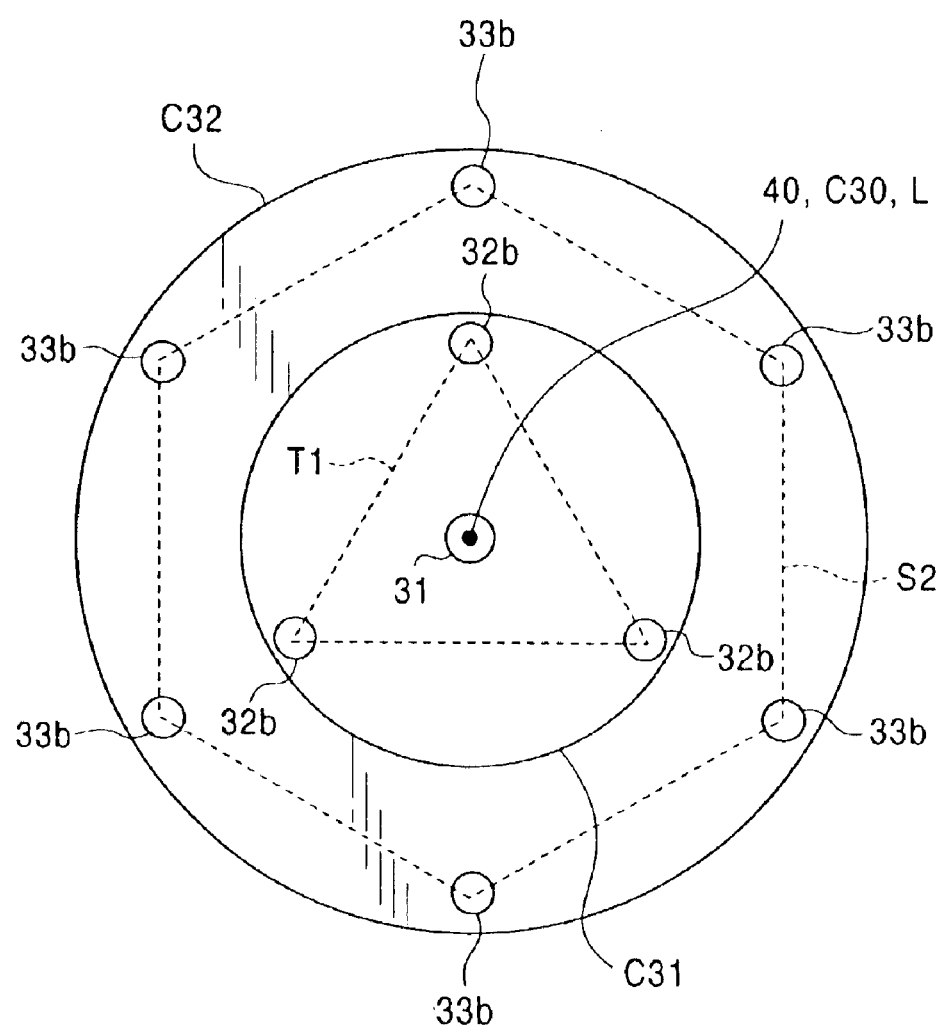
FIG. 21 is a plan view showing an arrangement of the feeder elements and the connector elements according to the present invention.

The connection state of the RF feeder elements 32b connected to the upstream face of the connector element C32', i.e., the second stage, may be different from that of the RF feeder elements 33b connected to the upstream face of the connector element C33. For example, as shown in FIG. 21, The RF feeder elements 32b may be positioned at the apexes of the equilateral triangle T1, and the feeder elements 33b may be placed on the apexes of a regular hexagon S2.

The plasma processing apparatus of this embodiment may be of an inductive coupled (ICP) type, a radial line slot antenna (RLSA) type, or the like instead of having two parallel electrodes 4 and 8. The plasma processing apparatus of this embodiment may also be applied to reactive ion etching (RIE).

The plasma processing apparatus of this embodiment may perform a sputtering process by installing target materials instead of the electrodes 4 and 8.

Third Embodiment

Figure 22:
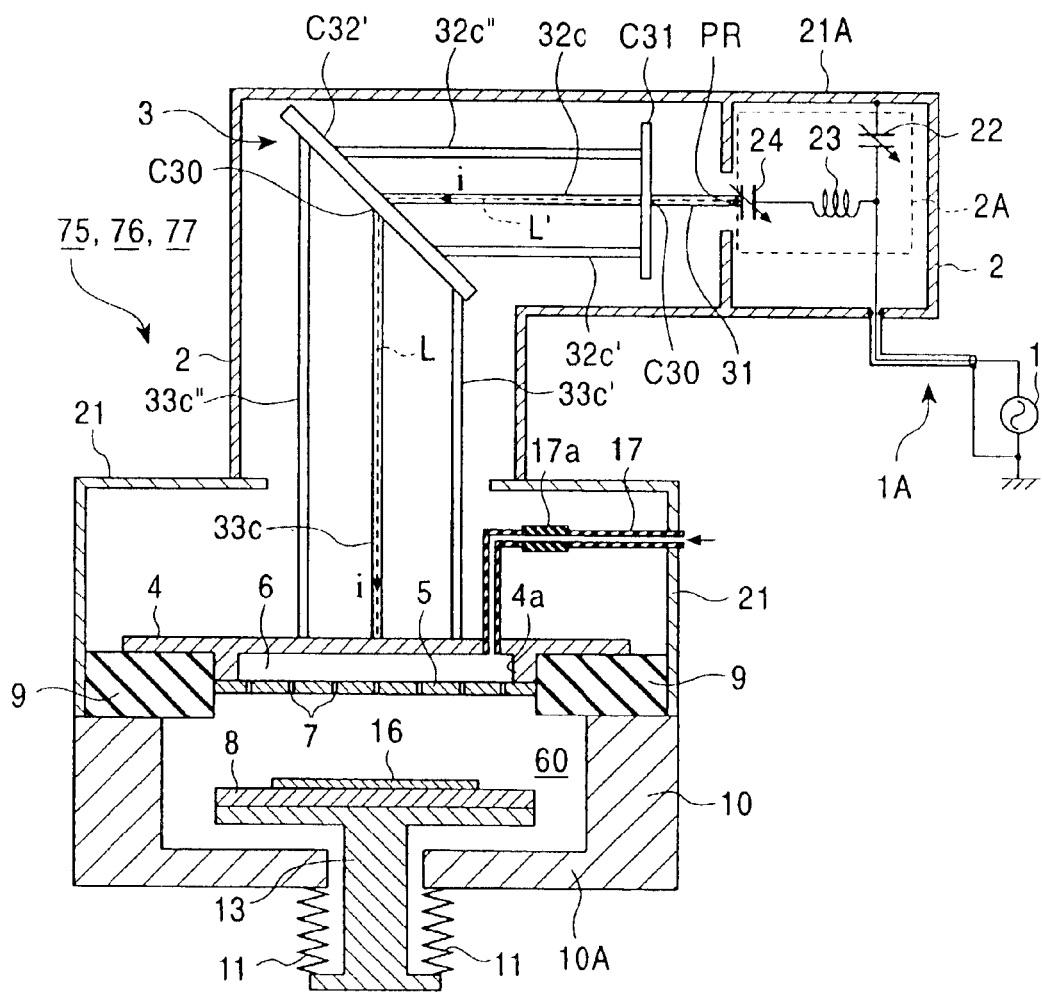
FIG. 22 is a cross-sectional view showing the overall structure of a plasma processing unit of a plasma processing apparatus according to a third embodiment of the present invention.

A plasma processing apparatus and system, and a method for stabilizing the plasma processing apparatus and system according to a third embodiment of the present invention will now be described with reference to the drawings. FIG. 22 is a schematic diagram showing the overall structure of a plasma processing unit of this embodiment.

The plasma processing apparatus of this embodiment has substantially the same structure as that of the first embodiment shown in FIGS. 1 to 15. The plasma processing apparatus of this embodiment is different from the first embodiment in the arrangement of the chamber and the matching box and in the feeder 3. Other components are the same as those of the first embodiment. The same components are represented by the same reference characters and the description thereof is omitted to avoid repetition.

The third embodiment is described below using a plasma processing unit 75 as an example.

The plasma processing unit 75 comprises a plasma processing chamber 60, a plasma excitation electrode 4 disposed above the plasma processing chamber 60, an RF generator 1 connected to the plasma excitation electrode 4, and a shower plate 5. The plasma excitation electrode 4 is covered with a chassis 21 connected to a chamber wall 10. A matching circuit 2A and a matching box 2 covering the matching circuit 2A are separated from the top of the plasma processing chamber 60.

The plasma excitation electrode 4 is connected to an output terminal PR of the matching circuit 2A via a feeder 3. The feeder 3 is arranged so that the average RF power density per unit volume decreases as the RF power supplied from the RF generator 1 flows from the output terminal PR to the plasma excitation electrode 4. In this embodiment, the feeder 3 is housed in a housing (shielding conductor) 21A composed of a conductor.

The housing (shielding conductor) 21A is connected to the chassis 21 and the matching box 2 which are also made of a shielding conductor. The matching box 2 is connected to shielding line (outer conductor) of a supply line 1A, which is a coaxial cable. Since the shielding line is DC-grounded, a susceptor electrode 8, a shaft 13, a bellows 11, a chamber bottom 10A, the chamber wall 10, the chassis 21, the housing (shielding conductor) 21A. and the matching box 2 are set to a ground potential. As a result, one end of a load capacitor 22 is also DC-grounded.

The chamber wall 10, the housing (shielding conductor) 21A, the chassis 21, the matching box 2, and the shielding line of the supply line 1A constitute a return path through which an RF current i supplied from the RF generator 1 returns to the RF generator 1.

The housing (shielding conductor) 21A covers the feeder 3 to shield parasitic emissions from the feeder 3. The housing (shielding conductor) 21A also covers the openings of the matching box 2 and the chassis 21, the openings being provided for connection.

The feeder 3 of the plasma processing unit 75 of this embodiment comprises feeder elements 31, 32c, 32c', 32c", 33c, 33c', and 33c" connected to one another through connector elements C31 and C32'. This structure allows the average RF power density per unit volume to decrease as the RF power supplied from the RF generator 1 flows from the output terminal PR to the plasma excitation electrode 4.

In particular, as shown in FIG. 22, the feeder elements 31, 32c, 32c', and 32c" constituting the feeder 3 are copper rods that have the same cross-sectional dimensions and a diameter of 2 to 10 mm but with different lengths, ranging from 100 to 300 mm. The feeder elements 31, 32c, 32c', and 32c" are connected to the connector element C31. The feeder elements 32c, 32c', 32c", 33c, 33c', and 33c" are copper rods having the same cross-sectional dimensions and a diameter of 2 to 10 mm but with different lengths, ranging from 100 to 300 mm, and are connected to the connector element C32'. The feeder elements 31, 32c, 32c', 32c", 33c, 33c', and 33c", and the connector elements C31 and C32' are rigid.

The connector element C31 is a circular copper disk, which is smaller than and similar to the plasma excitation electrode 4. The connector element C32' is a copper disk having the same thickness as that of the connector element C31. The connector element C32' is smaller than the plasma excitation electrode 4. The outline of the connector element C32' is similar to that of an elliptical projection of the outline of the plasma excitation electrode 4 projected relative to the plane tilted at 45° with respect to an axial line L. The connector element C31 is orthogonal to the plasma excitation electrode 4. The connector element C32' is tilted at 45° with respect to the plasma excitation electrode 4 and the connector element C31. The connector elements C31 and C32' are disposed in plural stages between the output terminal PR of the matching circuit 2A and the plasma excitation electrode 4. The connector element C31 has a diameter larger than the connector element C32' disposed closer to the output terminal PR.

The i axis is the direction of transmission of an electrical current from the output terminal PR to the plasma excitation electrode 4 in the feeder 3. The i axis extends perpendicular to the connector element C31 in the region from the connector element C32' to the output terminal PR and perpendicular to the plasma excitation electrode 4 in the region from the connector element C32' to the plasma excitation electrode 4. With such an arrangement, the outline of each of the connector elements C31 and C32' viewed in the direction of the current transmission path, i.e., the i axis, is similar to the outline of the plasma excitation electrode 4.

One end of the feeder element 31 is detachably attached to a tuning capacitor 24 which functions as the output terminal PR of the matching circuit 2A with connecting means such as screws. The other end of the feeder element 31 is substantially orthogonal to the upstream face of the connector element C31, and is connected to the connector element C31 at a center C30 of the connector element C31.

As shown in FIG. 22, one end of each of the feeder elements 32c, 32c', and 32c" is connected to the downstream face of the connector element C31. The other end of each of the feeder elements 32c, 32c', and 32c" is connected to the upstream face of the connector element C32' at an angle of 45°. One end of each of the feeder elements 33c, 33c', and 33c" is connected to the downstream face of the connector element C32' at an angle of 45°, the feeder elements 33c, 33c', and 33c" extending orthogonal to the feeder elements 32c, 32c', and 32c". The other end of each of the feeder elements 33c, 33c', and 33c" is connected to the surface of the plasma excitation electrode 4 to be substantially orthogonal thereto. The feeder elements 31, 32c, 32c', 32c", 33c, 33c', and 33c" are parallel to the i axis corresponding to the current transmission path from the output terminal PR to the plasma excitation electrode 4.

The above arrangement of the feeder elements 31, 32c, 32c', 32c", 33c, 33c', and 33c" allows the average RF power density per unit volume to decrease as the RF power supplied from the RF generator 1 flows from the output terminal PR to the plasma excitation electrode 4. In other words, the transmission space of the RF current increases as the RF current flows from one end of the feeder element 31 attached at the output terminal PR, i.e., the tuning capacitor 24, to ends of feeder elements 33c, 33c', and 33c". Such an increase in transmission space substantially decreases the inductance and the RF resistance.

In detail, at the first stage of the feeder 3, a single feeder element 31 is provided on the upstream face of the connector element C31 whereas three feeder elements 32c, 32c', and 32c" are provided at the downstream face of the connector element C31, thereby tripling the transmission space of the RF current. At the second stage of the feeder 3, the gap between the feeder elements 33c, 33c', and 33c" connected to the downstream face of the connector element C32' is larger than the gap between the feeder elements 32c, 32c', and 32c" connected to the upstream face of the connector element C32', thereby further increasing the transmission space of the RF current.

The feeder element 31 is connected to the upstream face of the connector element C31, at the center C30. The feeder element 31 is parallel to and coincident with an axial line L' perpendicular to the upstream face of the connector element C31, the axial line L' passing through the center C30.

The three feeder elements 32c, 32c', and 32c" are parallel to one another and connected to the downstream face of the connector element C31, and to the upstream face of the connector element C32' in an axisymmetrical manner with respect to the center C30 of the circular connector element C31. The term "axisymmetrically" means being spatially symmetrical with respect to the axial line L' perpendicular to the face of the connector element C31. In other words, as in the second embodiment shown in FIG. 19, the feeder elements 32c, 32c', and 32c" are positioned at apexes of an equilateral triangle T1 in the connector element C31, and the center of the equilateral triangle T1, the center C30 of the connector element C31, and the center C30 of the connector element C32 are coincident with one another.

The three feeder elements 33c, 33c', and 33c" are parallel to one another and to an axial line L perpendicular to the surface of the plasma excitation electrode 4, the axial line L passing through the center 40 of the plasma excitation electrode 4. The three feeder elements 33c, 33c', and 33c" are connected to the downstream face of the connector element C32" and to the plasma excitation electrode 4 in a axisymmetrical manner with respect to the center 40 of the plasma excitation electrode 4. The term "axisymmetrically" means being spatially symmetrical with respect to the axial line L perpendicular to the plasma excitation electrode 4. In other words, as in the second embodiment shown in FIG. 19, the feeder elements 33c, 33c', and 33c" are positioned at apexes of an equilateral triangle T2 in the plasma excitation electrode 4, and the center of the equilateral triangle T2, the center C40 of the plasma excitation electrode 4, and the center C30 of the connector element C32' are coincident with one another.

The axial line L meets the axial line L' at the center C30 of the connector element C32'. The axial lines L and L' are perpendicular to each other.

The connection arrangement of the feeder elements 32c, 32c', and 32c" at the upstream face of the connector element C32' is similar to the connection arrangement of the feeder elements 33c, 33c', and 33c" at the downstream face of the connector element C32'. In other words, the equilateral triangles T1 and T2 on the connector element C31 and the plasma excitation electrode 4, respectively, indicating connection points of the feeder elements 32c, 32c', 32c", 33c, 33c', and 33c" are similar to each other and aligned in the same direction.

The feeder elements 31, 32c, 32c', 32c", 33c, 33c', and 33c" and the connector elements C31 and C32' are rigid. Thus, deformation leading to changes in RF characteristics during operation can be prevented, and their shapes can remain the same before and after maintenance involving disassembly and reassembly, thereby improving the reproducibility of the installation positions during assembly. In particular, the feeder elements 31, 32c, 32c', 32c", 33c, 33c', and 33c" may be either copper rods or copper plates having the above-described dimensions, and are connected to the connector elements C31 and C32', the output terminal PR, and the plasma excitation electrode 4 with connecting means such as screws to ensure reproducibility of the accurate connection state. Alternatively, the feeder elements 31, 32c, 32c', 32c", 33c, 33c', and 33c" may be welded to prevent displacement.

As with the RF power feeder elements 31 and 32a and the connector element C31 in the first embodiment shown in FIG. 5, each of the feeder elements 31, 32c, 32c', 32c", 33c, 33c', and 33c" and the connector elements C31 and C32' has a low-resistance surface RL composed of a low-resistance material such as Au and Ag and a core composed of Cu. The thickness of the low-resistance surface is adjusted to be larger than the skin depth at the RF power frequency supplied from the RF generator 1.

The feeder elements 31, 32c, 32c', 32c", 33c, 33c', and 33c" and the connector elements C31 and C32' are covered with an insulating coating as in the feeder elements 31 and 32a and the connector element C31 of the first embodiment.

The plasma processing apparatus 71 of this embodiment has the following advantages in addition to the same advantages as those of the first and second embodiments. Since the feeder elements 31, 32c, 32c', 32c", 33c, 33c', and 33c" and the connector elements C31 and C32' are covered with the housing (shielding conductor) 21A, the chassis 21, and the matching box 2 which are shielding conductors connected to the chamber wall 10 of the plasma processing chamber 60, the feeder 3 is housed in the shielding conductors, which constitute the return path of the RF current supplied from the RF generator 1. As a result, parasitic emission can be blocked, as with an axial cable, without impairing the flexibility in the position of the matching circuit 2A. This structure reduces the energy density in an infinitesimal volume element $\delta V$ in the RF power transmission space and thus substantially decreases the inductance. A decrease in inductance reduces the restriction on the RF current in the power supply section. The decrease in the energy density at the infinitesimal volume element $\delta V$ also substantially decreases RF resistance and power loss in the power supply section.

Accordingly, effective RF power consumed in the plasma generation space can be increased. In other words, the power supply section can be shielded regardless of the positions of the matching circuit 2A, the plasma excitation electrode 4, and the plasma processing chamber 60.

The feeder 3 of this embodiment may comprise more than two stages or only one stage instead of the two stages comprising the connector elements C31 and C32'. Moreover, the feeder 3 may be arranged in any suitable shape including an inverted letter-U shape instead of the letter-L shape described above.

The angle of the feeder elements 31, 32c, 32c', 32c", 33c, 33c', and 33c" with respect to the connector element C32' can be any angle instead of the angle of 45° described above.

Alternatively, the feeder 3 may be applied to the feed plate 28 described in the second embodiment shown in FIG. 17.

The plasma processing apparatus of this embodiment may be of an inductively coupled (ICP) type, a radial line slot antenna (RLSA) type, or the like instead of having two parallel electrodes 4 and 8. The plasma processing apparatus of this embodiment may also be applied to reactive ion etching (RIE).

Alternatively, the plasma processing apparatus of this embodiment may comprise only one plasma processing chamber.

Fourth Embodiment

Figure 23:
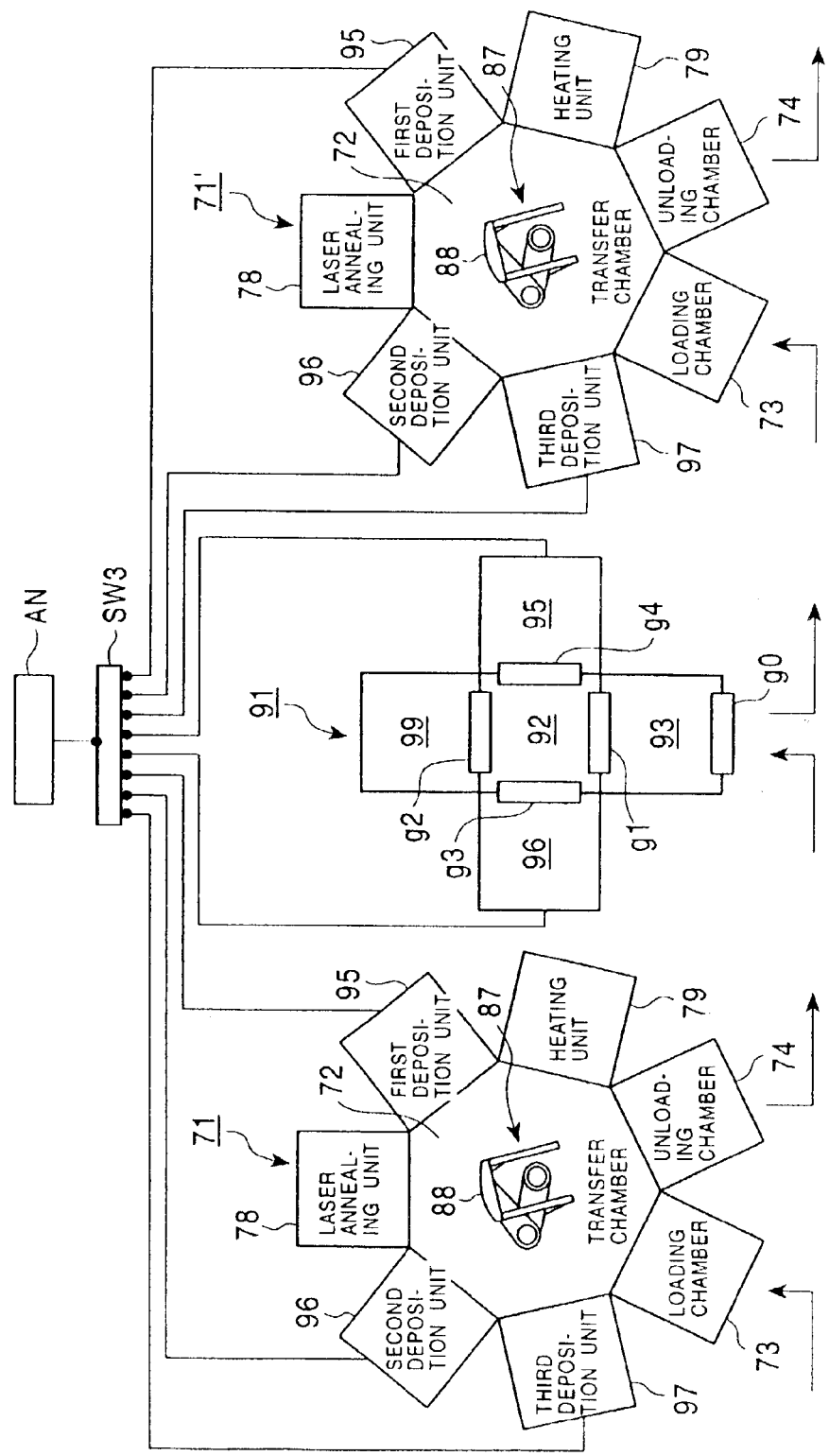
FIG. 23 is a schematic view showing the overall structure of a plasma processing system according to fourth, seventh, and tenth embodiments.
Figure 24:
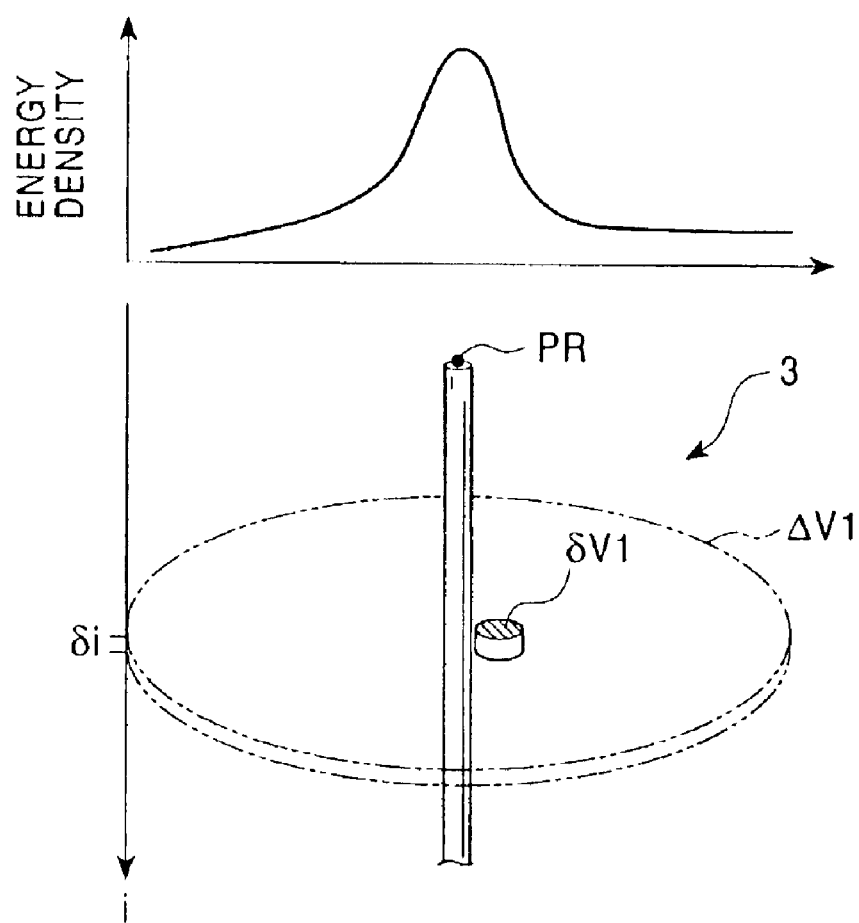
FIG. 24 includes a perspective view and a schematic graph showing energy density for explaining a transmission state of RF power according to the present invention.
Figure 25:
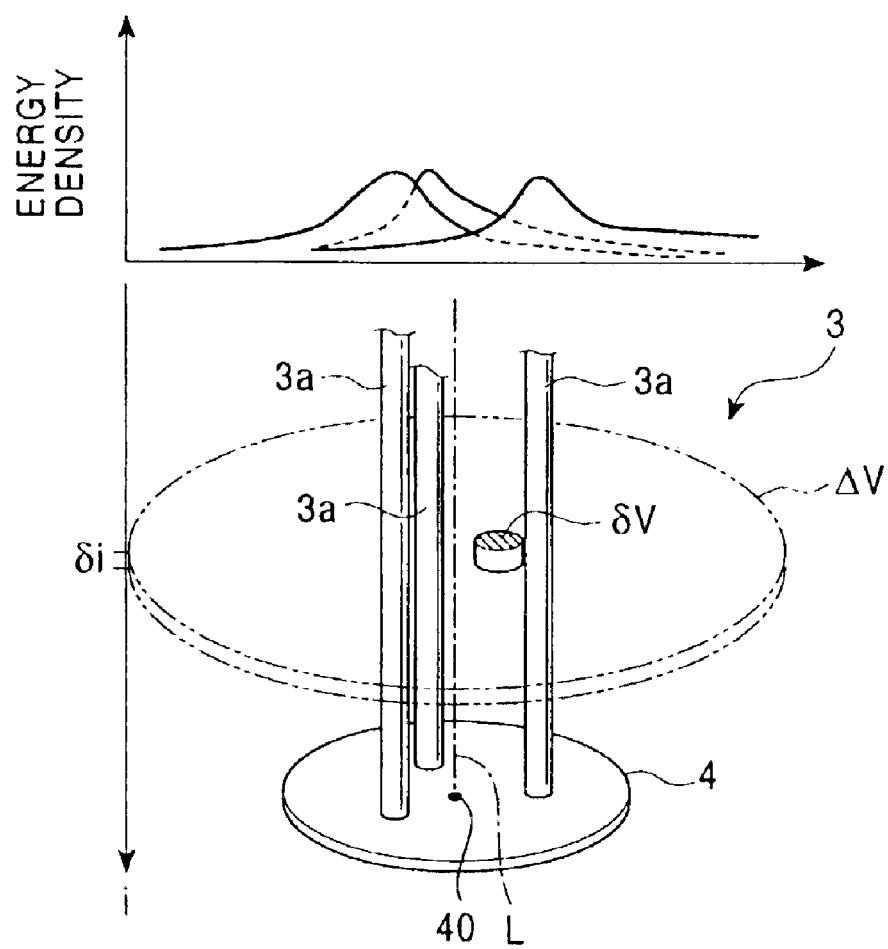
FIG. 25 is includes a perspective view and a schematic graph showing energy density for explaining a transmission state of RF power according to the present invention.

A plasma processing apparatus and system, and a method for stabilizing the plasma processing apparatus and system according to a fourth embodiment of the present invention will now be described with reference to the drawings. FIG. 23 is a schematic diagram showing the overall structure of a plasma processing system of this embodiment.

The plasma processing system of this embodiment is a combination of the plasma processing apparatuses 71 and 71', which are substantially the same as those described in the first and the third embodiments shown in FIG. 1, and a plasma processing apparatus 91, which is substantially the same as that described in the second embodiment shown in FIG. 16. The same components as those in the first to fourth embodiments are represented by the same reference characters and the description therefor is omitted to avoid repetition.

Referring to FIG. 23, the plasma processing system of this embodiment comprises: a plasma processing apparatus comprising three plasma processing units 95, 96, and 97; a plasma processing apparatus 91 comprising two plasma processing unit 95 and 96; and a plasma processing apparatus 71' comprising three plasma processing units 95, 96, and 97. The plasma processing system is part of a manufacturing line.

Unlike the plasma processing apparatuses 71 and 71' of the first and third embodiments shown in FIG. 1, three plasma processing units 95 to 97 of a dual-frequency excitation type substantially identical to the plasma processing unit 95 of the second embodiment shown in FIG. 16 are provided instead of the plasma processing units 75 to 77. The plasma processing units 95 to 97 have substantially the same structure as each other.

As shown in FIG. 23, an impedance meter AN is connected to each of the plasma processing units 95 to 97 via impedance measuring terminals and a switch SW3. The switch SW3 connects the impedance meter AN to a target plasma processing unit and disconnects the impedance meter AN from the rest of the plasma processing units during measurement of the impedance of the plasma processing chambers 95 to 97.

In this embodiment, each of the plasma processing units 95 to 97 comprises a plasma excitation electrode 4, an output terminal PR of a matching circuit 2A, and an RF power feeder 3 connecting the plasma excitation electrode 4 to the output terminal PR. The feeder 3 is adjusted to allow the maximum value of the average RF power density per unit volume to decrease as RF power supplied from an RF generator 1 flows from the output terminal PR to the plasma excitation electrode 4. The feeder 3 is disposed in the interior of a housing (shielding conductor) 21A and/or a chassis 21 which is made of a conductor.

In the plasma processing system of this embodiment, a deposition process is performed on a preliminarily treated substrate 16 in the plasma processing units 95 to 97 of the plasma processing apparatus 71. Subsequently, the substrate 16 is heated in a heating unit 79 and annealed in a laser annealing unit 78. The substrate 16 is then discharged from the plasma processing apparatus 71 and transferred to another plasma processing apparatus (not shown) equivalent to the plasma processing apparatus 71 and is sequentially subjected to second and third deposition processes.

Next, a photoresist layer is formed on the substrate 16 by photolithography in another apparatus (not shown).

The substrate 16 is then transferred into the plasma processing apparatus 91 and is subjected to plasma etching in the plasma processing units 95 and 96.

The substrate 16 discharged from the plasma processing apparatus 91 is transferred to another apparatus (not shown) where the resist layer is removed.

Finally, the substrate 16 is transferred into the plasma processing apparatus 71' and is subjected to first, second, and third deposition processes sequentially in the plasma processing units 95, 96, and 97, which completes the processes using the plasma processing system of this embodiment. The processed substrate 16 is then transferred to the next step of the manufacturing line.

The plasma processing system of this embodiment has the following advantages in addition to the advantages of the first to third embodiments. Since the feeder 3 is adjusted to allow the average RF power density per unit volume to decrease as RF power supplied from the RF generator 1 flows from the output terminal PR of the plasma excitation electrode 4, as described above, the energy density in the RF power transmission space can be further decreased, the inductance can be substantially decreased, and the RF resistance can be further decreased in each of the plasma processing chamber units 95 to 97. In other words, the energy density per infinitesimal volume element δV in the RF power transmission space in the power supply section that includes the components from the RF generator 1 to the plasma excitation electrode 4 can be decreased, thereby further reducing the restriction on the RF power in the power supply section. The RF resistance and the power losses in the power supply section can be further reduced.

Accordingly, the effective RF power consumed in the plasma generation space can be increased, the RF power losses in the plasma processing chamber units 95 to 97 can be decreased, and the RF power losses of the entire plasma processing system can be further decreased.

Furthermore, the difference in the RF characteristics among the plasma processing chamber units 95 to 97 can be reduced. Since the plasma processing chamber units 95 to 97 can be adjusted using the impedance characteristic as a parameter in this plasma processing system, the plasma processing chamber units 95 to 97 can achieve a substantially uniform plasma density. Thus, the same process recipe can be applied to the plasma processing chamber units 95 to 97 of this plasma processing system so as to achieve substantially uniform plasma processing results. If deposition processes are performed in the plasma processing chamber units 95 to 97, layers having substantially uniform layer characteristics, i.e., uniform layer thickness, breakdown voltage, etching rate, and the like, can be formed. The stability of the plasma generation in the plasma processing chamber units 95 to 97 is ensured by adjusting the overall RF characteristics of the plasma processing system. Accordingly, the plasma processing system has superior operation stability because the plasma processing chamber units 95 to 97 can reliably perform substantially uniform operation.

Compared with the conventional plasma processing system, the plasma processing system of this embodiment can increase the effective power consumed in the plasma space even when the same frequency is supplied. Thus, the consumption efficiency of the power of the plasma processing system as a whole can be improved, and the same process rate and the same layer characteristics can be achieved with less power than conventionally required. These advantages can be achieved in all of the plasma processing chamber units 95 to 97. Thus, power losses and the operation cost of the plasma processing system as a whole can be reduced, thereby improving the productivity. Since the processing time is shortened and power consumption during the plasma processes is decreased, the total emission of carbon dioxide, which places a burden on the environment, can be reduced.

Furthermore, the plasma processing apparatus of the plasma processing system of this embodiment may be of an inductively coupled (ICP) type, a radial line slot antenna (RLSA) type, or the like instead of having two parallel electrodes 4 and 8. The plasma processing apparatus may also be applied to reactive ion etching (RIE).

Fifth Embodiment

The plasma processing apparatus, the plasma processing system, and the method for stabilizing them will now be described according to a fifth embodiment of the present invention.

FIG. 1 shows an outline configuration of a plasma processing apparatus 71 according to the fifth embodiment. The plasma processing apparatus 71 has a plurality of units and performs a series of production steps, for example, from depositing a polycrystalline silicon active layer to depositing a gate insulating layer of a top-gate thin-film transistor (TFT) one continuous operation.

The plasma processing apparatus 71 has a heptagonal transfer chamber 72, which is surrounded by five units, a loading chamber 73, and an unloading chamber 74. The five units consist of a first deposition unit 75 for depositing an amorphous silicon layer, a second deposition unit 76 for depositing a silicon oxide layer, a third deposition unit 77 for depositing a silicon nitride layer, a laser annealing unit 78 for annealing a substrate after deposition treatment by laser, and a heating unit 79 for heating the substrate after the deposition treatment. The first deposition unit 75, the second deposition unit 76, and the third deposition unit 77 constitute a plasma processing unit. The first deposition unit 75, the second deposition unit 76, and the third deposition unit 77 have substantially the same configuration and may be used for different processes depositing different layers or the same process according to the same process recipe. In this embodiment, at DC-ground sections in a current return path from a susceptor electrode to an RF generator, a low-resistance surface is provided at least on a part of the ground potential portions to reduce the electrical resistance thereof.

A configuration of the first deposition unit 75 will now be described with reference to FIG. 2, which is an outline cross-sectional view of the plasma processing unit 75 according to the fifth embodiment.

The first deposition unit 75 (in FIG. 1) is of a single-frequency excitation type and is used for plasma treatments, such as chemical vapor deposition (CVD), sputtering, dry etching, and ashing. Referring to FIG. 2, the chamber has parallel plates electrodes 4 and 8 (the plasma excitation electrode 4 and a susceptor electrode 8), an RF generator 1 connected to the plasma excitation electrode 4 through the RF feeder 3, and a matching circuit 2A that performs the impedance matching between the first deposition unit 75 and the RF generator 1.

Referring to FIG. 2, the first deposition unit 75 has a plasma processing chamber 60. The plasma processing chamber 60 includes the plasma excitation electrode 4, connected to the RF generator 1, and a shower plate 5 at upper positions, and includes the susceptor electrode (counter electrode) 8 that holds a substrate 16 to be treated at a lower position. The shower plate 5 faces the susceptor electrode 8. The plasma excitation electrode 4 is connected to the RF generator 1 via the feeder 3 and the matching circuit 2A. Both the plasma excitation electrode 4 and the feeder 3 are covered with a chassis (shielding conductor) 21, while the matching circuit 2A is accommodated in a matching box (shielding conductor) 2 composed of a conductive material. The chassis 21 and the matching box 2 are mutually connected and function as shielding conductors. Furthermore, the matching box 2 is connected to a shield line (outer conductor) of a supplier (supply line) 1A being a coaxial cable.

The feeder 3 is formed of, for example, copper of which the surface is plated with silver and has a width of 50 to 100 mm, a thickness of 0.5 mm, and a length of 10 to 300 mm. The feeder 3 is fixed to the output terminal of a tuning capacitor 24 in the matching circuit 2A and to the plasma excitation electrode 4 at both ends with connecting means such as screws or the like.

The shower plate 5 has many holes 7 and is in contact with a projection 4a provided at the bottom face of the plasma excitation electrode 4; hence, the plasma excitation electrode 4 and the shower plate 5 form a space 6 therebetween. The space 6 communicates with a gas inlet pipe 17 that extends through the sidewall of the chassis 21 and the plasma excitation electrode 4.

The gas inlet pipe 17 is composed of a conductive material and provided with an insulator 17a in the midway inside the chassis 21, for insulating the plasma excitation electrode 4 from the gas supply side. Gas from the gas inlet pipe 17 is supplied into the plasma processing chamber 60 in a chamber wall 10 through the many holes 7 of the shower plate 5. The chamber wall 10 is insulated from the plasma excitation electrode 4 with an insulator 9. In FIG. 2, an exhaust system to be connected to the plasma processing chamber 60 is not depicted. The susceptor electrode 8 in the plasma processing chamber 60 has a disk shape and holds the substrate 16.

The susceptor electrode 8 is supported by a shaft 13 that extends through a chamber bottom 10A. The lower portion of the shaft 13 is hermetically connected to the chamber bottom 10A with a bellows 11 so that the susceptor electrode 8 and the shaft 13 can be vertically moved to adjust the distance between the parallel plates electrodes 4 and 8. As a result of the connection between the susceptor electrode 8 and the shaft 13, the susceptor electrode 8, the shaft 13, the bellows 11, the chamber bottom 10A, and the chamber wall 10 have the same DC potential. Also as a result of the connection between the chamber wall 10 and the chassis 21, the chamber wall 10, the chassis 21, and the matching box 2 have the same DC potential.

The matching circuit 2A includes a plurality of passive components for adjusting the impedance of the plasma processing chamber 60 in response to, for example, a change in plasma state in the plasma processing chamber 60. Specifically, as shown in FIG. 2, the matching circuit 2A is provided between the RF generator 1 and the feeder 3 and includes an inductance coil 23, a tuning capacitor 24 (an air variable capacitor), and a load capacitor 22 (a vacuum variable capacitor). The inductance coil 23 and the tuning capacitor 24 are directly connected between the input terminal and the output terminal of the matching circuit 2A, while the load capacitor 22 is connected in parallel to the junction between the inductance coil 23 and the input terminal. The inductance coil 23 and the tuning capacitor 24 are directly connected to each other, whereas one end of the load capacitor 22 is connected to the matching box 2 at the ground potential through a conductor. The tuning capacitor 24 lies at the tailing end of the passive components. The output terminal of the tuning capacitor 24, i.e., the output terminal PR of the matching circuit 2A is connected to the plasma excitation electrode 4 through the feeder (RF feeder) 3.

The matching box (shielding conductor) 2 is connected to the shield line of the supply line (RF supplier) 1A while the shield line is DC-grounded; the susceptor electrode 8, the shaft 13, the bellows 11, the chamber bottom 10A, the chamber wall 10, the chassis 21, and the matching box 2 have the ground potential. Also the outer end of the load capacitor 22 is DC-grounded. The susceptor electrode 8, the shaft 13, the bellows 11, the chamber bottom 10A, the chamber wall 10, the chassis 21, the matching box 2, and the shield line of the supply line 1A constitute a DC-ground section.

At least parts of the DC-ground section have low-resistance surfaces RL to reduce electrical resistance. More specifically, the matching box 2, the chassis 21, and the chamber wall 10 have low-resistance surfaces RL. The low-resistance surfaces RL may also be formed on the inner surface (vacuum surface) of the chamber wall 10 in the plasma processing chamber 60, the inner surfaces of the matching box 2 and the chassis 21.

The low-resistance surfaces RL are composed of a low-resistance material, such as gold, silver, copper, or an alloy thereof, which has lower resistance than the materials for the chassis 21, the matching box 2, and the inner portion of the chamber wall 10 composed of aluminum or stainless steel such as SUS304. For example, silver plating layers as the low-resistance surfaces RL are formed on the outer surfaces of the chassis 21, the matching box 2, and the chamber wall 10 composed of aluminum. Alternatively, silver plating layers may be formed on the inner surfaces of the matching box 2 and the chassis 21. The thickness of the low-resistance surfaces RL are larger than or equal to the skin depth δ at the frequency of the RF power fed from the RF generator 1.

Figure 28:
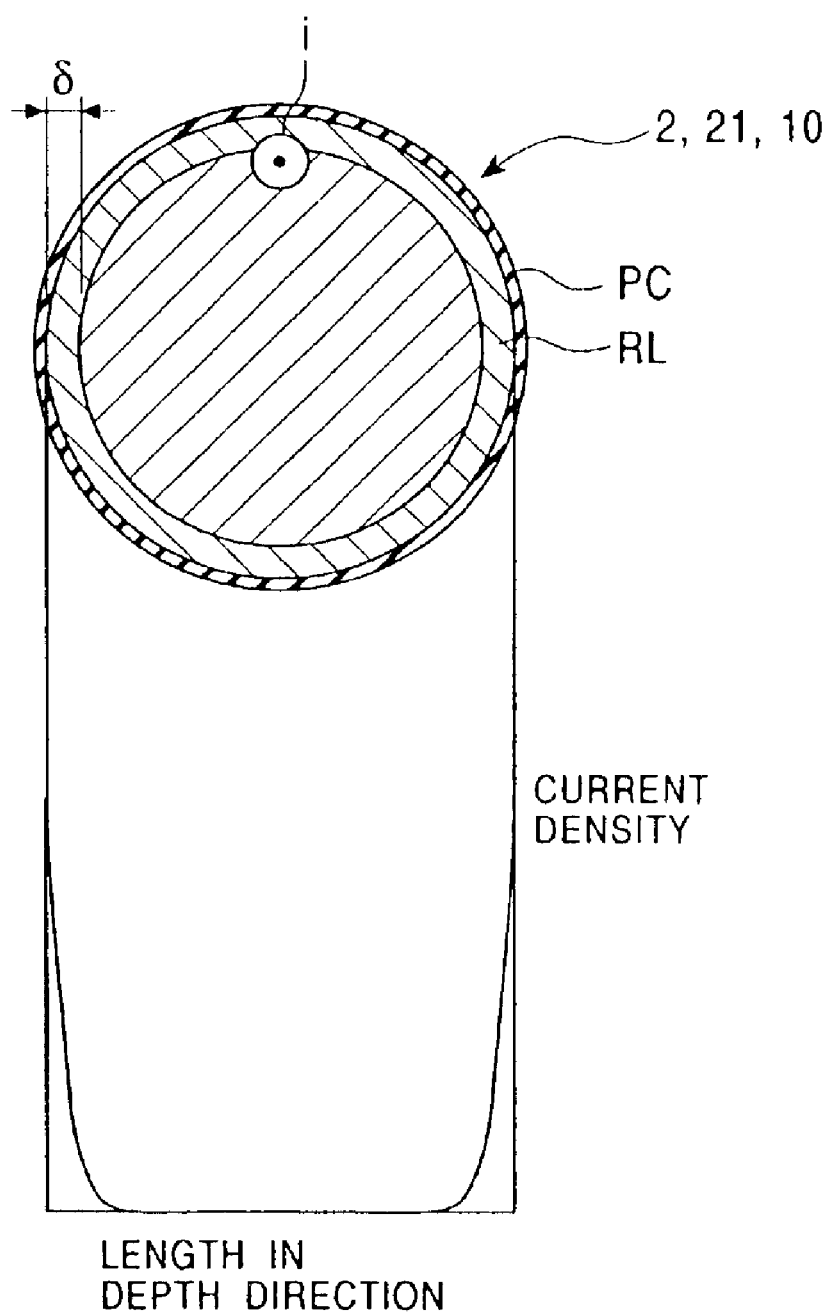
FIG. 28 is a cross sectional view for explaining a low-resistance portion and a skin depth δ of the plasma processing unit shown in FIG. 2.

FIG. 28 is a schematic cross-sectional view for illustrating the low-resistance surface RL and the skin depth δ on the chassis 21, the matching box 2, and the chamber wall 10; the cross-section of each of these components is schematically depicted as a circle. The skin depth δ is defined by Equation (2) above.

When RF power of a frequency f of about 13.56 MHz is fed from the RF generator, the skin depth δ at the silver low-resistance surface RL of each of the chassis 21 and the matching box 2 is about $1.30 \times 10$ μm wherein $\sigma = 1.10 \times 10^8$ S/m and $\mu = \mu_0$ (vacuum permeability). Thus, the thickness of the low-resistance surface RL is set to be larger than $1.30 \times 10$ μm. The low-resistance surface RL is formed on the surface of each of the chassis 21, the matching box 2, and the chamber wall 10, for example, by plating.

The surfaces of the chassis 21, the matching box 2, and the chamber wall 10 are covered with insulating films PC formed of an insulating material. More specifically, the entire inner and outer surfaces of the chassis 21 and the matching box 2 and the outer side face of the chamber wall 10 are covered with the insulating films PC. If these components have the low-resistance surfaces RL, the low-resistance surfaces RL are covered with the insulating films PC.

Examples of the insulating materials include polyimide, tetrafluoroethylene-perfluoroalkyl vinyl ether (PFA) copolymers, polytetrafluoroethylene (PTFE), and tetrafluoroethylene-ethylene (ETFE) copolymers. The polyimide, tetrafluoroethylene-perfluoroalkyl vinyl ether (PFA) copolymers, and polytetrafluoroethylene (PTFE) exhibit high heat resistance, whereas the tetrafluoroethylene-ethylene (ETFE) copolymers exhibit high abrasion resistance.

In the first deposition unit 75 according to this embodiment, RF power with a frequency of at least 13.56 MHz, for example, 13.56 MHz, 27.12 MHz, or 40.68 MHz is fed to generate a plasma between the parallel plates electrodes 4 and 8 for performing plasma treatment, for example, chemical vapor deposition (CVD), dry etching, or ashing to the substrate 16 on the susceptor electrode 8.

Figure 29:
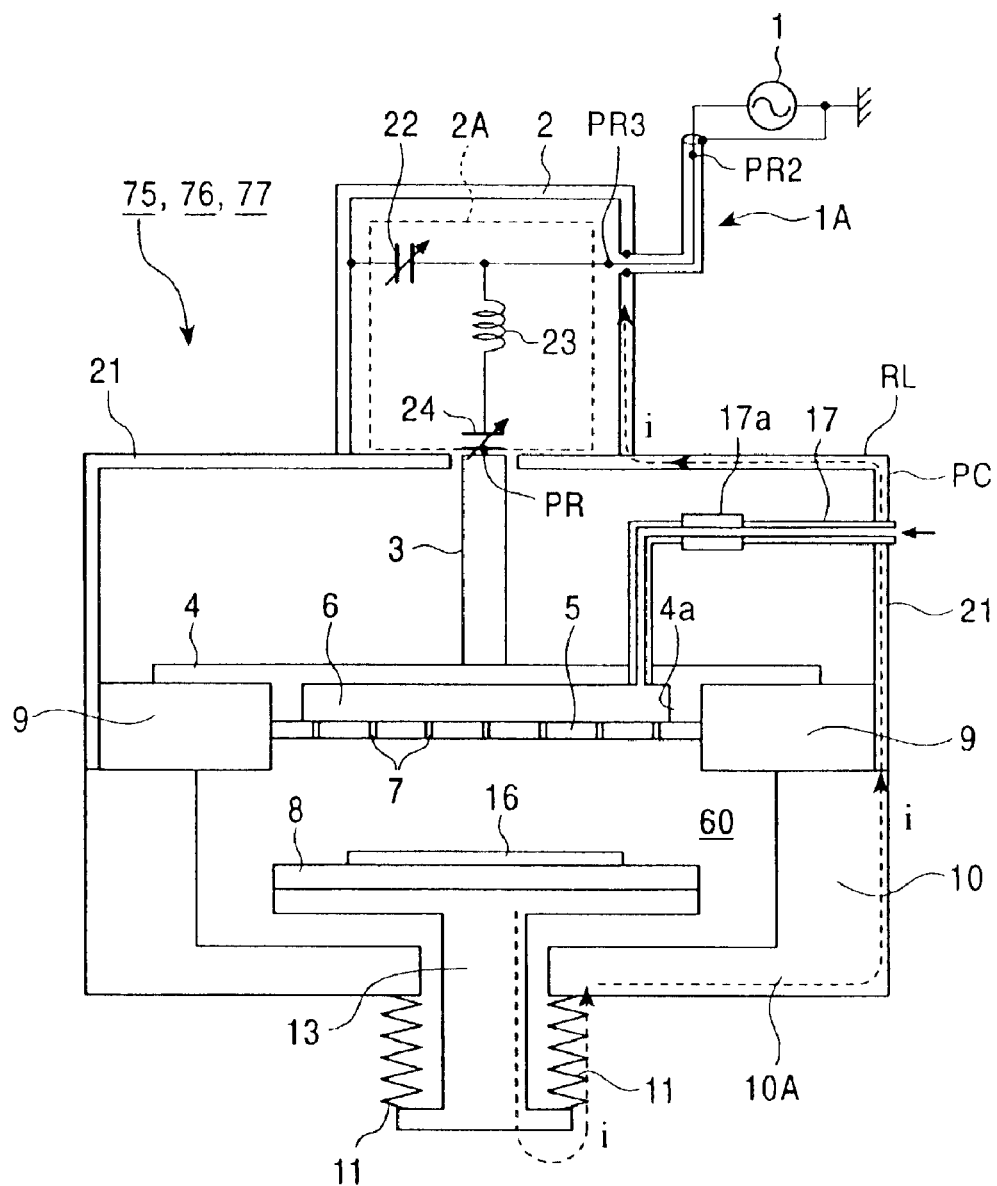
FIG. 29 is a diagram showing a return path of an electrical current in the plasma processing unit of the embodiment shown in FIG. 2.

FIG. 29 is a schematic view illustrating the return current path in the plasma processing unit of this embodiment.

The RF power is fed from the RF generator 1 to the feeding path including the supply line 1A (coaxial cable), the matching circuit 2A, the feeder 3, and the plasma excitation electrode 4. The RF current i from these components flows through the plasma processing chamber 60, the susceptor electrode 8, the shaft 13, the bellows 11, the chamber bottom 10A, the chamber wall 10, the chassis 21, the matching box 2, and the shield line of the supply line 1A toward the ground of the RF generator 1.

In the chamber wall 10, the chassis 21, and the matching box 2, the RF current i flows through the low-resistance surfaces RL provided thereon.

The shaft 13, the bellows 11, the chamber bottom 10A, the chassis 21, the matching box 2, and the shield line of the supply line 1A constitute the return path of the RF current to the ground of the RF generator 1.

When an amorphous silicon layer, a silicon oxide layer, or a silicon nitride layer is deposited on the substrate 16 in any one of the first deposition unit 75, the second deposition unit 76, and the third deposition unit 77, as shown in FIG. 2, the substrate 16 is placed on the susceptor electrode 8. RF power is fed from the RF generator 1 to the plasma excitation electrode 4 while a reactive gas is supplied to the plasma processing chamber 60 from the gas inlet pipe 17 through the shower plate 5 to generate a plasma for depositing the intended layer on the substrate 16.

Referring to FIG. 6, the laser annealing unit 78 in FIG. 1 has a laser light source 81 on an upper chamber wall 80 and a stage 82 on the lower chamber wall in the chamber. The stage 82 holds the substrate 16 and can move horizontally in the X and Y directions. A spot laser light beam 83 is emitted from a window 81a of the laser light source 81 while the stage 82 holding the substrate 16 moves in the X and Y directions so that the laser light beam 83 scans across the entire surface of the substrate 16. The laser light source 81 may use halogen gases, such as XeCl, ArF, ArCl, and XeF.

The laser annealing unit 78 may have any configuration as long as the laser light beam scans across the entire surface of the substrate to be treated. The laser light source 81 may be of any different type, for example, a YAG laser. The laser beam may be a pulsed laser beam or a continuously oscillated laser beam.

Referring to FIG. 7, the heating unit 79 is a multideck heating furnace having many multideck heaters 85 that hold substrates 16. These substrates 16 are heated by the heaters 85. The heating unit 79 is connected to the transfer chamber 72 shown in FIG. 1 via a gate valve 86.

Referring again to FIG. 1, a loading cassette and an unloading cassette are provided in the loading chamber 73 and the unloading chamber 74, respectively. These cassettes are detachable and can contain a plurality of substrate 16: The loading cassette holds untreated substrates 16 whereas the unloading cassette holds treated substrates 16. The transfer chamber 72 surrounded by the processing units, the loading chamber 73, and the unloading chamber 74 has a transfer robot 87 for transferring these substrates 16. The transfer robot 87 has an extendable and rotatable arm 88 that holds and transfers the substrates 16 at its end.

The plasma processing apparatus 71 is preliminarily set by an operator with respect to the film deposition conditions, the annealing conditions, the heat treatment conditions, the processing sequence, and the like of each plasma processing unit; however, the plasma processing apparatus 71 is automatically operated by a controller. In use of the plasma processing apparatus 71, an untreated substrate 16 is placed on a loading cassette. Upon the operation of a start switch by the operator, the substrate 16 is transferred from the loading cassette to each processing chamber by the transfer robot 87. After processing in each chamber, the substrate 16 is placed onto the unloading cassette.

In the first deposition unit 75 according to this embodiment, the chassis 21, the matching box 2', and the chamber wall 10 have the low-resistance surfaces RL at least at the outer surfaces thereof to reduce the electrical resistance of these components constituting the return path of the RF current. Thus, the low-resistance surfaces RL reduce the RF resistance at the surfaces of these components and RF power loss in the return path of the RF current fed from the RF generator 1, resulting in reduced loss of RF power to be fed into the plasma generating space. In other words, the RF power is more effectively consumed in the plasma space compared with conventional plasma processing apparatuses. Furthermore, introduction of higher frequency power causes an improved processing rate, for example, a deposition rate in a plasma CVD process.

The silver low-resistance surfaces RL provided on the chassis 21, the matching box 2, and the chamber wall 10 in the RF current return path reduce the RF resistance and thus the RF power loss in the return path. Thus, the RF power is more effectively supplied into the plasma generating space.

The low-resistance surface RL provided on the outer surface of the chamber wall 10 reduces the RF resistance of the chamber wall 10 at the ground portion in the RF current return path from the susceptor electrode 8 to the RF generator 1. Thus, the RF power is more effectively supplied into the plasma generating space due to reduced power loss in the return path.

The low-resistance surfaces RL provided on the matching box 2, which accommodates the matching circuit 2A, and the chassis 21 reduce the RF resistance of the matching box 2 and the chassis 21 in the RF current return path from the susceptor electrode 8 to the RF generator 1. Thus, the RF power is more effectively supplied into the plasma generating space due to reduced power loss in the return path.

The low-resistance surface RL provided on the chassis 21 accommodating the feeder 3 reduces the RF resistance of the chassis 21 in the RF current return path from the susceptor electrode 8 to the RF generator 1. Thus, the RF power is more effectively supplied into the plasma generating space due to reduced power loss in the return path.

The low-resistance surface RL provided on the chassis 21 accommodating the plasma excitation electrode 4 reduces the RF resistance of the chassis 21 in the RF current return path from the susceptor electrode 8 to the RF generator 1. Thus, the RF power is more effectively supplied into the plasma generating space due to reduced power loss in the return path.

The matching box 2, the chassis 21, and the susceptor electrode 8 lying in the current return path from the susceptor electrode 8 to RF generator 1 function as a shielding conductor. The matching box 2 and the chassis 21 accommodate the matching circuit 2A and the feeder 3, respectively, in the feeding path and cover the plasma excitation electrode 4 in the feeding path. Furthermore, the inner surfaces of the matching box 2, the chassis 21 opposing the matching circuit 2A, the feeder 3, and the plasma excitation electrode 4 are provided with the low-resistance surfaces RL. Thus, the matching box 2 and the matching circuit 2A as the shielding conductors shield the matching circuit 2A, the feeder 3, and the plasma excitation electrode 4. Furthermore, the low-resistance surfaces RL reduce the RF resistance and thus the power loss of the matching box 2 and the chassis 21. Thus, the RF power is more effectively supplied into the plasma generating space due to reduced power loss in the return path.

In summary, the low-resistance surfaces RL provided on the inner and outer surfaces of the matching box 2 and the chassis 21 reduce the power loss in the current path and more effectively feed the RF power into the plasma generating space.

The insulating film PC covering each of the low-resistance surfaces RL prevents the chassis 21, the matching box 2, and the chamber wall 10 from deterioration such as oxidation over time, and thus suppresses a change in RF resistance in the chassis 21, the matching box 2, and the chamber wall 10 in the current return path. Accordingly, the plasma processing apparatus can be operated with higher stability and reproducibility during repeated processing cycles.

In this embodiment, the low-resistance surfaces RL are provided on the entire inner and outer surfaces of the chassis 21 and the matching box 2 and the entire outer surface of the chamber wall 10. The low-resistance surface RL may be provided on a specific portion or specific portions functioning as a current path in each of these components.

For example, striped low-resistance surfaces may be provided on the outer face of the chamber wall 10. The plurality of parallel current paths reduces RF resistance and thus the effective RF power loss.

As described above, the low-resistance surfaces RL and the insulating films PC provided on the surfaces of the chassis 21, the matching box 2, and the chamber wall 10 ensure stable plasma operations overtime. The plasma processing apparatus including these components does not require a conventional two-stage maintenance process that includes a first stage for checking the operation of the plasma processing apparatus 71 by evaluating processed substrate and a second stage for adjusting the apparatus. Hence, the first to third deposition units 75 to 77 can be readily adjusted for the same process recipe so as to minimize the differences in RF characteristics therebetween. Furthermore, in the conventional maintenance process including actual deposition and evaluation of films on substrates, the plurality of plasma processing units must be individually adjusted and evaluated. In contrast, the first to third deposition units 75 to 77 according to this embodiment can be readily adjusted without actual film deposition. Accordingly, the plasma processing apparatus according to this embodiment offers significantly decreased inspection, process, labor, and material costs.

The plasma processing apparatus can be operated with low RF power consumption, low operation costs, high production output, and a shorter processing time, resulting in reduced amounts of emission of carbon dioxide gas as an environmentally loading substance.

In the above embodiment, the low-resistance surfaces RL and the insulating films PC are provided on the surfaces of the chassis 21, the matching box 2, and the chamber wall 10. Alternatively, the low-resistance surface(s) RL and the insulating film(s) PC may be provided on a surface or surfaces of at least one of the chassis 21, the matching box 2, and the chamber wall 10.

In the above embodiment, the low-resistance surface RL is composed of a single silver layer. Alternatively, the low-resistance surface RL may be composed of gold, silver, or a high-conductivity alloy thereof. The low-resistance surface RL may be composed of a plurality of layers, for example, a copper innermost layer, a silver interlayer, and a gold outermost layer; this deposition order agrees with the order of the current density by the skin effect.

When the chassis 21, the matching box 2, or the chamber wall 10 is covered with a low-resistance surface composed of a material with low corrosion resistance, for example, gold, silver, or an alloy thereof, the insulating film is not always necessary, The chassis 21, the matching box 2, and the chamber wall 10 may be formed of stainless steel.

In this embodiment, the substrate 16 is held on the susceptor electrode 8 while the RF characteristics are adjusted at the current return path for the plasma excitation electrode 4; however, the substrate 16 may be provided at the cathode 4 so that the first deposition unit 75 is used for reactive ion etching (RIE).

Sixth Embodiment

A plasma processing apparatus and system, and a method for stabilizing the plasma processing apparatus and system according to a sixth embodiment of the present invention will now be described with reference to the drawings.

FIG. 16 is a cross-sectional view showing the overall structure of a plasma processing apparatus 91 of this embodiment.

As shown in FIG. 16, the plasma processing apparatus 91 of this embodiment comprises a substantially square transfer chamber 92, a load lock chamber 93, a heating unit 99, and plasma processing units 95 and 96. The load lock chamber 93, the heating unit 99, and the plasma processing units 95 and 96 surround the transfer chamber 92, which is disposed at the center of the apparatus. A transfer robot is installed in the transfer chamber 92. Gates g1, g2, g3, and g4 are installed between the transfer chamber 92 and the load lock chamber 93, the heating unit 99, the plasma processing unit 95, and the plasma processing unit 96, respectively. The transfer chamber 92, the heating unit 99, and the plasma processing units 95 and 96 are evacuated to a high vacuum by respective high-vacuum pumps. The load lock chamber 93 is evacuated to a low vacuum by a low-vacuum pump.

The components of the plasma processing apparatus 91 of this embodiment correspond to those of the plasma processing apparatus 71 according to the fifth embodiment described above. The transfer chamber 92 corresponds to the transfer chamber 72 in the fifth embodiment, the heating chamber 99 corresponds to the heating chamber 79 in the fifth embodiment, and the load lock chamber 93 corresponds to the loading chamber 73 in the fifth embodiment. The description of the common components is omitted to avoid repetition.

The plasma processing units 95 and 96 correspond to the plasma processing units (plasma chambers) 75 and 76. The plasma processing units 95 and 96 have substantially the same structure and may perform either different types of processes to deposit different types of layers or the same process using the same process recipe.

In each of the plasma processing units 95 and 96, a chassis 21 and a matching box 2 on the return path of an electrical current are made of a copper or an alloy containing copper. A chamber wall 10 has a low-resistance portion RL at the surface thereof. The chassis 21, the matching box 2, and the chamber wall 10 are covered with an insulating film PC.

The structure of the plasma processing apparatus 91 is described below using the plasma processing unit 95 as an example.

Figure 30:
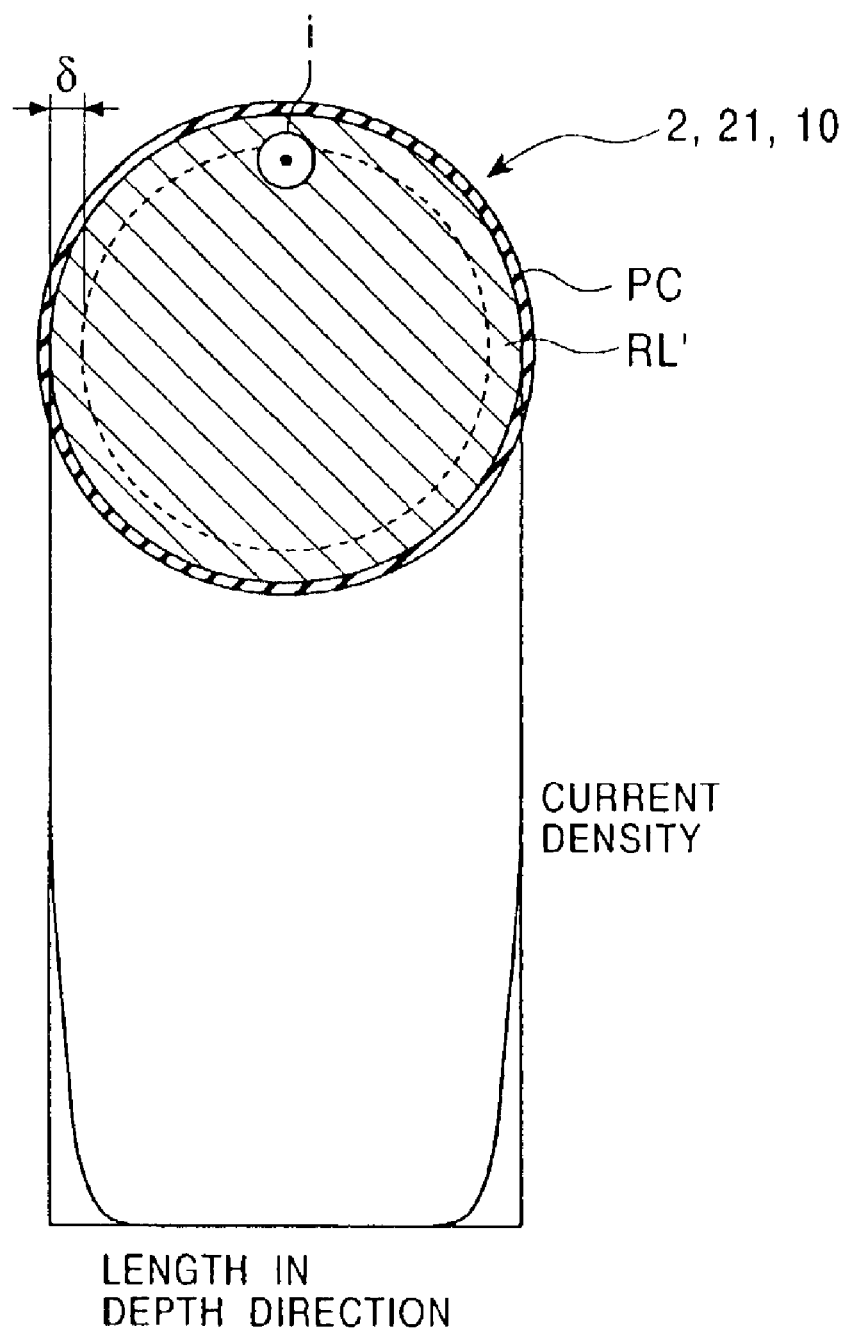
FIG. 30 is a schematic cross-sectional view for explaining a low-resistance portion and a skin depth δ of the plasma processing unit shown of the embodiment shown in FIG. 17.
Figure 31:
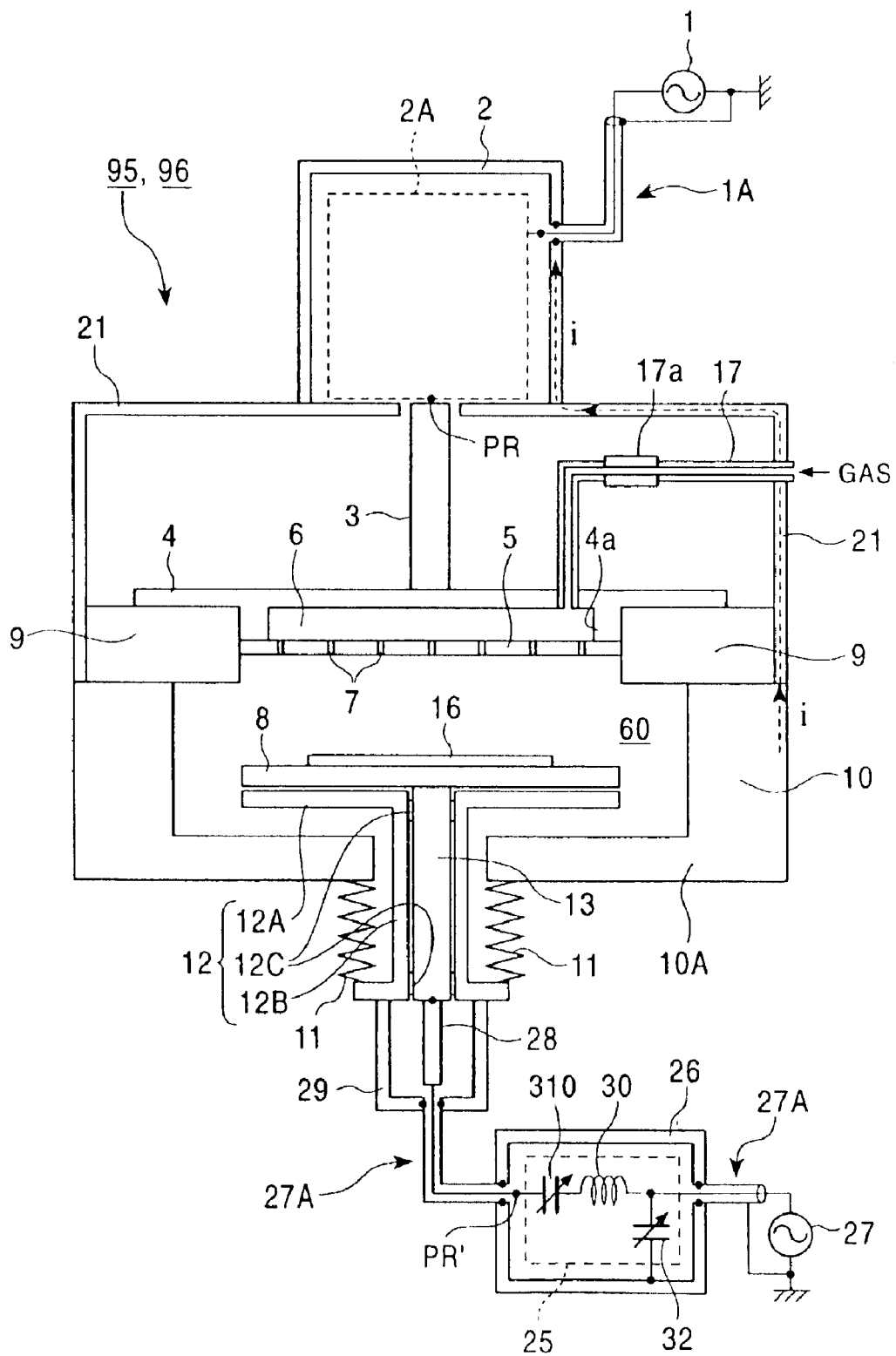
FIG. 31 is a diagram showing a return path of an electrical current in the plasma processing unit of the embodiment shown in FIG. 17.

FIG. 17 is a cross-sectional view showing the overall structure of the plasma processing unit 95 of this embodiment. FIG. 30 is a schematic cross-sectional view for explaining the low-resistance portion and a skin depth $\delta$ in this embodiment. FIG. 31 is a schematic diagram showing the return path of an electric current in the plasma processing unit 95 shown in FIG. 17.

The plasma processing unit 95 of this embodiment is of a dual-frequency excitation type. The plasma processing unit 95 of this embodiment differs from the plasma processing unit 75 of the fifth embodiment in that power is also supplied to the susceptor electrode 8. The structures of the chassis 21 and the matching box 2 are also different from those of the fifth embodiment. Other corresponding components are represented by the same reference characters and description thereof is omitted to avoid repetition.

Referring to FIG. 17, the plasma processing unit 95 comprises a susceptor shield 12 disposed under a susceptor electrode 8. The gap between the susceptor electrode 8 and the susceptor shield 12 is vacuum-sealed and electrically isolated by insulation means 12C. composed of an insulating material, provided at the periphery of a shaft 13. The susceptor electrode 8 and the susceptor shield 12 can be moved vertically by the bellows 11 which controls the distance between plasma excitation electrodes 4 and 8. The susceptor electrode 8 is connected to a second RF generator 27 via a feed plate 28 connected to the bottom end of the shaft 13 and a matching circuit 25 housed in a susceptor-electrode-side matching box 26 composed of a conductor.

The feed plate 28 is, for example, a silver-plated copper plate having a width of 50 to 100 mm, a thickness of 0.5 mm, and a length of 100 to 300 mm. The feed plate 28 is detachably attached to the output terminal of a tuning capacitor 310 of the matching circuit 25 described below and to the bottom end of the shaft 13 with connecting means such as screws.

The feed plate 28 is covered with a chassis 29 connected to the bottom end of a supporting tube 12B of the susceptor shield 12. The chassis 29 is connected to a shielding line of a supply line 27A, which is a coaxial cable. The chassis 29 and the matching box 26 are grounded through the shielding line of the supply line 27A. As a result, the susceptor shield 12, the chassis 29, and the matching box 26 have the same DC potential.

The matching circuit 25 performs impedance matching between the second RF generator 27 and the susceptor electrode 8. As shown in FIG. 17, a plurality of passive elements, i.e., a tuning coil 30 and the tuning capacitor 310 are connected in series between the second RF generator 27 and the feed plate 28, and a load capacitor 32 is connected to the second RF generator 27 and the feed plate 28 in parallel. One end of the load capacitor 32 is connected to the matching box 26. The matching circuit 25 has substantially the same structure as that of the matching circuit 2A. Since the matching box 26 is grounded through the shielding line of the supply line 27A, the above one end of the load capacitor 32 is also grounded. Various other arrangements such as connecting another tuning coil in series to the tuning coil 30 and connecting another load capacitor in parallel to the load capacitor 32 are possible.

In operating the plasma processing unit 95, a workpiece, i.e., a substrate 16, is placed on the susceptor electrode 8, RF power is supplied to both the plasma excitation electrode 4 and the susceptor electrode 8 from the RF generator 1 and the second RF generator 27, respectively, while producing a plasma by feeding a reaction gas into a plasma processing chamber 60 from a gas feeding tube 17 through a shower plate so as to perform a plasma process such as layer deposition or the like on the substrate 16. During the operation, RF power having a frequency of 13.56 MHz or more, for example, 13.56 MHz, 27.12 MHz, or 40.68 MHz, is supplied from the RF generator 1. The frequency of the power supplied from the second RF generator 27 may be the same as or different from that supplied by the RF generator 1. For example, the power having a frequency of 1.6 MHz may be supplied from the second RF generator 27.

In the DC-ground section of this embodiment, the chamber wall 10 has the same structure as that in the fifth embodiment. The chassis (shielding conductor) 21 and the matching box (shielding conductor) 2 are composed of copper or an alloy containing copper. Each of the chassis 21 and the matching box 2 comprises: a low-resistance portion RL' composed of copper, i.e., a low-resistance material, instead of the silver in the fifth embodiment; and a copper core, as shown in FIG. 30. In other words, each of the chassis 21 and the matching box 2 has a low-resistance portion RL' composed of a low-resistance material, i.e., copper, as in the fifth embodiment, but with the thickness of the low-resistance portion RL' being equal to the thickness of each of the chassis 21 and the matching box 2.

When power having a frequency f of approximately 13.56 MHz is supplied from the RF generator 1, the skin depth δ of the copper low-resistance portion RL' of the chassis 21 and the matching box 2 is $$\delta = 1.79 \times 10 \, \mu m$$

when the conductivity σ=0.58×10⁸ S/m, and the permeability $\mu=\mu_0$ (in vacuum). Accordingly, the thicknesses of the low-resistance surfaces RL' of the chassis 21 and the matching box 2 are adjusted to be larger than δ=1.79×10 μm.

In this embodiment, the thicknesses of the copper portions of the chassis 21 and the matching box 2, i.e., the portions which can be regarded as the low-resistance portion RL', are significantly larger than the skin depth δ at an RF supplied from the RF generator 1. Thus, an electrical current i does not flow deeper than the skin depth δ. In this embodiment, the return path of the electrical current supplied from the RF generator 1 includes the low-resistance portion RL of the chamber wall 10 and the low-resistance surfaces RL' of the chassis 21 and the matching box 2.

As shown in FIG. 30, the surfaces of the chassis 21, the matching box 2, and the chamber wall 10 are covered with an insulating film PC. Here, the term "surfaces of the chassis 21, the matching box 2, and the chamber wall 10" means "all the surfaces, i.e., the low-resistance surfaces RL', of the chassis 21 and the matching box 2 and the outer surface of the chamber wall 10". When the chamber wall 10 is provided with the low-resistance portion RL, the insulating film PC covers the low-resistance portion RL.

The insulating film PC may be composed of polyimide, tetrafluoroethylene-perfluoroalkyl vinyl ether (PFA) copolymers, polytetrafluoroethylene (PTFE), tetrafluoroethylene-ethylene copolymers (ETFE), or the like. The polyimide, tetrafluoroethylene-perfluoroalkyl vinyl ether (PFA) copolymers, and polytetrafluoroethylene (PTFE) exhibit high heat resistance. The tetrafluoroethylene-ethylene (ETFE) copolymers exhibit high abrasion resistance.

Referring now to FIG. 16, in operating the plasma processing apparatus 91 comprising the plasma processing units 95 and 96 having the above-described structure, a gate g0 is opened to transfer the substrate 16 into the load lock chamber 93. The load lock chamber 93 is then closed and evacuated using a low-vacuum pump. The gates g1 and g2 are opened, and the substrate 16 in the load lock chamber 93 is transferred into the heating unit 99 by a transfer arm of the transfer robot in the transfer chamber 92. The gates g1 and g2 are closed and the transfer chamber 92 and the heating unit 99 are evacuated using a high-vacuum pump. The substrate 16 is heated, the gates g2 and g4 are opened, and the heated substrate 16 is transferred into the plasma processing unit 95 by the transfer arm of the transfer robot in the transfer chamber 92. The heated substrate is subjected to a reaction process in the plasma processing unit 95. Upon completion of the plasma process, the gates g4 and g3 are opened and the processed substrate 16 is transferred into the plasma processing unit 96. Upon completion of the plasma process in the plasma processing unit 96, the gated g3 and g1 are opened and the processed substrate 16 is transferred to the load lock chamber 93 by the transfer arm of the transfer robot in the transfer chamber 92.

The operation of each sections is automatically controlled by a control unit except for the process conditions such as deposition conditions of the respective processing units and the processing sequence, which are set by an operator. In using the plasma processing apparatus 91 of this embodiment, the operator need only place an unprocessed substrate 16 in a loading cassette of the load lock chamber 93 and operating a start switch. After operating the start switch, the unprocessed substrate 16 is transferred from the loading cassette to each of the processing units by the substrate transfer robot, and upon completion of a series of processes performed automatically in each of the processing units, the processed substrate 16 is placed in an unloading cassette (loading cassette) by the substrate transfer robot.

As in the fifth embodiment, in the plasma processing units 95 and 96, the substrate 16 is placed on the susceptor electrode 8, RF power is supplied to both the plasma excitation electrode 4 and the susceptor electrode 8 from the RF generator 1 and the second RF generator 27, respectively, while feeding a reactive gas into the plasma processing chamber 60 through the shower plate 5 from the gas feeding tube 17 to generate a plasma. An amorphous silicon layer, a silicon oxide layer, a silicon nitride layer, or the like is deposited on the substrate 16 using the plasma.

The plasma processing units 95 and 96 of this embodiment have the following advantages in addition to the advantages of the fifth embodiment described above. In this embodiment, the return path of the electrical power supplied from the RF generator 1 includes the chassis 21 and the matching box 2, which are composed of copper or a copper alloy, and the chamber wall 10 having the low-resistance portion RL composed of copper. Here, the return path is the path through which the electrical current returns to the ground position of the RF generator 1 from the susceptor electrode 8. An RF current supplied from the RF generator 1 returns to the ground position of the RF generator 1 via the surfaces of the chassis 21 and the matching box 2 that can be regarded as the low-resistance surfaces RL', and the low-resistance portion RL of the chamber wall 10. With this structure, the RF resistance at the conductor surfaces constituting the RF current path and the RF power losses in the return path can be reduced. As a result, losses of the RF power supplied to the plasma generation space can be reduced. The effective power consumed in the plasma space can be increased and the process rate can be improved compared with the known plasma processing apparatus if the same frequency is supplied. For example, when plasma-assisted CVD is performed in the plasma processing apparatus of this embodiment, the deposition rate can be improved. The process rate can be improved by increasing the plasma excitation frequency without changing the effective power consumed in the plasma space.

Since the chassis 21 and the matching box 2 of this embodiment are composed of copper, the plating required in the first embodiment is not necessary, thereby decreasing the manufacture cost.

Alternatively, the chassis 21 and the matching box 2 may be composed of an alloy containing copper, gold, silver, or a low-resistance high-conductivity alloy containing at least one of these elements.

In this embodiment, the return path at the second RF generator 27 side of each of the plasma processing units 95 and 96 may have the same structure as that of the chassis 21 and the matching box 2 of this embodiment or that of the fifth embodiment, as described below.

The return path of the power supplied from the second RF generator 27 is from the plasma excitation electrode 4 to the ground position of the second RF generator 27, which is referred to as the DC-ground section. The chassis 29 and the matching box 26, which are included in the return path of the power supplied from the second RF generator 27, may be composed of copper or an alloy containing copper. The chamber wall 10 may be provided with a low-resistance portion RL composed of copper for reducing the electrical resistance.

An RF current supplied from the second RF generator 27 returns to the ground position of the second RF generator 27 via the surfaces of the chassis 29 and the matching box 26 that can be regarded as the low-resistance surfaces RL', and the low-resistance portion RL of the chamber wall 10. With this structure, the RF resistance at the conductor surfaces constituting the RF current path and the RF power losses in the return path can be reduced. As a result, losses of the RF power supplied to the plasma generation space can be reduced. The effective power consumed in the plasma space can be increased and the process rate can be improved compared with the known plasma processing apparatus if the same frequency is supplied. For example, when plasma-assisted CVD is performed in the plasma processing apparatus of this embodiment, the deposition rate can be improved. The process rate can be improved by increasing the plasma excitation frequency without changing the effective power consumed in the plasma space.

The insulating film PC may be provided on the surfaces of the chassis 29 and the matching box 26 to achieve the same advantages as when the insulating film PC is provided on the surfaces of the chassis 21 and the matching box 2.

If the output terminal PR' of the matching circuit 25 is away from the plasma processing chamber 60 having the tuning capacitor 310 and the susceptor electrode 8, another type of RF power feeder may be provided instead of the supply line 27A and the feed plate 28 so as to connect the output terminal PR' to the susceptor electrode 8. A housing (shielding conductor) which connects the chassis 29 to the matching box 26 may be provided to house this RF power feeder.

The surfaces of the housing (shielding conductor) may be provided with the low-resistance portion RL' and the insulating film PC, as above.

With this structure, the RF power feeder, i.e., the power supply section including the second RF generator 27, can be shielded regardless of the position of the matching circuit 25, the electrodes 4 and 8, and the chamber wall 10. The losses in RF power supplied to the susceptor electrode 8 can thus be decreased.

The plasma processing apparatus of this embodiment may be of an inductively coupled (ICP) type, a radial line slot antenna (RLSA) type, or the like instead of having two parallel electrodes 4 and 8. The plasma processing apparatus of this embodiment may also be applied to reactive ion etching (RIE).

The plasma processing apparatus of this embodiment may perform a sputtering process by installing the target materials instead of the electrodes 4 and 8.

The plasma processing apparatus of this invention may have only one plasma processing unit.

Seventh Embodiment

A plasma processing apparatus and system, and a method for stabilizing the plasma processing apparatus and system according to a seventh embodiment of the present invention will now be described with reference to the drawings. FIG. 23 is a schematic diagram showing the overall structure of a plasma processing system of this embodiment.

The plasma processing system of this embodiment is a combination of the plasma processing apparatuses 71 and 71' substantially the same as those in the fifth embodiment shown in FIG. 1, and the plasma processing apparatus 91 substantially the same as that in the sixth embodiment shown in FIG. 16 described above. The same components as those in the fifth and sixth embodiments are represented by the same reference symbols and numerals and the description thereof is omitted to avoid repetition.

Referring to FIG. 23, the plasma processing system of this embodiment comprises: a plasma processing apparatus comprising three plasma processing units 95, 96, and 97; a plasma processing apparatus 91 comprising two plasma processing unit 95 and 96; and a plasma processing apparatus 71' comprising three plasma processing units 95, 96, and 97. The plasma processing system is part of a manufacturing line.

Unlike the plasma processing apparatuses 71 and 71' of the fifth embodiment-shown in FIG. 1, three plasma processing units 95 to 97 of a dual-frequency excitation type substantially identical to the plasma processing unit 95 of the sixth embodiment shown in FIG. 16 are provided instead of the plasma processing units 75 to 77. The plasma processing units 95 to 97 have substantially the same structure.

As shown in FIG. 23, an impedance meter AN is connected to each of the plasma processing units 95 to 97 via impedance measuring terminals and a switch SW3. The switch SW3 connects the impedance meter AN to a target plasma processing unit and disconnects the impedance meter AN from the rest of the plasma processing units during measurement of the impedance of the plasma processing chambers 95 to 97.

The DC-ground section of each of the plasma processing chamber units 95 to 97 of this embodiment includes: a chassis 21 and a matching box 2, each composed of copper or copper alloy, as in the sixth embodiment, but with a low-resistance portion RL composed of silver, as in the fifth embodiment; and a chamber wall 10 having the same structure as that in the fifth embodiment provided with the low-resistance portion RL composed of silver.

As in the fifth embodiment, the thickness of the low-resistance portion RL is set to be equal to or larger than the skin depth $\delta$ at the radiofrequency supplied from the RF generator 1. As in the fifth embodiment, the low-resistance portion RL is coated with an insulating film PC.

In the plasma processing system of this embodiment, a deposition process is performed on a preliminarily treated substrate 16 in the plasma processing units 95 to 97 of the plasma processing apparatus 71. Subsequently, the substrate 16 is heated in a heating unit 79 and annealed in a laser annealing unit 78. The substrate 16 is then discharged from the plasma processing apparatus 71 and transferred to another plasma processing apparatus (not shown) equivalent to the plasma processing apparatus 71 and is sequentially subjected to second and third deposition processes.

Next, a photoresist layer is formed on the substrate 16 in another apparatus (not shown) by photolithography.

The substrate 16 is then transferred into the plasma processing apparatus 91 and is subjected to plasma etching in the plasma processing units 95 and 96.

The substrate 16 discharged from the plasma processing apparatus 91 is transferred to another apparatus (not shown) where the resist layer is removed. Patterning is then performed on the substrate 16 by photolithography.

Finally, the substrate 16 is transferred into the plasma processing apparatus 71' and is sequentially subjected to first, second, and third deposition processes in the plasma processing units 95, 96, and 97, which completes the processes using the plasma processing system of this embodiment. The processed substrate 16 is then transferred to the next step of the manufacturing line.

The plasma processing system of this embodiment has the following advantages in addition to the advantages of the fifth and sixth embodiments. Since each of the chassis 21, the matching box 2, and the chamber wall 10 that constitute the DC-ground section which is the return path of the RF power supplied from the RF generator 1 has the low-resistance portion RL composed of silver having a low resistance, the RF resistance at the surfaces of the conductors constituting the RF current return path can be reduced compared to when the chassis 21, the matching box 2, and the chamber wall 10 are composed merely of the core material. As a result, the losses of the RF power supplied to the plasma generation space can be further reduced in all of the plasma processing chamber units 95 to 97, and the losses of the RF power in the overall plasma processing system can be further reduced.

Since the low-resistance surfaces RL composed of silver are covered with the insulating films PC, variation in the RF resistance over time due to oxidation or the like can be prevented in the chassis 21, the matching box 2, and the chamber wall 10 that are in the current return path. As a result, the differences in RF characteristics among the plasma processing chamber units 95 to 97 can be minimized. Since the plasma processing chamber units 95 to 97 can be adjusted using the impedance characteristic as a parameter in this plasma processing system, the plasma processing chamber units 95 to 97 can achieve a substantially uniform plasma density. Thus, the same process recipe can be applied to the plasma processing chamber units 95 to 97 of this plasma processing system so as to achieve substantially uniform plasma processing results. If deposition processes are performed in the plasma processing chamber units 95 to 97, layers having substantially uniform layer characteristics, i.e., uniform layer thickness, breakdown voltage, etching rate, and the like, can be formed. The stability of the plasma generation in the plasma processing chamber units 95 to 97 is ensured by adjusting the overall RF characteristics of the plasma processing system. Accordingly, the plasma processing system has superior operation stability because the plasma processing chamber units 95 to 97 can reliably perform substantially uniform operation.

Compared with the conventional plasma processing system, the plasma processing system of this embodiment can increase the effective power consumed in the plasma space even when the same frequency is supplied. Thus, the consumption efficiency of the power of the plasma processing system as a whole can be improved, and the same process rate and the same layer characteristics can be achieved with less power than conventionally required. These advantages can be achieved in all of the plasma processing chamber units 95 to 97. Thus, power losses and the operation cost of the plasma processing system as a whole can be reduced, thereby improving the productivity. Since the processing time is shortened and power consumption during the plasma processes is decreased, the total emission of carbon dioxide, which places a burden on the environment, can be reduced.

When the plasma processes are performed many times, the plural plasma processing chamber units 95 to 97 can stably achieve substantially uniform plasma processing results.

Furthermore, the plasma processing apparatus of the plasma processing system of this embodiment may be of an inductively coupled (ICP) type, a radial line slot antenna (RLSA) type, or the like instead of having two parallel electrodes 4 and 8. The plasma processing apparatus may also be applied to reactive ion etching (RIE).

Eighth Embodiment

The plasma processing apparatus, the plasma processing system, and the method for stabilizing them will now be described according to an eighth embodiment of the present invention.

FIG. 1 shows an outline configuration of a plasma processing apparatus 71 according to the fifth embodiment. The plasma processing apparatus 71 has a plurality of units and performs a series of production steps, for example, from depositing a polycrystalline silicon active layer to depositing a gate insulating layer of a top-gate thin-film transistor (TFT) one continuous operation.

The plasma processing apparatus 71 has a heptagonal transfer chamber 72, which is surrounded by five units, a loading chamber 73, and an unloading chamber 74. The five units consist of a first deposition unit 75 for depositing an amorphous silicon layer, a second deposition unit 76 for depositing a silicon oxide layer, a third deposition unit 77 for depositing a silicon nitride layer, a laser annealing unit 78 for annealing a substrate after deposition treatment by laser, and a heating unit 79 for heating the substrate after the deposition treatment. The first deposition unit 75, the second deposition unit 76, and the third deposition unit 77 constitute a plasma processing unit. The first deposition unit 75, the second deposition unit 76, and the third deposition unit 77 have substantially the same configuration and may be used for different processes depositing different layers or the same process according to the same process recipe.

In this embodiment, a supply line (RF supplier) is fixed with impedance adjusters (dielectric blocks) composed of an insulating material so that the RF impedance A of the supply line has a predetermined value.

A configuration of the first deposition unit 75 will now be described with reference to FIG. 2, which is an outline cross-sectional view of the plasma processing unit 75 according to the eighth embodiment.

The first deposition unit 75 (in FIG. 1) is of a single-frequency excitation type and is used for plasma treatments, such as chemical vapor deposition (CVD), sputtering, dry etching, and ashing. Referring to FIG. 2, the chamber has parallel plates electrodes 4 and 8 (the plasma excitation electrode 4 and a susceptor electrode 8), an RF generator 1 connected to the plasma excitation electrode 4 through the RF feeder 3, and a matching circuit 2A that performs the impedance matching between the first deposition unit 75 and the RF generator 1.

Referring to FIG. 2, the first deposition unit 75 has a plasma processing chamber 60. The plasma processing chamber 60 includes the plasma excitation electrode 4, connected to the RF generator 1, and a shower plate 5 at upper positions, and includes the susceptor electrode (counter electrode) 8 that holds a substrate 16 to be treated at a lower position. The shower plate 5 faces the susceptor electrode 8. The plasma excitation electrode 4 is connected to the RF generator 1 via the feeder 3 and the matching circuit 2A. Both the plasma excitation electrode 4 and the feeder 3 are covered with a chassis (shielding conductor) 21, while the matching circuit 2A is accommodated in a matching box (shielding conductor) 2 composed of a conductive material. The chassis 21 and the matching box 2 are mutually connected and function as shielding conductors. Furthermore, the matching box 2 is connected to a shield line (outer conductor) of a supplier (supply line) 1A being a coaxial cable.

The feeder 3 is formed of, for example, copper of which the surface is plated with silver and has a width of 50 to 100 mm, a thickness of 0.5 mm, and a length of 10 to 300 mm. The feeder 3 is fixed to the output terminal of a tuning capacitor 24 in the matching circuit 2A and to the plasma excitation electrode 4 at both ends with connecting means such as screws or the like.

The shower plate 5 has many holes 7 and is in contact with a projection 4a provided at the bottom face of the plasma excitation electrode 4; hence, the plasma excitation electrode 4 and the shower plate 5 form a space 6 therebetween. The space 6 communicates with a gas inlet pipe 17 that extends through the sidewall of the chassis 21 and the plasma excitation electrode 4.

The gas inlet pipe 17 is composed of a conductive material and provided with an insulator 17a in the midway inside the chassis 21, for insulating the plasma excitation electrode 4 from the gas supply side. Gas from the gas inlet pipe 17 is supplied into the plasma processing chamber 60 in a chamber wall 10 through the many holes 7 of the shower plate 5. The chamber wall 10 is insulated from the plasma excitation electrode 4 with an insulator 9. In FIG. 2, an exhaust system to be connected to the plasma processing chamber 60 is not depicted. The susceptor electrode 8 in the plasma processing chamber 60 has a disk shape and holds the substrate 16.

The susceptor electrode 8 is supported by a shaft 13 that extends through a chamber bottom 10A. The lower portion of the shaft 13 is hermetically connected to the chamber bottom 10A with a bellows 11 so that the susceptor electrode 8 and the shaft 13 can be vertically moved to adjust the distance between the parallel plates electrodes 4 and 8. As a result of the connection between the susceptor electrode 8 and the shaft 13, the susceptor electrode 8, the shaft 13, the bellows 11, the chamber bottom 10A, and the chamber wall 10 have the same DC potential. Also as a result of the connection between the chamber wall 10 and the chassis 21, the chamber wall 10, the chassis 21, and the matching box 2 have the same DC potential.

The matching circuit 2A includes a plurality of passive components for adjusting the impedance of the plasma processing chamber 60 in response to, for example, a change in plasma state in the plasma processing chamber 60. Specifically, as shown in FIG. 2, the matching circuit 2A is provided between the RF generator 1 and the feeder 3 and includes an inductance coil 23, a tuning capacitor 24 (an air variable capacitor), and a load capacitor 22 (a vacuum variable capacitor). The inductance coil 23 and the tuning capacitor 24 are directly connected between the input terminal and the output terminal of the matching circuit 2A, while the load capacitor 22 is connected in parallel to the junction between the inductance coil 23 and the input terminal. The inductance coil 23 and the tuning capacitor 24 are directly connected to each other, whereas one end of the load capacitor 22 is connected to the matching box 2 at the ground potential through a conductor. The tuning capacitor 24 lies at the tailing end of the passive components. The output terminal of the tuning capacitor 24, i.e., the output terminal PR of the matching circuit 2A is connected to the plasma excitation electrode 4 through the feeder (RF feeder) 3.

The matching box (shielding conductor) 2 is connected to the shield line of the supply line (RF supplier) 1A while the shield line is DC-grounded; the susceptor electrode 8, the shaft 13, the bellows 11, the chamber bottom 10A, the chamber wall 10, the chassis 21, and the matching box 2 have the ground potential. Also the outer end of the load capacitor 22 is DC-grounded. The susceptor electrode 8, the shaft 13, the bellows 11, the chamber bottom 10A, the chamber wall 10, the chassis 21, the matching box 2, and the shield line of the supply line 1A constitute a DC-ground section.

Figure 32:
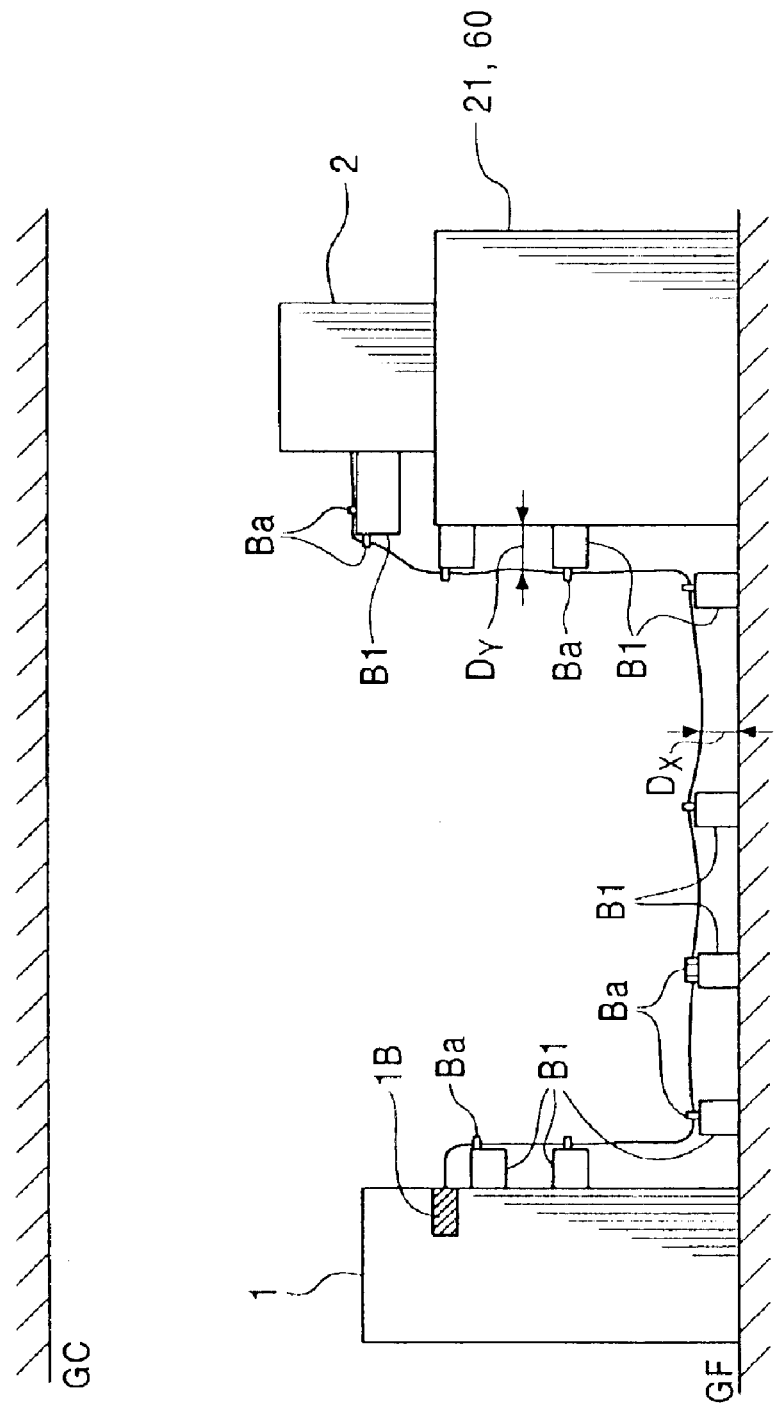
FIG. 32 is a front view showing an arrangement of a supply line of the plasma processing unit shown in FIG. 2.
Figure 33:
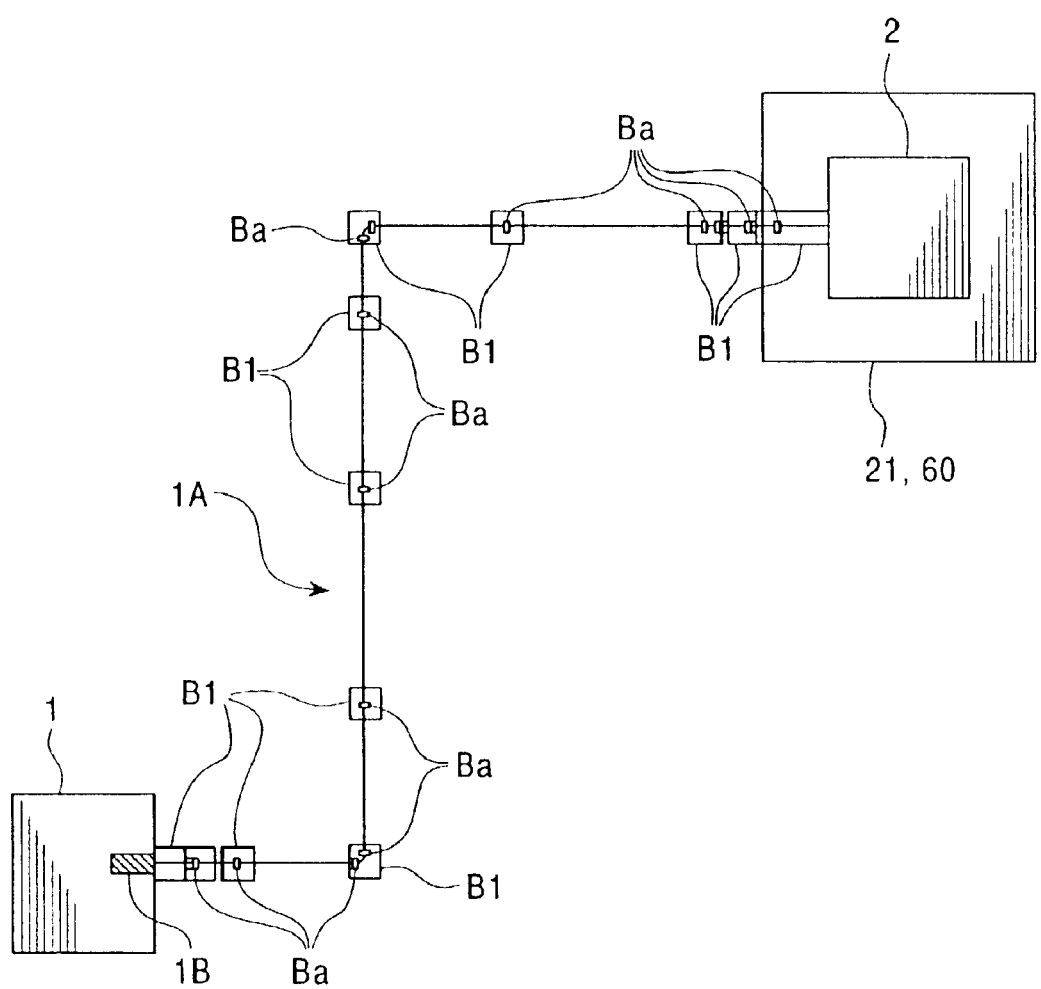
FIG. 33 is a plan view showing another arrangement of the supply line of the plasma processing unit shown in FIG. 2.
Figure 34:
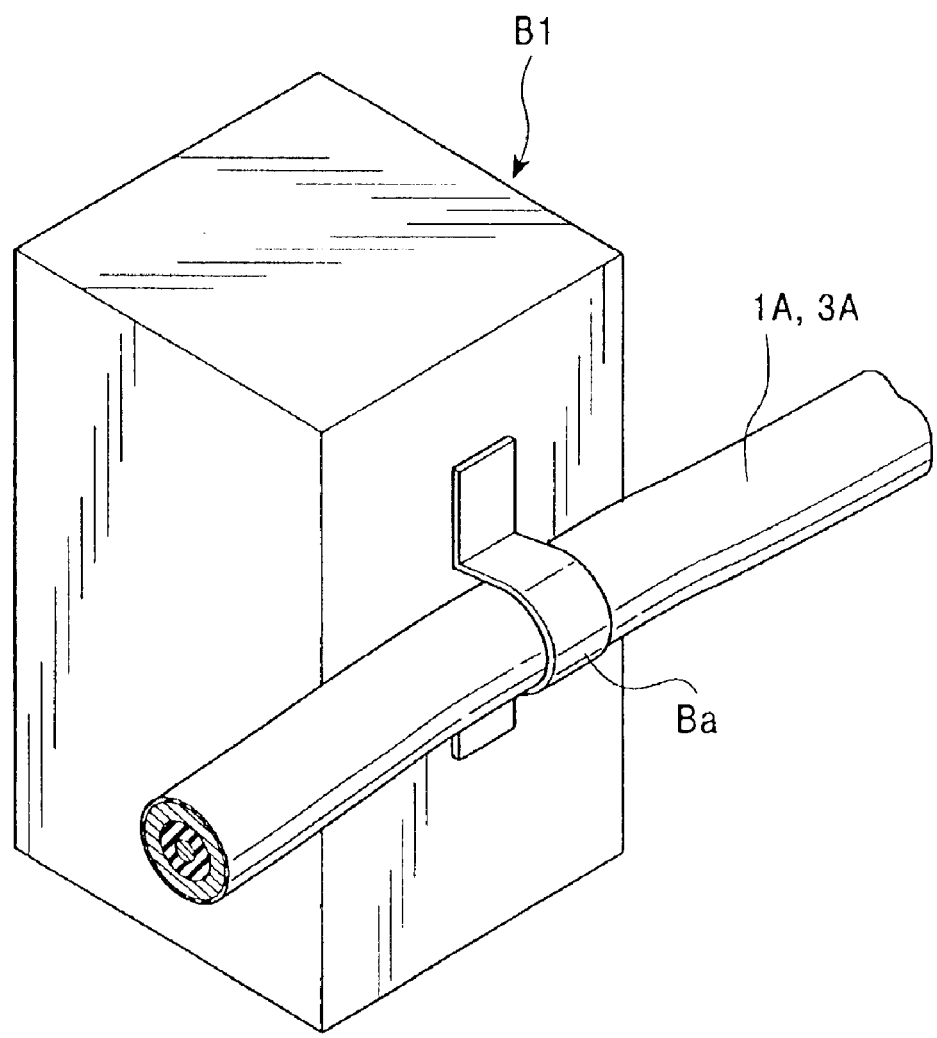
FIG. 34 is a perspective view showing the supply line shown in FIG. 32 or a feeder, and an impedance meter.
Figure 35:
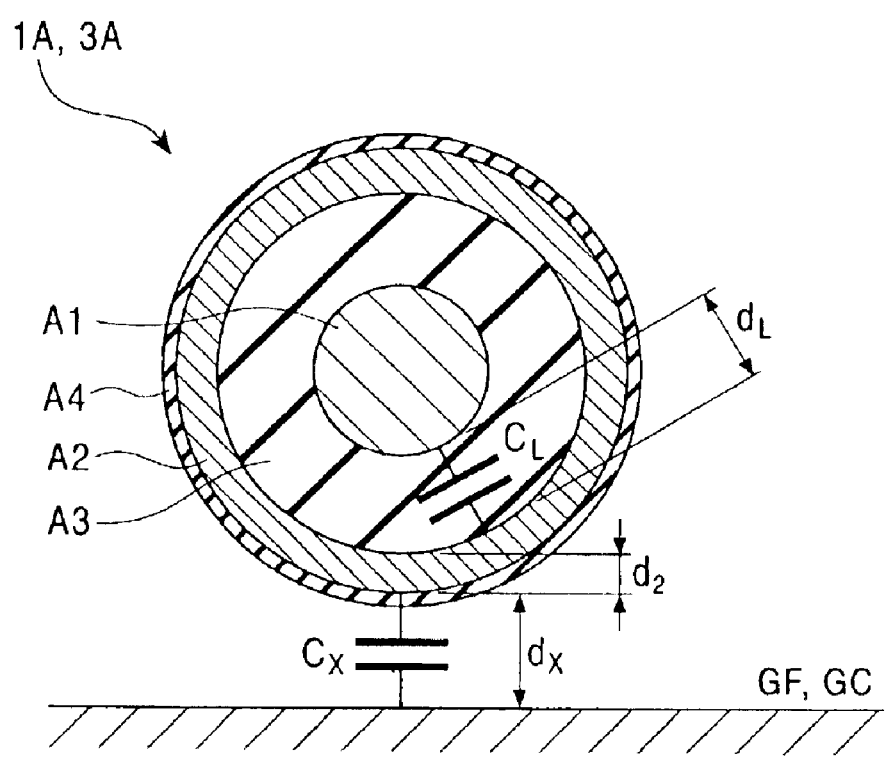
FIG. 35 is a cross-sectional view showing the supply line shown in FIG. 2 or a feeder.
Figure 36:
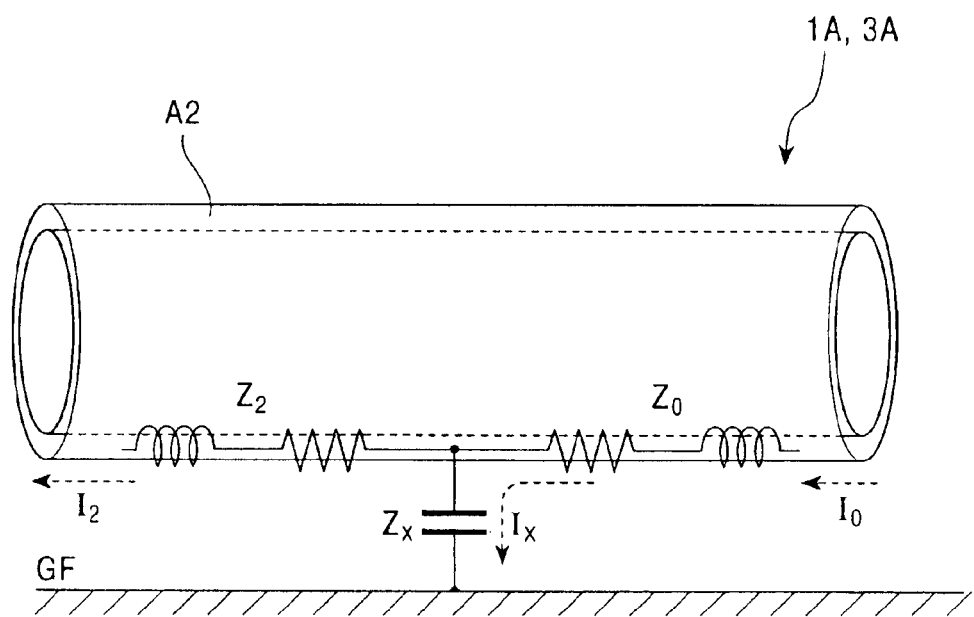
FIG. 36 is a schematic circuit diagram showing a loss current in the supply line or the feeder.
Figure 40:
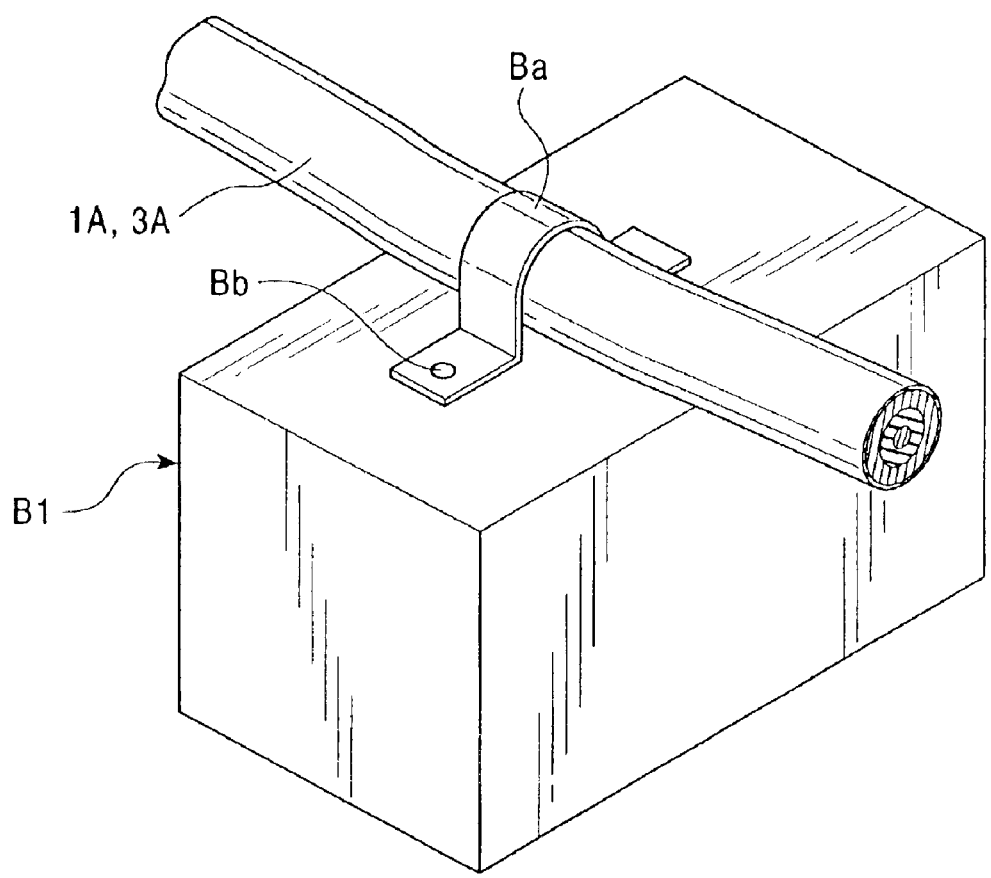
FIG. 40 is a perspective view showing the supply line shown in FIG. 32 or the feeder, and an RF impedance adjustor.
Figure 41:
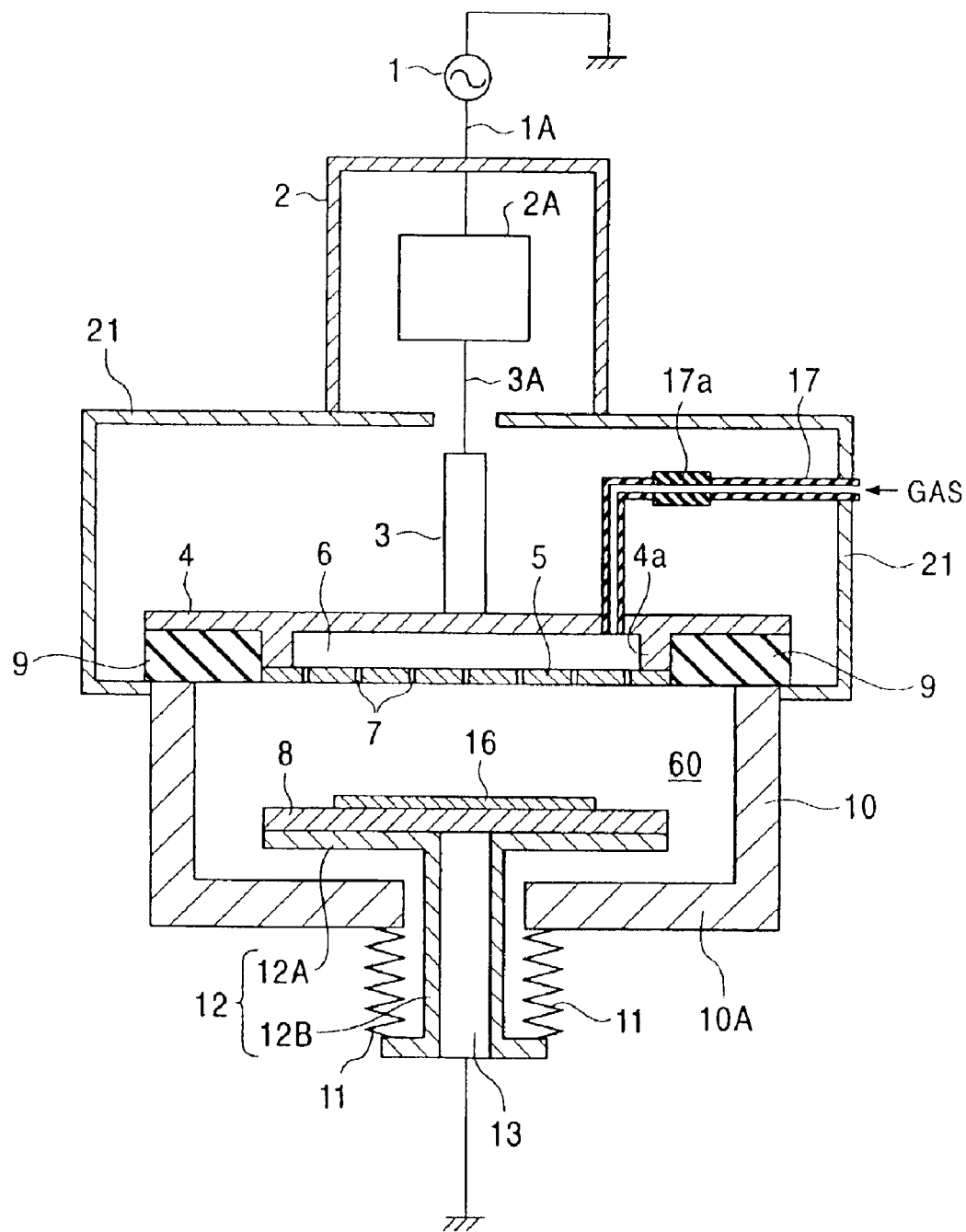
FIG. 41 is a schematic view showing an example of a known plasma processing apparatus.
Figure 42:
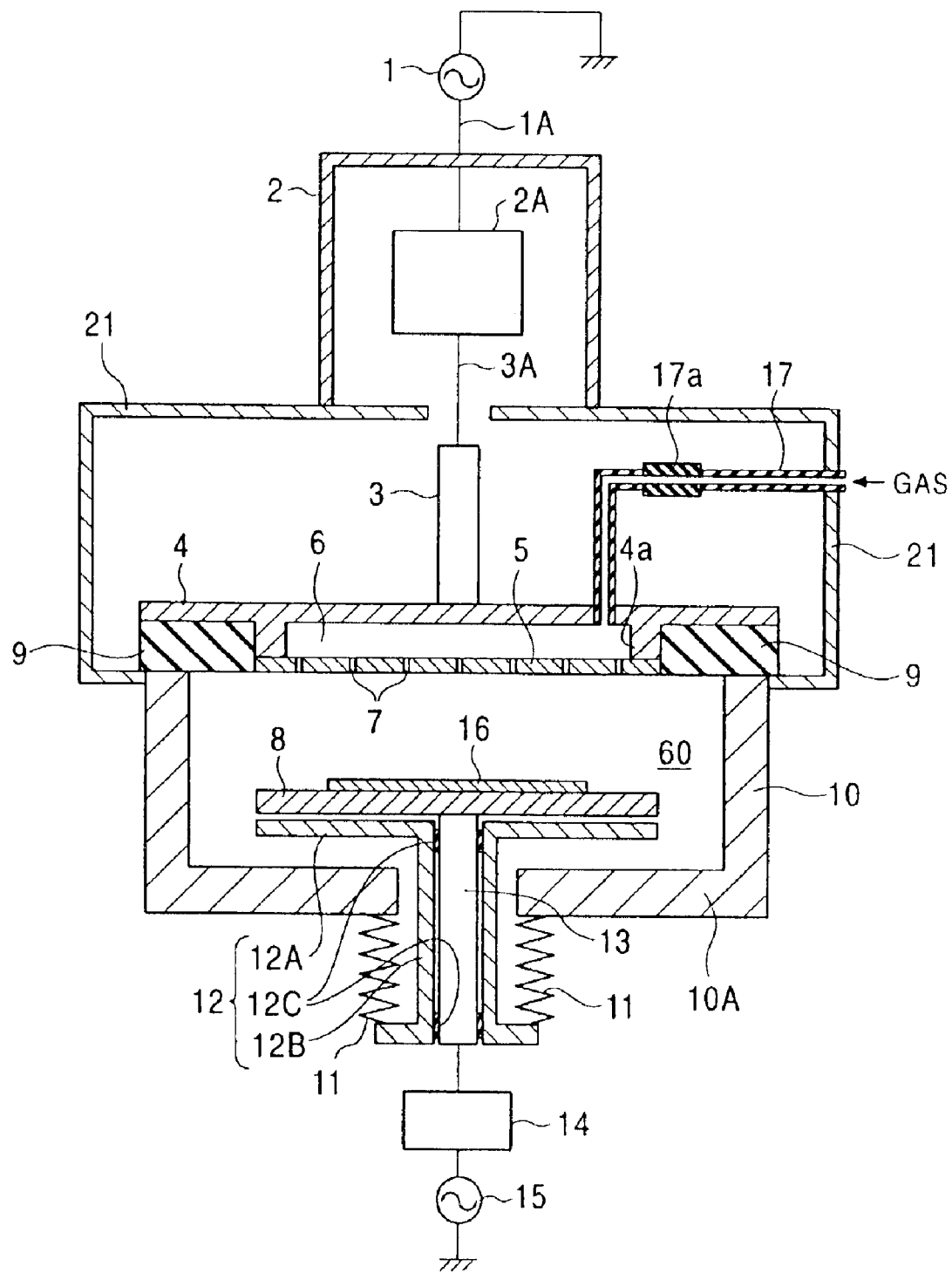
FIG. 42 is a schematic view showing another example of a known plasma processing apparatus.

The RF characteristics of the supply line (RF power supplier) 1A in the first deposition unit 75 will now be described. FIGS. 32 and 33 are a schematic front view and a schematic plan view, respectively, of a configuration of the supply line of the first deposition unit 75 shown in FIG. 2. FIGS. 34 and 40 are isometric views illustrating configurations and supply lines and RF impedance matching devices. FIG. 35 is a cross-sectional view of the supply line (supplier) shown in FIG. 2; and FIG. 36 is a schematic circuit view illustrating a loss current in a supply line.

Referring to FIG. 35, the supply line (RF supplier) 1A for the first deposition unit 75 includes an inner conductor A1, an insulator A3 around the inner conductor A1, an outer conductor (sheath line) A2 surrounding the insulator A3, and an insulating cover A4 around the outer conductor A2. The outer conductor A2 connects the ground terminal of the RF generator 1 and the matching box 2. The thickness of the insulator A3, i.e., the distance between the inner conductor A1 and the insulator A3 is $d_L$, and the thickness of the outer conductor A2 is $d_2$.

Referring to FIGS. 32 and 33, the supply line 1A extends along a floor GF for connecting the RF generator 1 and the matching box 2 that are separately arranged on the floor GF. More specifically, the supply line 1A is fixed, with a plurality of RF impedance adjusters B1 (dielectric blocks), to a side wall of the RF generator 1, the floor GF, the outer faces of the chamber wall 10 and the chassis 21 of the plasma processing chamber 60, and an outer face of the matching box 2, at a given distance from these components at the ground potential portions or the substantial ground potential portions of these components. The ground potential portions include the floor GF, the matching box 2, the chassis 21, and the chamber wall 10.

Referring to FIGS. 32 to 34, each of the RF impedance adjusters B1 is a substantially rectangular dielectric block and is provided with a fixer Ba attached on one face of the dielectric block B1 for fixing the RF generator 1. The dielectric block B1 and the fixer Ba composed of, for example, polytetrafluoroethylene, poly(fluoromethylene), Delrin, or polypropylene.

The bottom face of each dielectric block B1 is fixed to, the RF generator 1, the floor GF, the chassis 21, or the matching box 2. Preferably, the dielectric block B1 has strength that is enough to support the weight of the supply line 1A and itself and height to sufficiently separate the supply line 1A from the surface of the corresponding ground potential portion.

The fixer Ba tightly fixes the supply line 1A to the surface of the dielectric block B1 so that the RF impedance A of the supply line 1A does not change. The fixer Ba may be an adhesive tape, a plastic sheet or plate provided with an adhesive layer, or a U-shaped resin fixer that can be inserted into the dielectric block B1. Alternatively, the fixer Ba may be a combination of a plastic plate and plastic screws. The plastic plate may be composed of polytetrafluoroethylene and the plastic screws may be composed of polyphenylene sulfide.

Referring to FIG. 32, the dielectric blocks B1 are arranged on the floor GF between the RF generator 1 and the plasma processing chamber 60. The supply line 1A lies on the dielectric blocks B1 at least at a distance $D_x$ from the floor GF. Referring to FIG. 33, the supply line 1A may be bent if no straight arrangements are possible between the RF generator 1 and the plasma processing chamber 60. Also, on the side wall of the RF generator 1 and the outer faces of the matching box 2, the chassis 21, and the chamber wall 10, the supply line 1A lies at least at a distance $D_y$ from the wall and the faces.

Referring to FIGS. 35 and 36, in the RF current circuit supplied during plasma generation, possible RF factors caused by the outer conductor A2 of the supply line 1A are as follows:

(1) RF impedance $Z_0$ including inductance and, resistance at the conductor A2 in which a current $I_0$ from the susceptor electrode 8 does not shunt to the ground potential floor GF;

(2) Loss capacitance $C_x$ generated between the outer conductor A2 of the supply line 1A and the floor GF;

(3) Impedance $Z_x$ including the loss capacitance $C_x$ and generating a shunt;

(4) RF impedance $Z_2$, including inductance and resistance, corresponding to a current $I_2$ from the outer conductor A2 of the supply line 1A to the ground of the RF generator 1; and (5) Capacitance $C_L$ between the outer conductor A2 and the inner conductor A1 of the supply line 1A.

As shown in FIG. 35, these RF factors form an equivalent circuit. Specifically, the RF impedance $Z_0$ and the RF impedance $Z_2$ are connected in series, one end thereof being grounded, while the impedance $Z_x$ such as the loss capacitance $C_x$ is connected in parallel, one end thereof being grounded. In this equivalent circuit, the current $I_0$ from the susceptor electrode 8 includes the $I_2$ returning to the ground of the RF generator 1 and the loss current $I_x$ shunting to other portions:

$$I_0 = I_2 + I_x \tag{14}$$

As shown in FIGS. 35 and 36, the supply line 1A generates the loss capacitance $C_x$ between the outer conductor A2 and the ground potential portions, such as the floor GF, the matching box 2, the chassis 21, and the chamber wall 10. The loss capacitance $C_x$ increases in inverse proportion to the distance between the outer conductor A2 and the ground potential portions.

The minimum distance $D_x$ between the outer conductor A2 and floor GF is, for example, 10 cm or preferably 20 cm. Similarly, the minimum distance $D_y$ between the outer conductor A2 and the matching box 2 is, for example, 10 cm or preferably 20 cm. Accordingly, the distance between the outer conductor A2 of the supply line 1A and the ground potential portions is set at 10 cm and more preferably 20 cm over the entire length. The loss capacitance $C_x$, thereby, can be reduced to a considerably smaller level compared with the capacitance $C_L$ between the outer conductor A2 of the inner conductor A1 of the supply line 1A.

Thus, the impedance between the outer conductor A2 and each ground potential portion GF, 2, 21, or 10 is considerably smaller than that between the outer conductor A2 and the inner conductor A1 of the supply line 1A. The impedance Z ($\Omega$) is represented by Formula (11):

$$Z \propto -j/\omega C \tag{11}$$

wherein j is imaginary unit ($j^2 = -1$), $\omega$ is angular frequency ($\omega = 2\pi f_e$, wherein $f_e$ is the power frequency), and C is capacitance. Thus, the impedance Z is determined by defining the capacitance C. Since the current is in reverse proportion to the impedance Z, a large impedance leads to an increase in the shunt of the loss current $I_x$ compared with the return current $I_2$ to the ground of the RF generator 1.

In the above embodiment, the supply line 1A lies above the floor GF. Alternatively, the floor GF may have a grating structure in which a space is provided under the floor GF for accommodating the supply line 1A. In such a case, the supply line 1A preferably has a distance from the bottom and sides of the grating that is equal to or larger than the minimum distance $D_x$.

In the first deposition unit 75 of this embodiment, the distance between the outer conductor A2 of the supply line 1A and the ground potential portions GF, 2, 21, and 10 is maintained at a predetermined level over the entire length so that the RF impedance A of the supply line 1A is a considerably high value; hence, the loss current $I_x$ is suppressed. If RF power with an increased plasma excitation frequency is fed from the RF generator 1, the plasma current decreased due to an increased impedance $Z_0$ in the supply line 1A. In this embodiment, however, a change in the plasma current due to a change in the impedance $Z_x$ is suppressed if the plasma current is reduced for the above reason. Thus, the power fed into the plasma space is stable.

Furthermore, reduced energy loss and reduced plasma current loss cause increased power supply into the plasma generating space in the plasma processing chamber 60. Thus, the plasma generating space in this embodiment more effectively consumes RF power compared with conventional plasma processing apparatuses if the same frequency is applied. The plasma processing unit in this embodiment can form a layer at an increased deposition rate.

Ad described above, the supply line 1A is fixed in consideration of the RF impedance A. This facilitates the overall control of RF characteristics at positions that are out of consideration in conventional apparatuses. Accordingly, the plasma processing apparatus is highly stable during operation for generating a plasma.

As a result, the loss current $I_x$ that shunts to the ground potential portions such s floor GF, the matching box 2, the chassis 21, and the chamber wall 10 is reduced relative to the plasma current $I_e$ fed into the plasma generating space. Thus, the RF power is effectively and stably fed into the plasma generating space. The plasma generating space in this embodiment, therefore, more effectively consumes RF power compared with conventional plasma processing apparatuses if the same frequency is applied.

The stabilized RF power consumption in the plasma space causes uniform planar plasma processing on the substrate 16 and specifically the formation of a layer with a uniform thickness in a deposition treatment.

Also the stabilized RF power consumption in the plasma space contributes to an improvement in quality of the layers deposited by deposition processes such as plasma enhanced CVD and sputtering, for example, insulating breakdown voltage of the deposited layer, etching resistance to etching solutions, and compactness and hardness of the layer (formation of a dense layer). The compactness and hardness can be evaluated by etching resistance to a BHF solution.

Furthermore, a layer having film characteristics comparable to that by conventional apparatuses is readily formed with an increased processing rate and decreased RF power input. Accordingly, this apparatus contributes to reduced RF power loss, reduced operation costs, increased production output, decreased processing time, and reduced carbon dioxide emission.

The control of the minimum distance $D_x$ between the supply line 1A and the floor GF and the minimum distance $D_y$ between the supply line 1A and the ground potential portions prevents a change in the RF impedance of the supply line 1A over time. Thus, the plasma processing apparatus of this embodiment exhibits high stability during one plasma operation and high reproducibility during repeated plasma operations. Accordingly, the frequency of the time-consuming maintenance of the plasma processing apparatus can be reduced since the maintenance usually includes checking of the apparatus by treating actual substrates and adjusting the apparatus.

In the plasma processing apparatus 71 shown in FIG. 1, the second deposition unit 76 and the third deposition unit 77 have substantially the same structure as that of the first deposition unit 75. The RF impedance A of the second deposition unit 76 and the RF impedance A of the third deposition unit 77 are set as in the first deposition unit 75. Specifically, the RF frequency $f_e$ is set to 40.68 MHz for these deposition units 75 to 77 to measure the RF impedance A of the supply line 1A of each chamber; however, the RF impedance A of the supply line 1A is an RF characteristic depending on many factors such as the length of the supply line 1A and the mechanical structure and may be different among the apparatuses.

The relationship between the maximum Amax and the minimum A min among the RF impedance $A_{75}$ of the first deposition unit 75, the RF impedance $A_{76}$ of the second deposition unit 76, and the RF impedance $A_{77}$ of the first deposition unit 77 is represented by Equation 20A:

$$<A> = (A\max - A\min)/(A\max + A\min) \quad (20A)$$

In this embodiment the ratio <A> indicating variation in RF impedance A is set to 0.10 or less. If the ratio <A> is controlled to 0.10 or less, the variation in thickness of layers formed in the deposition units 75 to 77 under the same conditions is ±5% or less.

For example, the ratio <A> is controlled as follows:
1. Adjusting the distance between the supply line 1A and each ground potential portion GF, 2, 21, or 10 with the dielectric block B1; and
2. Adjusting the position and the configuration of the supply line 1A (such as distribution path without looping).

For deposition of an amorphous silicon layer, a silicon oxide layer, or a silicon nitride layer in any one of the plasma processing units 75, 76, and 77, the substrate 16 is placed onto the susceptor electrode 8, and RF power is fed between the plasma excitation electrode 4 and the susceptor electrode 8 through the RF generator 1 while a reactive gas is fed into the plasma processing chamber 60 from the gas inlet pipe 17 through the shower plate 5 to generate a plasma. An intended layer is thereby formed on the substrate 16.

Referring to FIG. 6, the laser annealing unit 78 in FIG. 1 has a laser light source 81 on an upper chamber wall 80 and a stage 82 on the lower chamber wall in the chamber. The stage 82 holds the substrate 16 and can move horizontally in the X and Y directions. A spot laser light beam 83 is emitted from a window 81a of the laser light source 81 while the stage 82 holding the substrate 16 moves in the X and Y directions so that the laser light beam 83 scans across the entire surface of the substrate 16. The laser light source 81 may use halogen gases, such as XeCl, ArF, ArCl, and XeF.

The laser annealing unit 78 may have any configuration as long as the laser light beam scans across the entire surface of the substrate to be treated. The laser light source 81 may be of any different type, for example, a YAG laser. The laser beam may be a pulsed laser beam or a continuously oscillated laser beam.

Referring to FIG. 7, the heating unit 79 is a multideck heating furnace having many multideck heaters 85 that hold substrates 16. These substrates 16 are heated by the heaters 85. The heating unit 79 is connected to the transfer chamber 72 shown in FIG. 1 via a gate valve 86.

Referring again to FIG. 1, a loading cassette and an unloading cassette are provided in the loading chamber 73 and the unloading chamber 74, respectively. These cassettes are detachable and can contain a plurality of substrate 16: The loading cassette holds untreated substrates 16 whereas the unloading cassette holds treated substrates 16. The transfer chamber 72 surrounded by the processing units, the loading chamber 73, and the unloading chamber 74 has a transfer robot 87 for transferring these substrates 16. The transfer robot 87 has an extendable and rotatable arm 88 that holds and transfers the substrates 16 at its end.

The plasma processing apparatus 71 is preliminarily set by an operator with respect to the film deposition conditions, the annealing conditions, the heat treatment conditions, the processing sequence, and the like of each plasma processing unit; however, the plasma processing apparatus 71 is automatically operated by a controller. In use of the plasma processing apparatus 71, an untreated substrate 16 is placed on a loading cassette. Upon the operation of a start switch by the operator, the substrate 16 is transferred from the loading cassette to each processing chamber by the transfer robot 87. After processing in each chamber, the substrate 16 is placed onto the unloading cassette.

In the plasma processing apparatus 71 and the method for stabilizing the apparatus in this embodiment, the ratio <A> relating to the maximum and the minimum among the RF impedances A of the supply lines 1A of the plasma processing units 75, 76, and 77 is defined as shown in Equation (20A) above. This ratio is set to 0.10 or less so as to minimize differences in the RF characteristics and effective power loss in the plasma space between these deposition units 75 to 77.

As a result, the same process recipe can be applied to these deposition units 75 to 77 in order to achieve substantially the same plasma processing results. For example, when these units 75 to 77 are used in film deposition, the deposited films have substantially the same properties, i.e., thickness, breakdown voltage, and etching rate. More specifically, the ratio <A> of 0.10 or less can reduce the variation in thickness of layers formed in the deposition units 75 to 77 under the same conditions to ±5% or less.

Also the averaged RF power consumption among the plasma processing units contributes to an improvement in quality of the layers deposited by deposition processes such as plasma enhanced CVD and sputtering, for example, insulating breakdown voltage of the deposited layer, etching resistance to etching solutions, and compactness and hardness of the layer (formation of a dense layer). The compactness and hardness can be evaluated by etching resistance to a BHF solution.

RF characteristics are not taken into account in conventional plasma processing apparatuses; however, the ratio <A>, which represents the variation in RF impedance of the supply line 1A, among the RF characteristics is controlled in the plasma processing apparatus 71 of this embodiment. Accordingly, the plasma processing apparatus is highly stable during operation for generating a plasma, and the plasma processing units 75, 76, and 77 in the plasma processing apparatus 71 are operated under substantially the same condition.

The first to third plasma processing units 75 to 77 according to this embodiment can be readily adjusted without actual film deposition and evaluation in these chambers and adjustment of these units based on enormous amounts of data on the process conditions.

Thus, in installation of new systems and adjustment and inspection of installed systems, the time required for achieving substantially the same results using the same process recipe in these plasma processing units 75, 76, and 77 can be significantly reduced compared with an inspection method by actual deposition onto the substrate 16. Moreover, this evaluation method can directly evaluate this plasma processing system in situ in a short period of time, instead of a two-stage evaluation, i.e., processing of the substrates and confirmation and evaluation of the operation of the plasma processing system based on the evaluation of the processed substrates. In this embodiment, inspection by layer deposition on substrates is performed to determine the process recipe when the plasma processing apparatus is installed. Since the plasma processing units 75, 76, and 77 have the same radiofrequency characteristics, the layer deposition may be performed in only one of the chambers. In the maintenance of the plasma processing apparatus, actual layer deposition is not required because the radiofrequency characteristics of the plasma processing units are controlled within the predetermined value. In contrast, in conventional methods by actual layer deposition on substrates, these plasma processing units must be independently evaluated.

Accordingly, the inspection method of this embodiment does not require a shutdown of the production line for several days to several weeks to check and evaluate the operation of the plasma processing system. The production line, therefore, has high productivity with reduced expenses for substrates used in the inspection, processing of these substrates, and labor during the inspection operations.

In this embodiment, the substrate 16 is held on the susceptor electrode 8 while the RF impedance <A> is adjusted for the plasma excitation electrode 4; however, the substrate 16 may be provided at the cathode 4 so that the first deposition unit 75 is used for reactive ion etching (RIE).

Ninth Embodiment

A plasma processing apparatus and system, and a method for stabilizing the plasma processing apparatus and system according to a ninth embodiment of the present invention will now be described with reference to the drawings. FIG. 16 is a cross-sectional view showing the overall structure of a plasma processing apparatus 91 of this embodiment.

As shown in FIG. 16, the plasma processing apparatus 91 of this embodiment comprises a substantially square transfer chamber 92, a load lock chamber 93, a heating unit 99, and plasma processing units 95 and 96. The load lock chamber 93, the heating unit 99, and the plasma processing units 95 and 96 surround the transfer chamber 92, which is disposed at the center of the apparatus. A transfer robot is installed in the transfer chamber 92. Gates g1, g2, g3, and g4 are installed between the transfer chamber 92 and the load lock chamber 93, the heating unit 99, the plasma processing unit 95, and the plasma processing unit 96, respectively. The transfer chamber 92, the heating unit 99, and the plasma processing units 95 and 96 are evacuated to a high vacuum by respective high-vacuum pumps. The load lock chamber 93 is evacuated to a low vacuum by a low-vacuum pump.

The components of the plasma processing apparatus 91 of this embodiment correspond to those of the plasma processing apparatus 71 of the eighth embodiment shown in FIGS. 1, 2, 6, 7, 32–36, and 40. In particular, the transfer chamber 92 corresponds to the transfer chamber 72 in the eighth embodiment, the heating chamber 99 corresponds to the heating chamber 79 in the eighth embodiment, and the load lock chamber 93 corresponds to the loading chamber 73 in the eighth embodiment. The description of the similar components is omitted to avoid repetition.

The plasma processing units 95 and 96 correspond to the plasma processing units (plasma chambers) 75 and 76 in the eighth embodiment. The plasma processing units 95 and 96 have substantially the same structure and may perform either different types of processes to deposit different types of layers or the same process using the same process recipe.

In each of the plasma processing units 95 and 96, the supply line 1A is fixed at a predetermined position with a plurality of RF impedance adjustors (dielectric blocks) B1 and a plurality of RF impedance adjustors (dielectric suspenders) B2.

The structure of the plasma processing apparatus is described below using the plasma processing unit 95 as an example.

FIG. 17 is a cross sectional view showing the overall structure of the plasma processing unit 95 of this embodiment. FIG. 12 is a front view showing the arrangement of the supply line (RF supplier) 1A in the plasma processing unit 95 of this embodiment.

The plasma processing unit 95 of this embodiment is of a dual-frequency excitation type. The plasma processing unit 95 differs from the plasma processing unit 75 of the eighth embodiment in that power is also supplied to the susceptor electrode 8. The structures of the chassis 21 and the matching box 2 are also different from those of the eighth embodiment. Other corresponding components are represented by the same reference numerals and symbols and description thereof is omitted to avoid repetition.

Figure 37:
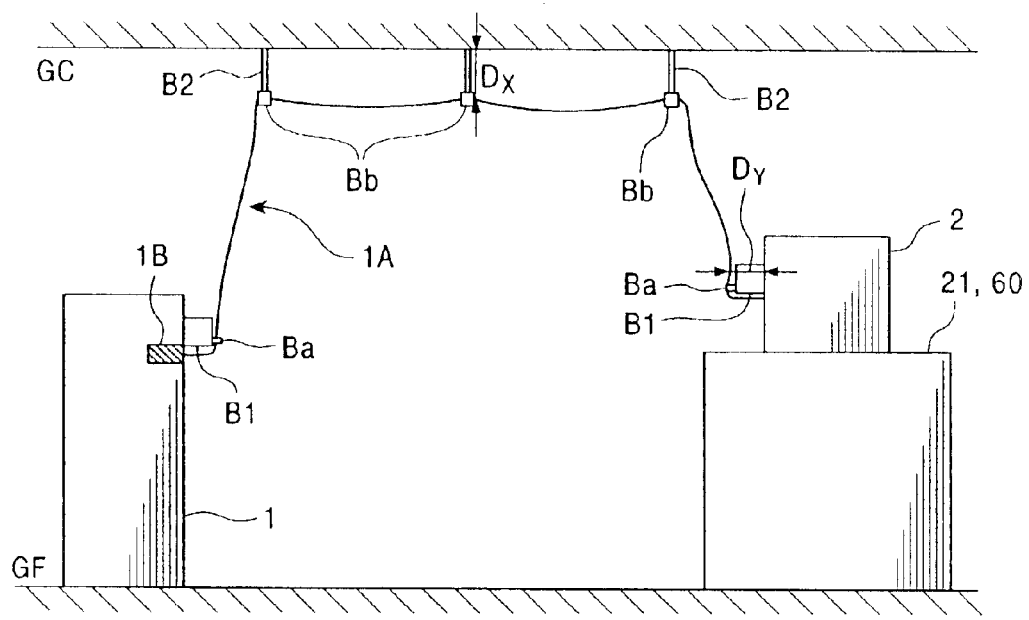
FIG. 37 is a front view showing an arrangement of the supply line in the plasma processing unit of a plasma processing apparatus according to the ninth embodiment of the present invention.
Figure 38:
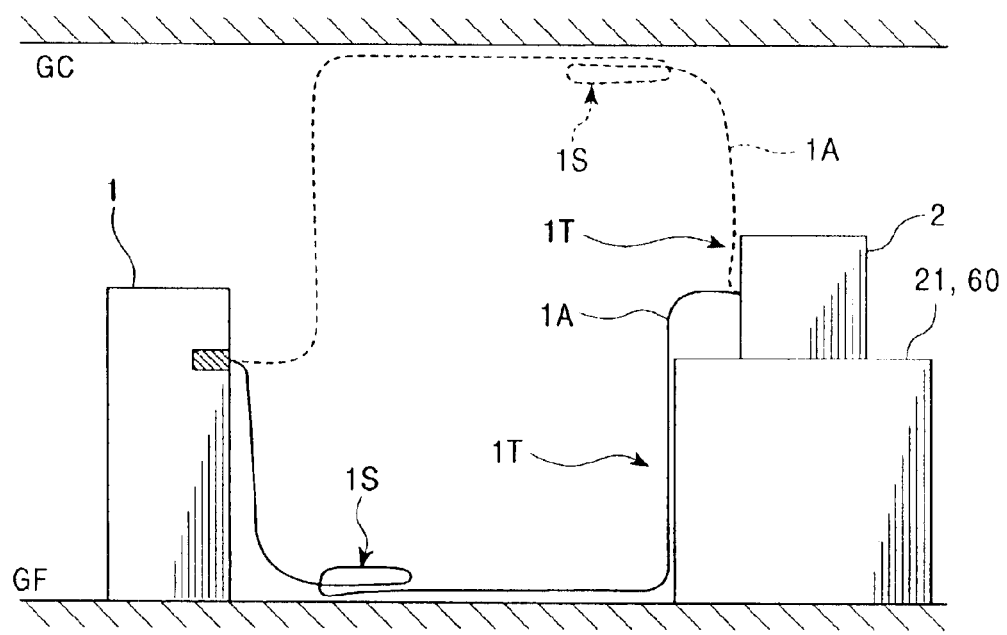
FIG. 38 is a plan view showing a known arrangement of the supply line shown in FIGS. 41 and 42.
Figure 39:
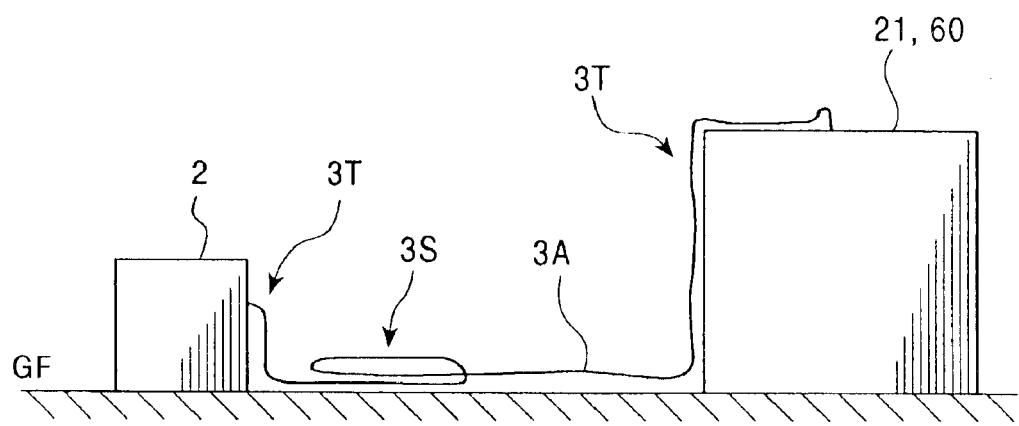
FIG. 39 is a plan view showing a known arrangement of the feeder shown in FIGS. 41 and 42.

In each of the plasma processing units 95 and 96 of this embodiment, the supply line 1A is fixed to a ceiling GC with the dielectric suspenders B2, as shown in FIG. 37. The ceiling GC is the ground position.

Referring now to FIG. 17, the plasma processing unit 95 comprises a susceptor shield 12 disposed under a susceptor electrode 8. The gap between the susceptor electrode 8 and the susceptor shield 12 is vacuum-sealed and electrically isolated by insulation means 12C, composed of an insulating material, provided around a shaft 13. The susceptor electrode 8 and the susceptor shield 12 can be moved vertically by the bellows 11 which controls the distance between plasma excitation electrodes 4 and 8. The susceptor electrode 8 is connected to a second RF generator 27 via a feed plate 28 connected to the bottom end of the shaft 13 and a matching circuit 25 housed in a susceptor-electrode-side matching box 26 composed of a conductor.

The feed plate 28 is, for example, a silver-plated copper plate having a width of 50 to 100 mm, a thickness of 0.5 mm, and a length of 100 to 300 mm. The feed plate 28 is detachably attached to the output terminal of a tuning capacitor 310 of the matching circuit 25 described below and to the bottom end of the shaft 13 with connecting means such as screws.

The feed plate 28 is covered with a chassis 29 connected to the bottom end of a supporting tube 12B of the susceptor shield 12. The chassis 29 is connected to a shielding line of a supply line 27A, which is a coaxial cable. The chassis 29 and the matching box 26 are grounded through the shielding line of the supply line 27A. As a result, the susceptor shield 12, the chassis 29, and the matching box 26 have the same DC potential. The supply line 27A is a coaxial cable identical to the shielding line (outer conductor) A2 of the supply line 1A of the eighth embodiment shown in FIGS. 34 to 36.

The matching circuit 25 performs impedance matching between the second RF generator 27 and the susceptor electrode 8. As shown in FIG. 17, a plurality of passive elements, i.e., a tuning coil 30 and the tuning capacitor 310 are connected in series between the second RF generator 27 and the feed plate 28, and a load capacitor 32 is connected to the second RF generator 27 and the feed plate 28 in parallel. One end of the load capacitor 32 is connected to the matching box 26. The matching circuit 25 has substantially the same structure as that of the matching circuit 2A. Since the matching box 26 is grounded through the shielding line of the supply line 27A, the above one end of the load capacitor 32 is also grounded. Various other arrangements such as connecting another tuning coil in series to the tuning coil 30 and connecting another load capacitor in parallel to the load capacitor 32 are possible.

In operating the plasma processing unit 95, a workpiece, i.e., a substrate 16, is placed on the susceptor electrode 8, RF power is supplied to both the plasma excitation electrode 4 and the susceptor electrode 8 from the RF generator 1 and the second RF generator 27, respectively, while producing a plasma by feeding a reaction gas into a plasma processing chamber 60 from a gas feeding tube 17 through a shower plate 5 so as to perform a plasma process such as layer deposition or the like on the substrate 16. During the operation, RF power having a frequency of 13.56 MHz or more, for example, 13.56 MHz, 27.12 MHz, or 40.68 MHz, is supplied from the RF generator 1. The frequency of the power supplied from the second RF generator 27 may be the same as or different from that supplied by the RF generator 1. For example, the power having a frequency of 1.6 MHz may be supplied from the second RF generator 27.

Referring to FIGS. 17 and 37, the matching box 2 and the matching circuit 2A are separated from the RF generator 1. The supply line 1A that connects an output terminal 1B of the RF generator 1 to the matching circuit 2A is routed along the ceiling GC. Part of the supply line 1A is fixed to a side face of the RF generator 1 and to the surface of the matching box 2 with a predetermined distance therebetween using the dielectric blocks B1 of the eighth embodiment shown in FIGS. 32 to 34. Here, the side face of the RF generator 1 and the surface of the matching box 2 are the ground position or equivalent to the ground position.

The supply line 1A is also fixed to the ceiling GC, i.e., the ground position, with a predetermined distance therebetween using the dielectric suspenders B2.

As shown in FIG. 37, the dielectric suspenders B2 are sequentially installed on the ceiling GC between the RF generator 1 and the plasma processing chamber 60. The supply line 1A is supported at the lower ends of the dielectric suspenders B2 in a manner such that the distance between the 1A and the ceiling GC is at least $D_X$. If the RF generator 1 and the plasma processing chamber 60 are not on a straight line, the installation arrangement can be adjusted as in the eighth embodiment shown in FIG. 33.

The supply line 1A is also fixed to the side surface of the RF generator 1 and the side surface of the matching box 2 using the dielectric blocks B1. The distances between the supply line 1A and each of these side surfaces are at least $D_Y$.

As shown in FIG. 37, each of the dielectric suspenders B2 is constituted from a dielectric rod composed of polytetrafluoroethylene (poly(difluoromethylene)), Delrin (registered trademark), polypropylene, or the like, and a fixer Bb composed of the same material as the dielectric rod. The fixer Bb is installed at the lower end of the dielectric rod and holds the supply line 1A.

The upper end of the dielectric rod of each dielectric suspender B2 is fixed to the ceiling GC, which is a ground position. The length of the dielectric rod is preferably sufficiently large to secure a sufficient distance between the ceiling GC and the supply line 1A.

The fixer Bb fixes the supply line 1A to the lower end of the dielectric rod. The fixer Bb may be adhesive tape attachable to the lower end of the dielectric rod, a plastic plate coated with a resin adhesive or the like, a letter-U shaped resin pipe which can be inserted into the dielectric rod, a string that can tie the supply line 1A, or a polytetrafluoroethylene plate joined with screws composed of a plastic material such as polyphenylene sulfide.

Referring to FIG. 37, in the circuit of the plasma processing unit 95 including the supply line 1A, loss capacitance $C_X$ is generated between the outer conductor A2 of the supply line 1A and the ground position, such as the ceiling GC, the matching box, and the like. The loss capacitance $C_X$ is inversely proportional to the distance between the outer conductor A2 and the ground position such as the ceiling GC and the matching box 2.

The minimum distance $D_X$ between the outer conductor A2 and the ground position (ceiling) GC described above is preferably 10 cm, and more preferably, 20 cm, for example. The minimum distance $D_Y$ between the outer conductor A2 and the side surface of the ground position (matching box) 2 is preferably 10 cm, and more preferably 20 cm, for example. In other words, the minimum distance between the ground position and the outer conductor A2 of the supply line 1A over the entire length of the supply line 1A is adjusted to, for example, 10 cm, and more preferably 20 cm.

In the above structure, the loss capacitance $C_X$ is sufficiently smaller than the capacitance $C_L$ between the inner conductor A2 and the outer conductor A2 of the supply line 1A. Thus, the RF impedance A of the supply line 1A can be large enough to prevent the loss current $I_X$ from shunting into the ceiling GC. As a result, losses of the effective energy supplied to the plasma generation space and losses of the plasma current can be reduced, the power can be effectively fed to the plasma generation space in the plasma processing chamber 60, and the stability of the effective power consumed in the plasma space can be improved compared with a known plasma processing apparatus when the same frequency is supplied. When layer deposition is performed, uniformity in the deposition rate can be improved, and the plasma processing apparatus can be stably operated.

Referring now to FIG. 16, in operating the plasma processing apparatus 91 comprising the plasma processing units 95 and 96 having the above-described structure, a gate go is opened to transfer the substrate 16 into the load lock chamber 93. The load lock chamber 93 is then closed and evacuated using a low-vacuum pump. The gates g1 and g2 are opened, and the substrate 16 in the load lock chamber 93 is transferred into the heating unit 99 by a transfer arm of the transfer robot in the transfer chamber 92. The gates g1 and g2 are closed and the transfer chamber 92 and the heating unit 99 are evacuated using a high-vacuum pump. The substrate 16 is heated, the gates g2 and g4 are opened, and the heated substrate 16 is transferred into the plasma processing unit 95 by the transfer arm of the transfer robot in the transfer chamber 92. The heated substrate is subjected to a reaction process in the plasma processing unit 95. Upon completion of the plasma process, the gates g4 and g3 are opened and the processed substrate 16 is transferred into the plasma processing unit 96. Upon completion of the plasma process in the plasma processing unit 96, the gated g3 and g1 are opened and the processed substrate 16 is transferred to the load lock chamber 93 by the transfer arm of the transfer robot in the transfer chamber 92.

The operation of each section is automatically controlled by a control unit except for the process conditions such as deposition conditions of the respective processing units and the processing sequence, which are set by an operator. In using the plasma processing apparatus 91 of this embodiment, the operator need only place an unprocessed substrate 16 in a loading cassette of the load lock chamber 93 and operating a start switch. After operating the start switch, the unprocessed substrate 16 is transferred from the loading cassette to each of the processing units by the substrate transfer robot, and upon completion of a series of processes performed automatically in each of the processing units, the processed substrate 16 is placed in an unloading cassette (loading cassette) by the substrate transfer robot.

As in the eighth embodiment, in the plasma processing units 95 and 96, the substrate 16 is placed on the susceptor electrode 8, RF power is supplied to both the plasma excitation electrode 4 and the susceptor electrode 8 from the RF generator 1 and the second RF generator 27, respectively, while feeding a reactive gas into the plasma processing chamber 60 through the shower plate 5 from the gas feeding tube 17 to generate a plasma. An amorphous silicon layer, a silicon oxide layer, a silicon nitride layer, or the like is deposited on the substrate 16 using the plasma.

The plasma processing units 95 and 96 of this embodiment have the following advantages in addition to the advantages of the eighth embodiment described above. Since the supply line 1A is fixed to the ceiling (ground position) GC with the dielectric suspenders B2 at predetermined positions while maintaining a predetermined distance between the supply line 1A and the ceiling (ground position) GC, the loss current shunting into the ceiling GC from the supply line 1A on the return path of the RF current can be decreased, and the effective power consumed in the plasma space can be stabilized.

Since the supply line 1A is fixed to the ceiling GC, the supply line 1A obstructs the operation of workers less, thereby improving the operation efficiency compared to when the supply line 1A is fixed to the floor GF. Moreover, the flexibility in the arrangement of other plasma processing apparatuses such as plasma processing units 95 and 96 in the plasma processing apparatus 91 can be enhanced.

In the plasma processing units 95 and 96 of this embodiment, the above arrangement of the supply line 1A or the arrangement of the supply line 1A in the eighth embodiment may also be applied to the supply line 27A of the second RF generator 27 to prevent the RF impedance B of the supply line 27A from changing.

For example, in each of the plasma processing units 95 and 96, the supply line 27A is fixed on the floor GF and connects the output terminal of the second RF generator 27 to the matching circuit 25 in the matching box 26, which is separated from the second RF generator 27 in a horizontal direction, as in the supply line 1A of the RF generator 1 shown in FIGS. 32 and 33. The supply line 27A is fixed to the ground positions or the positions equivalent to the ground positions, i.e., the floor GF, the surfaces of the chamber wall 10 of the plasma processing chamber 60, the chassis 29, and the matching box 26, with the dielectric blocks B1. The supply line 27A and each of these surfaces are separated from each other with a predetermined distance therebetween.

Herein, the term "ground positions" refers specifically to the floor GF, the matching box 26, the chassis 29, the chamber wall 10, and the like.

As in the supply line 1A of the RF generator 1 shown in FIG. 32, in this embodiment, the dielectric blocks B1 are aligned between the matching box 26 and the plasma processing chamber 60 and the supply line 27A is installed on the dielectric blocks B1. The distance between the floor GF and the supply line 27A is at least $D_X$. If the RF generator 1 and the plasma processing chamber 60 are not on a straight line, the installation arrangement can be adjusted as shown in FIG. 33 by changing the direction of the supply line 27A at the upper ends of dielectric blocks B1.

The supply line 27A is fixed to the side surfaces of the matching box 26, the chassis 29, and the chamber wall 10 using the dielectric blocks B1. The distances between the supply line 1A and each of these side surfaces are at least $D_Y$. For example, when the supply line 27A is installed at the lower face of the chassis 29, the distance between the surface of the chassis 29 and the supply line 27A is at least $D_Y$. The distance between the floor GF and the supply line 27A is at least $D_X$.

The minimum distance $D_X$ between the outer conductor A2 of the supply line 27A and the floor (ground position) GF is, for example, 10 cm, and preferably 20 cm. Similarly, the minimum distance $D_Y$ between the outer conductor A2 and the side surface of the matching box (ground position) 2 is, for example, 10 cm, and preferably 20 cm. In other words, the minimum distance between the ground position and the outer conductor A2 of the supply line 27A over the entire length of the supply line 27A is adjusted to, for example, 10 cm, and more preferably, 20 cm.

Since the distance between the outer conductor A2 of the supply line 27A and the ground positions such as the floor GF, the matching box 26, the chassis 29, and the chamber wall 10 is adjusted over the entire length of the supply line 27A, the RF impedance B of the supply line 27A can be made sufficiently large, thereby regulating the loss current $I_X$. Such a structure reduces the losses of the effective energy introduced into the plasma generation space and the losses of the plasma current. As a result, power can be efficiently and stably fed to the plasma generation space of the plasma processing chamber 60, and stability of the effective power consumed in the plasma space can be improved compared to a known plasma processing apparatus when the same frequency is supplied. When layer deposition is performed, the uniformity in the deposition rate can be improved.

In this embodiment, the RF impedance B of the supply line 27A can be adjusted by fixing the supply line 27A at predetermined positions. Thus, the overall RF characteristic of the plasma processing apparatus, which has never considered before, can be adjusted to achieve improved stability in generating plasmas. As a result, a plasma processing apparatus having high operation stability can be obtained.

The loss current $I_X$ shunting to the ground positions such as the floor GF, the matching box 26, the chassis 29, and the chamber wall 10 can be reduced to increase the plasma current $I_e$ fed to the plasma generation space. Thus, the effective power consumed in the plasma space can be stabilized compared to a known plasma processing apparatus when the same frequency is supplied.

In this embodiment, the distance $D_X$ between the outer conductor A2 of the supply line 27A and the ground positions is at least 10 cm, and more preferably, 20 cm, over the entire length of the supply line 27A. This structure prevents the RF impedance B of the supply line 27A from varying. As a result, variation in plasma processing due to changes in RF characteristics of the supply line 27A over time can be inhibited, a highly stable plasma process can be performed each time, and high reproducibility can be achieved when the plasma processing is performed many times. Because the nonuniformity in the plasma processing results caused by the changes in the RF characteristics over time can be prevented, two-step maintenance, which is otherwise required, becomes unnecessary. Here, the two-step maintenance involves a first step of validating and evaluating the substrate on which the plasma process is performed using the plasma processing apparatus 71 and a second step of adjusting the plasma processing apparatus 71 based on the evaluation results obtained in the first step. The necessity of such two-step maintenance is low in this embodiment.

The plasma processing unit 96, which functions as a second deposition unit), of the plasma processing apparatus 91 of this embodiment has substantially the same structure as that of the plasma processing unit 95. In the plasma processing unit 96 also, the RF impedance B of the supply line 27A is adjusted as above.

In particular, in each of the plasma processing units 95 and 96, the RF impedance B of the supply line 27A is measured while supplying a power frequency $f_e$ of 13.56 MHz. However, the RF impedance B of the supply line 27A is an RF characteristic determined not merely by the length and position of the supply line 27A but also by various mechanical factors of the individual plasma processing unit. Thus, the supply line 27A of every unit may have a different RF impedance B.

In view of the above, the RF impedance $B_{75}$ of the supply line 27A of the plasma processing unit 95 and the RF impedance $B_{76}$ of the supply line 27A of the plasma processing unit 96 are measured, and a variation <B> of the RF impedance B of the supply line 27A between the plasma processing units 95 and 96 is determined by Equation (20B):

$$<B> = (B\max - B\min)/(B\max + B\min) \quad (20B)$$

wherein Bmax is the maximum value of the measured impedance and Bmin is the minimum value of the measured impedance. The variation <B> is then adjusted to 0.10 or less.

A variation <B> exceeding 0.10 is not preferred because the variation in the layer thickness is not within ±5% when the deposition is performed in the plasma processing units 95 and 96 under the same conditions.

Examples of methods for adjusting the variation <B> of the RF impedance B of the supply line 27A include:

(1) adjusting the distance between the supply line 27A and the ground positions such as the floor GF, the matching box 26, the chassis 29, and the chamber wall 10 using the dielectric blocks B1; and (2) changing the arrangement and the positions of the supply line 27A, e.g., changing the route of the supply line 27A to avoid winding.

According to the above structure and the method for adjusting the RF impedance B, the difference in the RF characteristics between plural plasma processing units 95 and 96 can be minimized and controlled within a predetermined range. As a result, the effective power consumed in the plasma spaces of the plural units can be made substantially uniform.

In each of the above described embodiments, when the matching circuit 2A is separated from the plasma processing chamber 60 with a particular distance therebetween, the feed line 3A that connects the matching circuit 2A to the plasma excitation electrode 4 in the plasma processing chamber 60 may be fixed, as with the supply line 27A described above, so as to prevent the RF impedance B of the feed line 3A from being changed.

The plasma processing apparatus of this embodiment may be of an inductively coupled (ICP) type, a radial line slot antenna (RLSA) type, or the like instead of having two parallel electrodes 4 and 8. The plasma processing apparatus of this embodiment may also be applied to reactive ion etching (RIE).

The plasma processing apparatus of this embodiment may perform a sputtering process by installing the target materials instead of the electrodes 4 and 8.

The plasma processing apparatus of each of the embodiments above may have only one plasma processing unit instead of plural.

Tenth Embodiment

A plasma processing apparatus and system, and a method for stabilizing the plasma processing apparatus and system according to a tenth embodiment of the present invention will now be described with reference to the drawings. FIG. 23 is a schematic view showing the overall structure of a plasma processing system of this embodiment.

The plasma processing system of this embodiment is a combination of the plasma processing apparatuses 71 and 71' substantially the same as those in the eighth embodiment shown in FIG. 1, and the plasma processing apparatus 91 substantially the same as that in the ninth embodiment shown in FIG. 16 described above. The same components as those in the eighth and ninth embodiments are represented by the same reference symbols and numerals and the description thereof is omitted to avoid repetition.

Referring to FIG. 23, the plasma processing system of this embodiment comprises: a plasma processing apparatus comprising three plasma processing units 95, 96, and 97; a plasma processing apparatus 91 comprising two plasma processing unit 95 and 96; and a plasma processing apparatus 71' comprising three plasma processing units 95, 96, and 97. The plasma processing system is part of a manufacturing line.

Unlike the plasma processing apparatuses 71 and 71' of the eighth embodiment shown in FIG. 1, three plasma processing units 95 to 97 of a dual-frequency excitation type substantially identical to the plasma processing unit 95 of the ninth embodiment shown in FIG. 16 are provided instead of the plasma processing units 75 to 77. The plasma processing units 95 to 97 have substantially the same structure.

As shown in FIG. 23, an impedance meter AN is connected to each of the plasma processing units 95 to 97 via impedance measuring terminals and a switch SW3. The switch SW3 connects the impedance meter AN to a target plasma processing unit and disconnects the impedance meter AN from the rest of the plasma processing units during measurement of the impedance of the plasma processing chambers 95 to 97.

In this embodiment, each of the plural plasma processing chamber units 95 to 97 has a supply line 1A fixed to a floor GF with a plurality of dielectric blocks B1 with a predetermined distance between the supply line 1A and the floor GF.

In the plasma processing system of this embodiment, a deposition process is performed on a preliminarily treated substrate 16 in the plasma processing units 95 to 97 of the plasma processing apparatus 71. Subsequently, the substrate 16 is heated in a heating unit 79 and annealed in a laser annealing unit 78. The substrate 16 is then discharged from the plasma processing apparatus 71 and transferred to another plasma processing apparatus (not shown) equivalent to the plasma processing apparatus 71 and is sequentially subjected to second and third deposition processes.

Next, a photoresist layer is formed on the substrate 16 by photolithography in another apparatus (not shown).

The substrate 16 is then transferred into the plasma processing apparatus 91 and is subjected to plasma etching in the plasma processing units 95 and 96.

The substrate 16 discharged from the plasma processing apparatus 91 is transferred to another apparatus (not shown) where the resist layer is removed. Patterning is then performed on the substrate 16 by photolithography.

Finally, the substrate 16 is transferred into the plasma processing apparatus 71' and is subjected to first, second, and third deposition processes sequentially in the plasma processing units 95, 96, and 97, which completes the processes using the plasma processing system of this embodiment. The processed substrate 16 is then transferred to the next step of the manufacturing line.

The plasma processing system of this embodiment has the following advantages in addition to the advantages of the eighth and ninth embodiments. Since the supply line 1A is fixed on the floor GF with the dielectric blocks B1 so as to control the RF impedance A of the supply line 1A, the loss current in the return path and the losses in RF power supplied to the plasma generation space can be reduced. This reduction is effected in all of the plural plasma processing units 95 to 97. As a result, the entire plasma processing system achieves an improved stability.

According to the above structure, the RF impedance A of the supply line 1A can be prevented from being changed. Thus, the difference in the RF characteristics among the plasma processing chamber units 95 to 97 is minimized. Since the plasma processing chamber units 95 to 97 can be adjusted using the impedance characteristic as a parameter in this plasma processing system, the plasma processing chamber units 95 to 97 can achieve a substantially uniform plasma density. Thus, the same process recipe can be applied to the plasma processing chamber units 95 to 97 of this plasma processing system so as to achieve substantially uniform plasma processing results. If deposition processes are performed in the plasma processing chamber units 95 to 97, layers having substantially uniform layer characteristics, i.e., uniform layer thickness, breakdown voltage, etching rate, and the like, can be formed. The stability of the plasma generation in the plasma processing chamber units 95 to 97 is ensured by adjusting the overall RF characteristics of the plasma processing system. Accordingly, the plasma processing system has superior operation stability because the plasma processing chamber units 95 to 97 can reliably perform substantially uniform operation.

Compared with a known plasma processing system, the plasma processing system of this embodiment can increase the effective power consumed in the plasma space even when the same frequency is supplied. Thus, the consumption efficiency of the power as the plasma processing system as a whole can be improved, and the same process rate and the same layer characteristics can be achieved with less power than conventionally required. These advantages can be achieved in all of the plasma processing chamber units 95 to 97. Thus, power losses and the operation cost of the plasma processing system as a whole can be reduced, thereby improving the productivity. Since the processing time is shortened and power consumption during the plasma processes is decreased, the total emission of carbon dioxide, which places a burden on the environment, can be reduced.

When the plasma processes are performed plural times, the plural plasma processing chamber units 95 to 97 can stably achieve substantially uniform plasma processing results.

Furthermore, the plasma processing apparatus of the plasma processing system of this embodiment may be of an inductively coupled (ICP) type, a radial line slot antenna (RLSA) type, or the like instead of having two parallel electrodes 4 and 8. The plasma processing apparatus may also be applied to reactive ion etching (RIE).

EXAMPLES

In the following examples, in order to examine the optimum setting of the RF impedance Z of the supply line 1A, the RF impedance Z of the supply line 1A is measured while varying the distance between the supply line 1A and the floor GF (ground position).

Example 1

In Example 1, the supply line 1A was a coaxial cable having a total length of 1.0 m and an outer diameter of the outer conductor A2 of 14 mm, as shown in FIG. 35. The supply line 1A was placed on the floor GF, i.e., the ground position, in the shape of a letter U so that the two ends of the cable faced the same direction. The supply line 1A was fixed on the floor GF with a distance therebetween using the dielectric blocks B1 composed of polypropylene. The loss component $Z_0+Z_X$ of the impedance shown in FIG. 36 was then measured five times and the variation $<Z_0+Z_X>$ was determined.

A measuring probe was connected to one end of the outer conductor A2 of the supply line 1A, which was a coaxial cable. Another measuring probe was connected to the floor GF near the end of the supply line 1A.

Three dielectric blocks B1 were placed along the supply line 1A so as to set the distance between the floor GF and the supply line 1A within the range of 100±20 mm. The measuring frequency was 13.56 MHz.

The variation was determined by Equation 20A:

$$<A>=(A\max-A\min)/(A\max+A\min) \quad (20A)$$

wherein Amax and Amin are the maximum value and the minimum value, respectively, of the impedance of the coaxial cable, i.e., the supply line 1A.

The results are shown in Table 1.

Comparative Example 1

The loss component $Z_0+Z_X$ of the impedance was measured as in Example 1 but without the dielectric blocks B1. The distance between the floor GF and the supply line 1A, i.e., the coaxial cable, was within the range of 0 to 10 mm. The variation $<Z_0+Z_X>$ was then determined. results are shown in Table 1.

TABLE 1

| Measurement at 13.56 MHz | Comparative Example 1 (Ω) | Example 1 (Ω) |
| --- | --- | --- |
| 1 | 120.3 | 616.8 |
| 2 | 135.4 | 617.8 |
| 3 | 145.7 | 603.0 |
| 4 | 148.7 | 624.0 |
| 5 | 134.2 | 622.5 |
| Variation | 0.106 | 0.017 |

Examples 2 and 3

The loss component $Z_0+Z_X$ of the impedance was measured as in Example 1 but at measuring frequencies of 27.12 MHz and 40.68 MHz so as to determine the variation $<Z_0+Z_X>$ at each of these frequencies.

Comparative Examples 2 and 3

The loss component $Z_0+Z_X$ of the impedance was measured as in Comparative Example 1 but at measuring frequencies of 27.12 Hz and 40.68 MHz so as to determine the variation $<Z_0+Z_X>$ at each of these frequencies.

The results of Examples 2 and 3 and Comparative Examples 2 and 3 are shown in Table 2.

TABLE 2

| | Comparative Example 2 (Ω) | Comparative Example 3 (Ω) | Example 2 (Ω) | Example 3 (Ω) |
| --- | --- | --- | --- | --- |
| Measuring Frequency | 27.12 MHz | 40.68 MHz | 27.12 MHz | 40.68 MHz |
| 1 | 47.9 | 16.4 | 275.7 | 142.2 |
| 2 | 54.5 | 19.9 | 276.9 | 144.4 |
| 3 | 57.7 | 19.5 | 268.6 | 139.9 |
| 4 | 61.5 | 24.8 | 279.3 | 145.1 |
| 5 | 54.2 | 19.9 | 279.1 | 145.6 |
| Variation | 0.125 | 0.205 | 0.020 | 0.020 |

Example 4

The loss component $Z_0+Z_2$ of the impedance shown in FIG. 36 was measured five times at a frequency of 13.56 MHz and the variation $<Z_0+Z_2>$ was determined as in Example 1.

One measuring probe was connected to one end of the outer conductor A2 of the coaxial cable, i.e., the supply line 1A shown in FIG. 35. The other probe was connected to the other end of the outer conductor A2 of the supply line 1A.

Comparative Example 4

The loss component $Z_0+Z_2$ of the impedance was measured as in Example 4, but without the dielectric blocks B1. The distance between the floor GF and the supply line 1A was in the range of 0 to 10 mm. The variation $<Z_0+Z_2>$ was then determined.

The results of Example 4 and Comparative Example 4 are shown in Table 3.

TABLE 3

| Measurement at 13.56 MHz | Comparative Example 4 (Ω) | Example 4 (Ω) |
| --- | --- | --- |
| 1 | 35.4 | 64.4 |
| 2 | 35.2 | 62 |
| 3 | 37 | 61.7 |
| 4 | 34.7 | 61.4 |
| 5 | 34 | 61.6 |
| Variation | 0.042 | 0.023 |

In comparing Example 1 with Comparative Example 1, the results demonstrate that the variation $<Z_0+Z_X>$ of the loss components of the impedance of the coaxial cable significantly decreases when the coaxial cable is fixed on the floor GF with a distance therebetween using the dielectric blocks B1. The variation in the RF impedance of the supply line 1A can be improved and variation in the loss current $I_X$ shunting to the ground positions from the supply line 1A, the loss current $I_X$ being inversely proportional to the impedance $Z_X$ (Ω), can be decreased by fixing the supply line 1A to the floor GF with a distance therebetween.

The results of Comparative Examples 1 to 3 demonstrate that the variation $<Z_0+Z_X>$ of the impedance of the coaxial cable increases as the plasma excitation frequency increases. The results of Examples 1 to 3 demonstrate that the variation $<Z_0+Z_X>$ of the impedance of the coaxial cable can be sustained at substantially the same level despite an increase in the plasma excitation frequency, by fixing the supply line 1A to the floor GF with a distance between the floor GF and the supply line 1A using the dielectric blocks B1.

The results of Example 4 and Comparative Example 4 demonstrate that the variation $<Z_0+Z_2>$ of the impedance $Z_0+Z_X$ can be decreased to approximately half by fixing the supply line 1A to the floor GF with a distance between the floor GF and the supply line 1A using the dielectric blocks B1.

These results fully demonstrate that the RF impedance of the supply line 1A can be prevented from changing when the distance between the supply line 1A and the floor GF is fixed.

What is claimed is:

1. A plasma processing apparatus comprising:
   at least one plasma processing unit comprising:
      a plasma processing chamber having an electrode for plasma excitation;
      an RF generator for feeding RF power to the electrode;
      an RF supplier;
      an RF feeder; and
      a matching circuit for performing impedance matching between the plasma processing chamber and the RF generator, the matching circuit having an input terminal and an output terminal, the input terminal being connected to the RF generator through the RF supplier, the output terminal being connected to the electrode through the RF feeder;
   wherein the average density per unit volume of the RF power that is supplied from the RF generator to the electrode lowers from the output terminal side to the electrode side in the RF feeder,
   wherein the RF feeder comprises a plurality of feeder elements,
   wherein the plurality of feeder elements are mutually connected with at least one connector element at one end, and are mutually connected with the electrode at another end,
   wherein the connector element is a plate having a shape analogous to that of the electrode,
   wherein the plurality of feeder elements are substantially parallel with each other, and
   wherein the plurality of feeder elements are substantially perpendicular to the electrode.

2. The plasma processing apparatus according to claim 1, wherein the plurality of feeder elements parallel to each other.

3. The plasma processing apparatus according to claim 1, wherein the plurality of feeder elements is connected to the electrode axisymmetrically with respect to the center of the electrode.

4. The plasma processing apparatus according to claim 1, wherein the connector element has a face that is substantially parallel to the electrode.

5. The plasma processing apparatus according to claim 1, wherein the plurality of feeder elements is connector element axisymmetrically with respect to the center of the connector element.

6. The plasma processing apparatus according to claim 1, wherein the plurality of feeder elements is connected in an analogous state to an upstream face and a downstream face of at least one of the plurality of the connector elements.

7. The plasma processing apparatus according to claim 1, wherein said at least one connector element is a plurality of connector elements that is arranged between the output terminal and the electrode.

8. The plasma processing apparatus according to claim 1, wherein the plurality of feeder elements has equal RF characteristics.

9. The plasma processing apparatus according to claim 1, wherein each of the plurality of the RF feeder elements has a low-resistance surface having lower resistance than that of the inner portion.

10. The plasma processing apparatus according to claim 9, wherein the thickness of the low-resistance surface is larger than the skin depth at a frequency of the RF power fed from the RF generator.

11. The plasma processing apparatus according to claim 1, wherein the connector element has a low-resistance surface having lower resistance than that of the inner portion.

12. The plasma processing apparatus according to claim 1, wherein each of the plurality of the RF feeder elements is covered with an insulating material.

13. The plasma processing apparatus according to claim 1, wherein the connector element is covered with an insulating material.

14. The plasma processing apparatus according to claim 1, wherein the plurality of the RF feeder elements is rigid.

15. The plasma processing apparatus according to claim 1, wherein the connector element is rigid.

16. The plasma processing apparatus according to claim 1, wherein the plasma processing chamber has a chamber wall and a shielding conductor connected to the chamber wall, the plurality of RF feeders being accommodated in the shielding conductor.

17. The plasma processing apparatus according to claim 1, wherein the plasma processing chamber has a chamber wall and a shielding conductor connected to the chamber wall, the connector element being accommodated in the shielding conductor.

18. The plasma processing apparatus according to claim 1, wherein said at least one plasma processing unit is a plurality of plasma processing units.

19. A plasma processing system comprising a plurality of the plasma processing apparatuses according to claim 1.

* * * * *